United States Patent
Blum et al.

(10) Patent No.: US 10,884,246 B2
(45) Date of Patent: Jan. 5, 2021

(54) RELEASABLY ATTACHABLE AUGMENTED REALITY SYSTEM FOR EYEWEAR

(71) Applicant: PogoTec, Inc., Roanoke, VA (US)

(72) Inventors: Ronald Blum, Roanoke, VA (US); Ami Gupta, Roanoke, VA (US); Mark Graham, Sterling, VA (US); Josh Schoenbart, Brookline, MA (US); William Kokonaski, Belfair, WA (US)

(73) Assignee: NewSight Reality, Inc., Roanoke, VA (US)

( * ) Notice: Subject to any disclaimer, the term of this patent is extended or adjusted under 35 U.S.C. 154(b) by 0 days.

(21) Appl. No.: 15/994,595

(22) Filed: May 31, 2018

(65) Prior Publication Data
US 2018/0348529 A1 Dec. 6, 2018

Related U.S. Application Data

(60) Provisional application No. 62/513,828, filed on Jun. 1, 2017, provisional application No. 62/522,866, filed
(Continued)

(51) Int. Cl.
*G02B 27/01* (2006.01)
*G06T 19/00* (2011.01)
(Continued)

(52) U.S. Cl.
CPC ..... *G02B 27/0176* (2013.01); *G02B 27/0103* (2013.01); *G02B 27/0149* (2013.01);
(Continued)

(58) Field of Classification Search
CPC ............ G02B 27/0176; G02B 27/0103; G02B 27/0149; G02B 2027/0178;
(Continued)

(56) References Cited

U.S. PATENT DOCUMENTS 5,003,300 A * 3/1991 Wells ..................... G02B 13/16
340/980
5,499,138 A 3/1996 Iba
(Continued)

FOREIGN PATENT DOCUMENTS

AU 2014400408 B2 1/2016
EP 1300716 A1 4/2003
(Continued)

OTHER PUBLICATIONS

Co-Pending International Application No. PCT/US2018/037561 filed Jun. 14, 2018, Search Report and Written Opinion of the International Searching Authority, dated Sep. 21, 2018, 13 pages.
(Continued)

*Primary Examiner* — Temesghen Ghebretinsae
*Assistant Examiner* — Ivelisse Martinez Quiles
(74) *Attorney, Agent, or Firm* — Woods Rogers PLC; Nathan A. Evans

(57) ABSTRACT

An Augmented Reality apparatus is provided, whereby the apparatus utilizes existing eyewear as an attachment platform, and the apparatus is attachable to and detachable from a plurality of different eyewear having different shapes and sizes, whereby a portion of the apparatus rests on the top of the eyewear, and whereby the apparatus provides fully or mostly unobstructed vision when the wearer is looking straight ahead.

30 Claims, 64 Drawing Sheets

Related U.S. Application Data on Jun. 21, 2017, provisional application No. 62/530,638, filed on Jul. 10, 2017, provisional application No. 62/542,168, filed on Aug. 7, 2017, provisional application No. 62/546,473, filed on Aug. 16, 2017, provisional application No. 62/607,582, filed on Dec. 19, 2017, provisional application No. 62/613,313, filed on Jan. 3, 2018, provisional application No. 62/619,752, filed on Jan. 20, 2018, provisional application No. 62/624,201, filed on Jan. 31, 2018, provisional application No. 62/626,660, filed on Feb. 5, 2018, provisional application No. 62/638,789, filed on Mar. 5, 2018, provisional application No. 62/648,371, filed on Mar. 26, 2018.

(51) Int. Cl.
   *H01L 27/32* (2006.01)
   *G02B 27/40* (2006.01)
   *G02B 3/00* (2006.01)

(52) U.S. Cl.
   CPC ...... *G06T 19/006* (2013.01); *G02B 2027/013* (2013.01); *G02B 2027/0132* (2013.01); *G02B 2027/0138* (2013.01); *G02B 2027/0156* (2013.01); *G02B 2027/0161* (2013.01); *G02B 2027/0178* (2013.01); *G02B 2027/0187* (2013.01)

(58) Field of Classification Search
   CPC .... G02B 2027/0138; G02B 2027/0156; G02B 2027/0161; G02B 2027/0132; G02B 2027/013; G02B 2027/0187; G02B 27/40; G02B 27/0172; G02B 3/0006; G06T 19/006; G02C 9/04; H04N 5/7491; H01L 27/3225; H01L 2251/5323
   See application file for complete search history.

(56) References Cited

U.S. PATENT DOCUMENTS

| | | | | |
|---|---|---|---|---|
| 5,682,173 | A * | 10/1997 | Holakovszky | G02B 27/0172 345/8 |
| 6,034,653 | A * | 3/2000 | Robertson | G02B 27/0176 345/8 |
| 6,349,001 | B1 | 2/2002 | Spitzer | |
| 6,356,392 | B1 | 3/2002 | Spitzer | |
| 6,680,802 | B1 * | 1/2004 | Ichikawa | G02B 27/0172 359/630 |
| 6,879,443 | B2 * | 4/2005 | Spitzer | G02B 27/0081 345/8 |
| 6,937,400 | B2 * | 8/2005 | Olsson | A61B 1/00048 359/630 |
| 6,945,648 | B2 | 9/2005 | Schindler et al. | |
| 7,158,096 | B1 * | 1/2007 | Spitzer | G02B 27/0172 345/8 |
| 7,192,136 | B2 | 3/2007 | Howell et al. | |
| 7,195,353 | B2 | 3/2007 | Blum et al. | |
| 7,318,646 | B2 | 1/2008 | Bernard et al. | |
| 7,663,805 | B2 | 2/2010 | Zaloum et al. | |
| 7,791,809 | B2 | 9/2010 | Filipovich et al. | |
| 8,177,361 | B2 | 5/2012 | Sessner et al. | |
| 8,508,830 | B1 | 8/2013 | Wang | |
| 8,847,851 | B2 | 9/2014 | Yamamoto | |
| 8,970,962 | B2 | 3/2015 | Filipovich et al. | |
| 9,164,284 | B2 | 10/2015 | Olsson et al. | |
| 9,189,829 | B2 | 11/2015 | Komori et al. | |
| 9,285,592 | B2 | 3/2016 | Olsson et al. | |
| 9,507,153 | B2 | 11/2016 | Filipovich et al. | |
| 9,551,872 | B1 | 1/2017 | Kress et al. | |
| 9,552,676 | B2 | 1/2017 | Wong et al. | |
| 9,557,152 | B2 | 1/2017 | Starner et al. | |
| 9,584,705 | B2 | 2/2017 | Nordstrom et al. | |
| 9,710,058 | B2 | 7/2017 | Gustafsson et al. | |
| 9,720,257 | B2 * | 8/2017 | Han | G02C 11/10 |
| 9,753,287 | B2 | 9/2017 | Chow et al. | |
| 9,759,917 | B2 | 9/2017 | Osterhout et al. | |
| 9,766,482 | B2 | 9/2017 | Cazalet et al. | |
| D800,118 | S | 10/2017 | Xing et al. | |
| 9,983,408 | B2 | 5/2018 | De Matos Pereira Vieira | |
| 10,162,182 | B2 | 12/2018 | Jepsen | |
| 2004/0212776 | A1 * | 10/2004 | Spitzer | G02B 27/0081 351/41 |
| 2006/0168859 | A1 * | 8/2006 | Pombo | G02B 7/12 40/611.07 |
| 2006/0250574 | A1 | 11/2006 | Grand et al. | |
| 2007/0217016 | A1 * | 9/2007 | Nakazawa | G02B 27/0176 359/630 |
| 2008/0068557 | A1 * | 3/2008 | Menduni | G02B 27/0176 351/65 |
| 2008/0169998 | A1 * | 7/2008 | Jacobsen | G02B 27/0172 345/8 |
| 2008/0291277 | A1 * | 11/2008 | Jacobsen | G02B 27/0172 348/158 |
| 2009/0231722 | A1 | 9/2009 | Filipovich et al. | |
| 2010/0026970 | A1 * | 2/2010 | Tanaka | G02B 27/0176 353/81 |
| 2010/0164840 | A1 | 7/2010 | Yamamoto | |
| 2010/0226017 | A1 * | 9/2010 | Spaller | G02B 27/0172 359/630 |
| 2010/0315720 | A1 | 12/2010 | Filipovich et al. | |
| 2011/0043436 | A1 * | 2/2011 | Yamamoto | G02B 27/0172 345/8 |
| 2012/0206334 | A1 * | 8/2012 | Osterhout | G06F 1/163 345/156 |
| 2013/0021226 | A1 | 1/2013 | Bell | |
| 2013/0044042 | A1 | 2/2013 | Olsson et al. | |
| 2013/0242253 | A1 * | 9/2013 | Blum | G02C 11/10 351/158 |
| 2013/0258270 | A1 * | 10/2013 | Cazalet | G02C 11/10 351/114 |
| 2013/0278631 | A1 * | 10/2013 | Border | G02B 27/017 345/633 |
| 2014/0022163 | A1 | 1/2014 | Olsson et al. | |
| 2014/0111864 | A1 * | 4/2014 | Margulis | G02B 27/0172 359/630 |
| 2014/0118829 | A1 * | 5/2014 | Ma | G02B 5/1885 359/567 |
| 2014/0168784 | A1 * | 6/2014 | Hiraki | G02B 27/0176 359/630 |
| 2014/0211146 | A1 * | 7/2014 | Gupta | G02B 3/12 351/158 |
| 2014/0218269 | A1 * | 8/2014 | Cazalet | G02B 27/0176 345/8 |
| 2014/0327971 | A1 | 11/2014 | Filpovich et al. | |
| 2015/0168730 | A1 | 6/2015 | Ashkenazi et al. | |
| 2015/0169070 | A1 | 6/2015 | Harp et al. | |
| 2015/0293358 | A1 | 10/2015 | de Matos Pereira Vieira et al. | |
| 2015/0323797 | A1 * | 11/2015 | Ellsworth | G02B 27/0176 359/630 |
| 2016/0019423 | A1 * | 1/2016 | Ortiz | G06K 9/00885 345/633 |
| 2016/0048018 | A1 | 2/2016 | De Matos Pereira Vieira | |
| 2016/0116979 | A1 * | 4/2016 | Border | G06F 3/013 345/156 |
| 2016/0147086 | A1 * | 5/2016 | Cazalet | G02C 11/10 351/114 |
| 2016/0252728 | A1 | 9/2016 | Mack et al. | |
| 2016/0278695 | A1 * | 9/2016 | Wang | H04N 13/204 |
| 2016/0313561 | A1 * | 10/2016 | Chenchev | G02B 27/0179 |
| 2016/0377872 | A1 * | 12/2016 | Hurbi | G02B 27/0172 359/630 |
| 2017/0028299 | A1 | 2/2017 | The et al. | |
| 2017/0031435 | A1 | 2/2017 | Raffle et al. | |
| 2017/0038590 | A1 | 2/2017 | Jepsen | |
| 2017/0052802 | A1 | 2/2017 | Ko et al. | |
| 2017/0090557 | A1 | 3/2017 | Raffle et al. | |
| 2017/0147034 | A1 | 5/2017 | Lanman et al. | |
| 2017/0153454 | A1 | 6/2017 | Callier et al. | |

(56) References Cited

U.S. PATENT DOCUMENTS

| | | |
|---|---|---|
| 2017/0176777 A1 | 6/2017 | Blum et al. |
| 2017/0184861 A1* | 6/2017 | Lammers-Meis ........................... G02B 27/0176 |
| 2017/0200296 A1 | 7/2017 | Jones et al. |
| 2017/0227779 A1 | 8/2017 | Kato et al. |
| 2017/0229095 A1 | 8/2017 | Raffle et al. |
| 2017/0235161 A1 | 8/2017 | Hilkes et al. |
| 2017/0243371 A1 | 8/2017 | Jurgenson et al. |
| 2017/0249862 A1 | 8/2017 | Border |
| 2017/0256029 A1 | 9/2017 | Shams et al. |
| 2017/0285347 A1 | 10/2017 | Cai et al. |
| 2018/0024366 A1 | 1/2018 | Ma et al. |
| 2018/0045964 A1 | 2/2018 | Jones et al. |
| 2018/0203240 A1* | 7/2018 | Jones .................. G02C 5/20 |
| 2019/0113759 A1* | 4/2019 | Tatsuta .................. A41D 20/00 |
| 2019/0113760 A1* | 4/2019 | Tatsuta .................. G02B 27/02 |

FOREIGN PATENT DOCUMENTS

| | | |
|---|---|---|
| JP | 2017212475 A | 11/2017 |
| WO | 2008084751 A1 | 7/2008 |
| WO | 2010105201 A1 | 9/2010 |
| WO | 2013025672 A2 | 2/2013 |
| WO | 2013025672 A3 | 2/2013 |
| WO | 2013036888 A2 | 3/2013 |
| WO | 2013036888 A3 | 4/2013 |
| WO | 2013025672 A3 | 5/2013 |
| WO | 2016004998 A1 | 1/2016 |
| WO | 2016135727 A1 | 9/2016 |
| WO | 2017151872 A1 | 9/2017 |
| WO | 2017169345 A1 | 10/2017 |
| WO | 2017171157 A1 | 10/2017 |
| WO | 2018217253 A1 | 11/2018 |

OTHER PUBLICATIONS

Co-Pending International Application No. PCT/US2018/035424 filed May 31, 2018, Search Report and Written Opinion pf the International Searching Authority, dated Aug. 31, 2018, 16 pages.

* cited by examiner

HARDWARE AND OPERATING SYSTEM

| CERTAIN FEATURES | INVENTIVE EMBODIMENTS DISCLOSED HEREIN CAN UTILIZE "ONE OR MORE" OF THE FOLLOWING*: |
|---|---|
| VISION SYSTEM | MONOCULAR OR BINOCULAR (BINOCULAR PREFERRED) |
| LOCATION OF OPTICAL COMBINER | (A) COVERING PUPIL WHEN HEAD IS STRAIGHT AND LOOKING STRAIGHT AHEAD. (B) BOTTOM EDGE ABOVE PUPIL WHEN HEAD IS STRAIGHT AND LOOKING STRAIGHT AHEAD |
| SOC (SYSTEM ON CHIP) | INTEL ATOM, QLC835 QUAD CORE 10NM, |
| DISPLAY | LCOS, LED ILLUMINATED DISPLAY, MICRO DISPLAY, REFLECTIVE WAVE GUIDE, DIFFRACTIVE WAVE GUIDE, WAVE GUIDE, OLED, PROJECTOR |
| OPERATING SYSTEM (OS) | GLASS OS 32BIT, ANDROID IOS |
| MEMORY RAM | WITHIN THE RANGE OF 1GB-10GB |
| STORAGE | WITHIN THE RANGE OF 1GB-200GB |
| SPEAKER/MIC | RIGHT OR LEFT EAR MICRO ARRAY, STEREO SPEAKER WITH MULTIPLE MIC ARRAY |
| BATTERY | WITHIN THE RANGE OF 500MAH-5,000MAH, LITHIUM POLYMER, SOLID STATE BATTERY |
| CAMERA | 5MP TO 20MP, 720 FPS HD VIDEO, 1080 FPS HD VIDEO |
| COMMUNICATION | DUAL BAND 2.5, 5GHZ 802.11A/B/G/N/AC, 802.11AC, BT 5.0, BT 3.0 AVRCP (REMOTE), GPS, GLONASS, WIFI |
| SENSORS | ALS, DIGITAL COMPASS, WINK, BLINK, HEAD, BAROMETER, ACCELEROMETER, GYROSCOPE, MAGNETOMETER, CAPACITIVE TOUCH, HUMIDITY, PEDOMETER, TEMPERATURE |
| INPUT | CAPACITIVE TOUCH, TOUCH, TAP, TOUCH SCREEN, VOICE, SOUND, TOUCH SWITCH, HAND GESTURE |
| FEEDBACK | VIBRATION, ACOUSTIC, SOUND, VISUAL, PERSONAL ASSISTANT, LIGHT |
| WEIGHT | WITHIN THE RANGE OF 30 GRAMS - 200 GRAMS |

FIG. 1

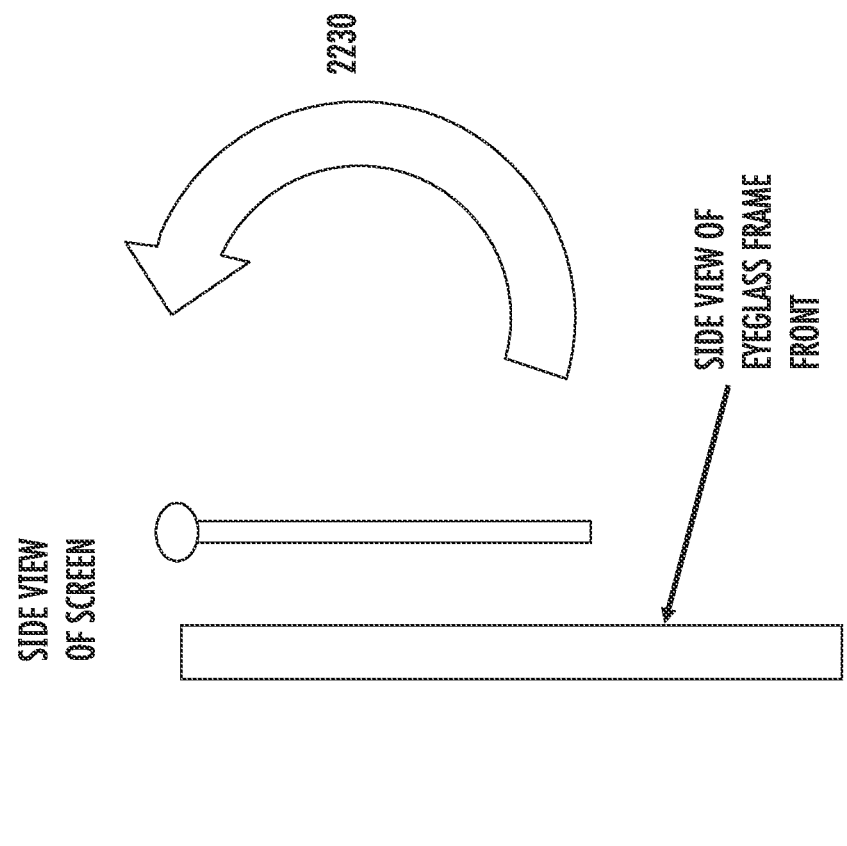
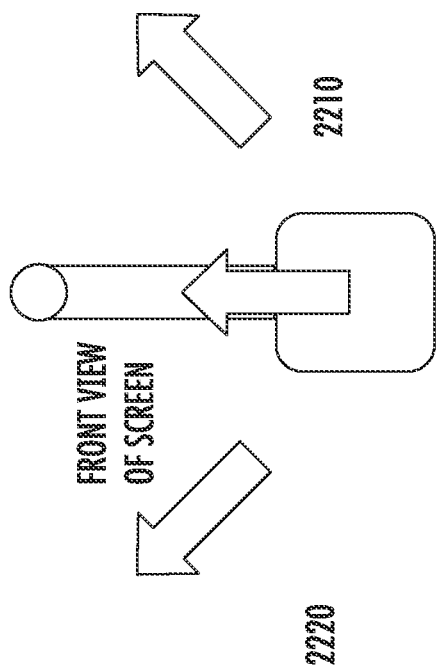
FIG. 22

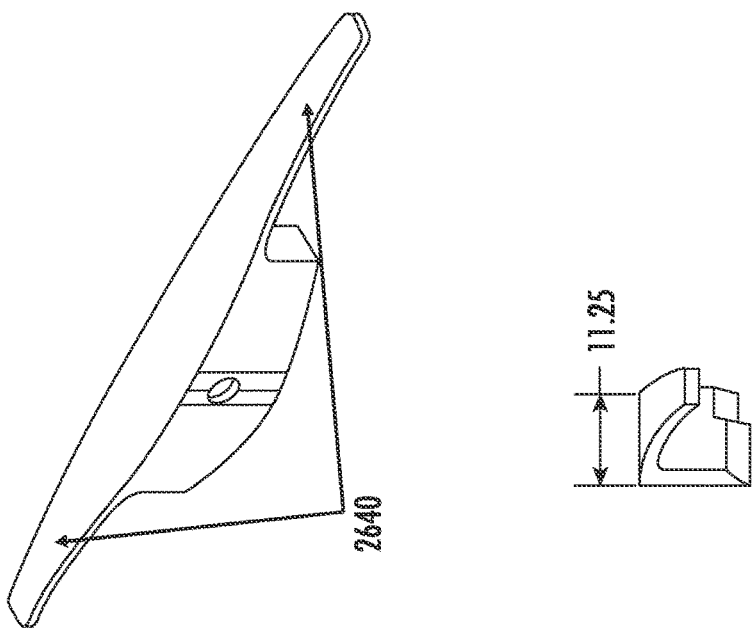
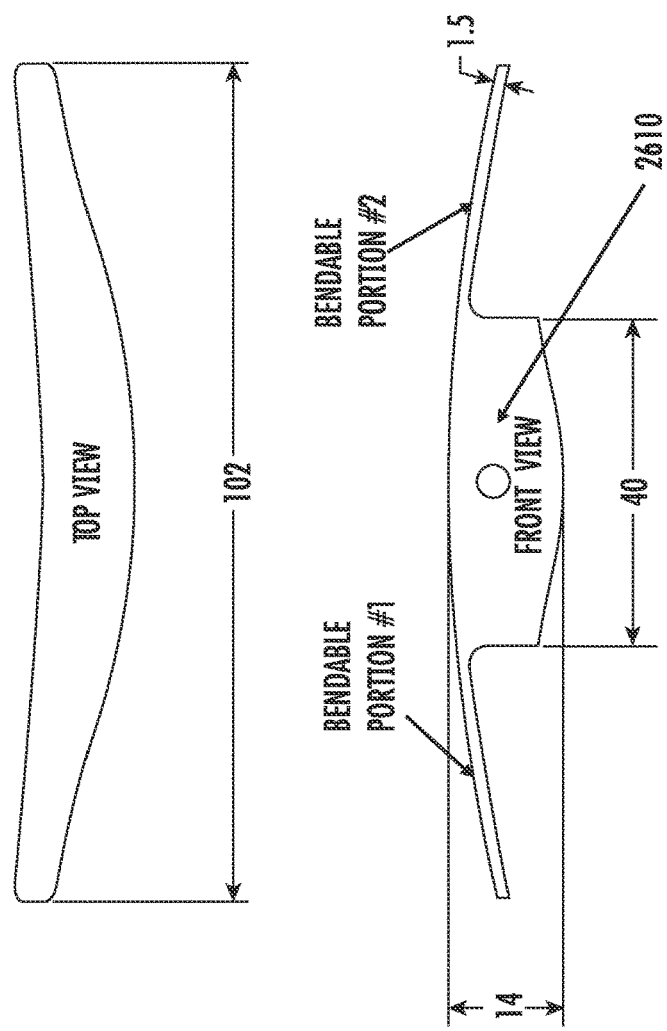
FIG. 26

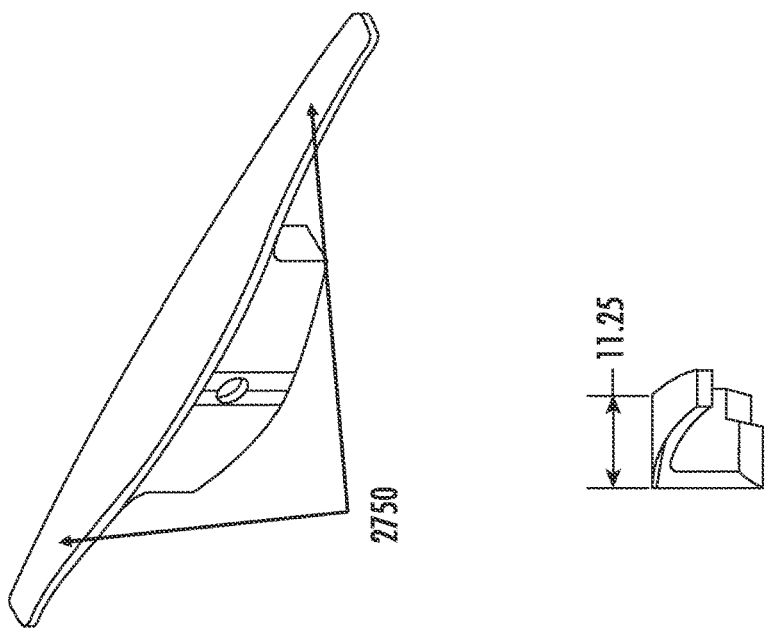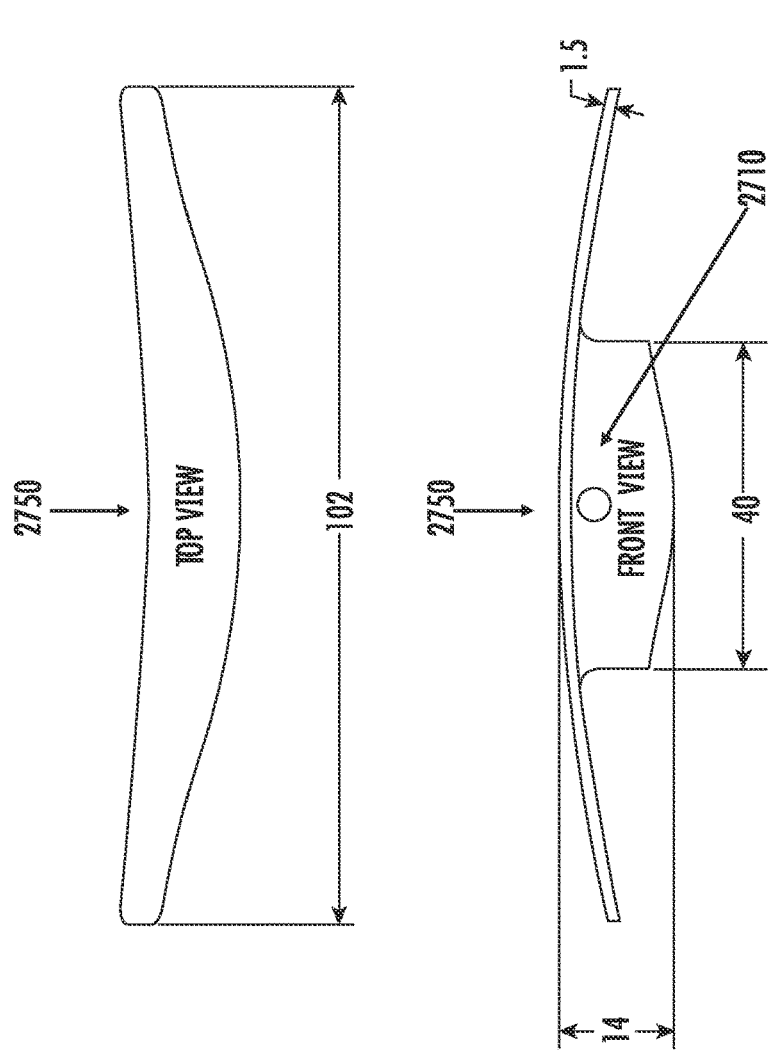
FIG. 27

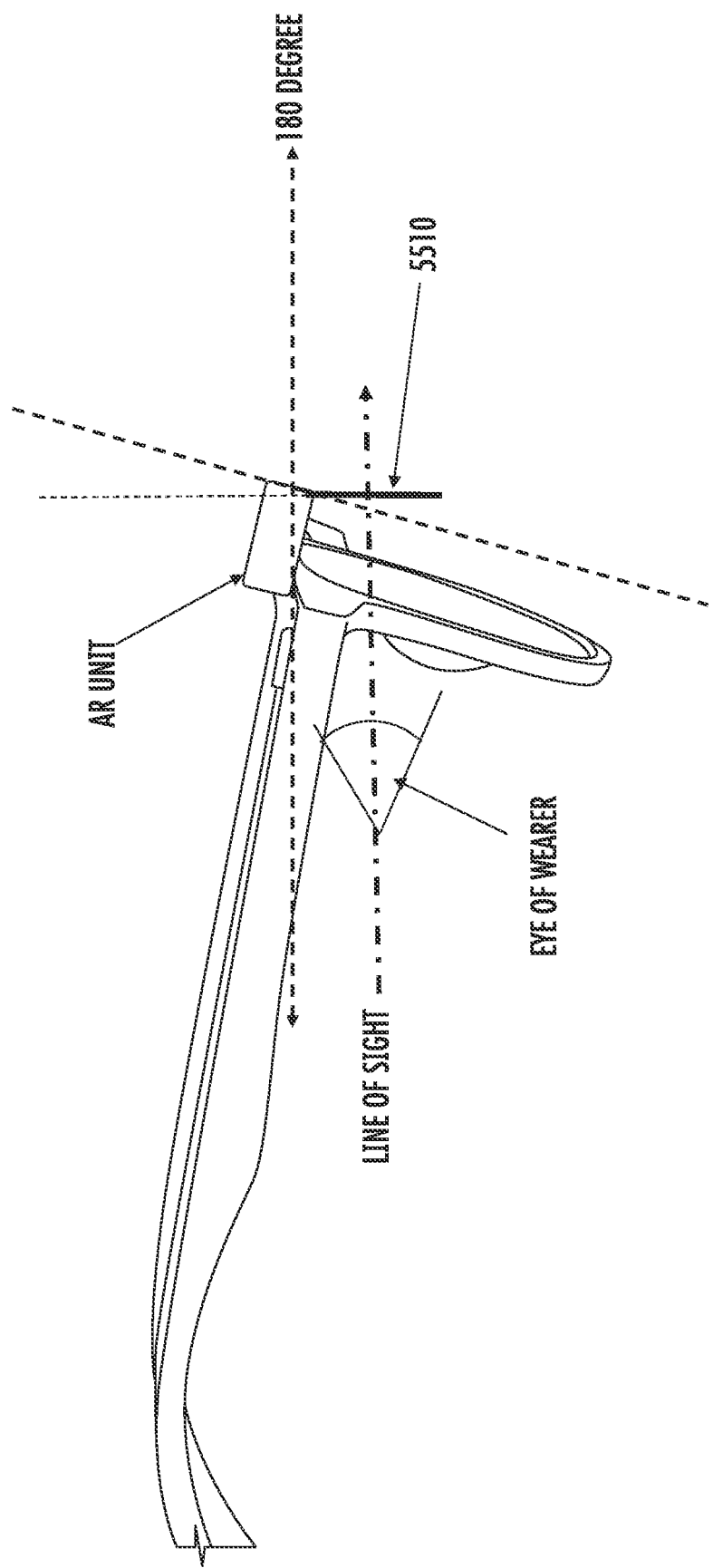

FIGURE 58. USE OF A SEMI-TRANSPARENT OLED SCREEN AS A COMBINER

FIGURE 59. PLOT OF EXTERNAL QUANTUM EFFICIENCY VS CURRENT DENSITY WITH DIFFERENT SUBSTRATES

RELEASABLY ATTACHABLE AUGMENTED REALITY SYSTEM FOR EYEWEAR

CROSS-REFERENCE TO RELATED APPLICATIONS

The present application relies on the disclosures of and/or claims priority to and the benefit of the filing dates of U.S. Appl. No. 62/491,139 filed Apr. 27, 2017, U.S. Appl. No. 62/492,626 filed May 1, 2017, U.S. Appl. No. 62/507,049 filed May 16, 2017, U.S. Appl. No. 62/513,828 filed Jun. 1, 2017, U.S. Appl. No. 62/522,866 filed Jun. 21, 2017, U.S. Appl. No. 62/530,638 filed Jul. 10, 2017, U.S. Appl. No. 62/542,168 filed Aug. 7, 2017, U.S. Appl. No. 62/546,473 filed Aug. 16, 2017, U.S. Appl. No. 62/607,582 filed Dec. 19, 2017, U.S. Appl. No. 62/613,313 filed Jan. 3, 2018, U.S. Appl. No. 62/619,752 filed Jan. 20, 2018, U.S. Appl. No. 62/624,201 filed Jan. 31, 2018, U.S. Appl. No. 62/626,660 filed Feb. 5, 2018, U.S. Appl. No. 62/638,789 filed Mar. 5, 2018, and U.S. Appl. No. 62/648,371 filed Mar. 26, 2018. The disclosures of each of these applications are hereby incorporated by reference herein in their entireties.

BACKGROUND OF THE INVENTION

Field of the Invention

The present invention is directed generally to an eyewear platform, and more particularly, to the design of a releasably attachable augmented reality (AR) system that meets the demands of consumers and enterprise, while providing features including, but not limited to, augmented reality or mixed reality. Additionally, certain aspects of the invention disclosed herein can be applied to augmented reality or mixed reality eyewear in general.

It is an adage in the optical industry that fashion trumps function. Even if a type of eyewear is highly functional, if it is not fashionable, the eyewear will not be purchased in quantity by consumers. There are literally hundreds, if not thousands, of eyewear frame styles. (See, e.g., FIGS. 5, 6.) Consumers like and demand selection when picking out new eyewear. Electronic eyeglasses of all types have suffered from this consumer hurdle. Building electronics into the eyeglass frame increases the cost of goods, cost to the consumer, and thickness and weight, and reduces the fashion selection of eyewear available for consumers to choose from. By way of example only, Augmented Reality (AR) eyewear (mainly in the form factor of a headset or goggles) today can weigh up to 500 grams, compared to customary eyeglasses which weigh 20 grams to 40 grams. Such AR headsets or goggles retail for up to $3,000 or more. They are bulky, heavy, not fashionable looking, and expensive. Smart eyeglasses with a heads-up display are available in a very limited number of styles and colors. What is needed is a new platform for providing AR and or Mixed Reality (MR) for consumers and enterprise to use, while maintaining an acceptable fashion, look, weight, selection of eyewear, and cost.

DESCRIPTION OF RELATED ART

As computer systems have been miniaturized and have higher performance and display apparatuses and image communication technologies have advanced, wearable devices that can be worn by a user have been developed. For example, smartwatches wearable on the wrist, smart bands wearable on the head, arm, or foot, smart eyewear worn on the head, etc. have been developed.

The trend toward miniaturization of computing hardware, peripherals, as well as of sensors, detectors, wireless communication and image and audio processors, among other technologies, has helped open up a field sometimes referred to as "wearable computing." In the area of image and visual processing and production, in particular, it has become possible to consider wearable displays that place a very small image display element close enough to a wearer's eye such that the displayed image fills or nearly fills the field of view, and appears as a normal sized image, such as might be displayed on a traditional image display device. The relevant technology may be referred to as "near-eye displays."

Near-eye displays are fundamental components of wearable displays, also sometimes called a head-mountable device or a "head-mounted display." A head-mountable device places a graphic display or displays close to one or both eyes of a wearer. To generate the images on a display, a computer processing system may be used. Such displays may occupy a wearer's entire field of view, or only occupy part of wearer's field of view. Further, head-mountable devices may be as small as an electronic contact lens, a pair of smart eyeglass lenses, or as large as a helmet.

A head-mountable device may provide a graphic display and may be directed to transition from one state to another, such as to transition from and "on" state to an "off" state.

Such displays may be used for Augmented Reality and/or Mixed Reality as explained herein. They are also used for Extended Reality, referred to as XR. XR is the overarching category of one or more of a smartphone, mobile Virtual Reality headset, and/or Augmented Reality unit, such as the embodiment(s) described in the current application. Accordingly, the various embodiments disclosed herein can be used for certain forms of XR.

Definitions of Certain Terms Utilized Herein

These definitions are not meant to be limiting or to be limitations to the claims, but rather to help further understand the invention as described herein.

AR Unit main body—The portion of the AR Unit that fits and/or rests upon an eyewear frame.

AR Unit—The complete AR system.

Augmented Reality (AR)—The viewing of a real image combined with a virtual image creating an augmented reality image. For the purposes of this patent disclosure, from a general, non-limiting perspective, a mixed reality image and/or system can be that of an augmented reality image and/or system. Additionally, AR covers a direct or indirect live view of a physical, real-world environment, the elements of which can be "augmented" by computer-generated perceptual information, ideally across multiple sensory modalities, including visual, auditory, haptic, somatosensory, and olfactory.

Extended Reality (XR)—Extended Reality is the overarching category which includes Virtual Reality, AR, and Mixed Reality.

Eyewear—Refers to any and all types of eyewear worn on or over the eyes, by way of example only, eyewear for: sports, shooting, swimming, safety, industrial, welding, enterprise, dress, fashion, sunglass, space, and/or goggles.

Fit—Refers to attaching or connecting to eyewear when the AR Unit is attached or connected to the eyewear on which it is resting.

Light Engine—A system/device/apparatus, portion, or portions of a light system/device/apparatus of an augmented reality or mixed reality system that provide the illumination and/or image generation for generating a virtual image.

Normal Gaze—This refers to the orientation of one's eyes corresponding to a natural vision gaze and/or line-of-sight when looking straight ahead. Normal Gaze and Natural Gaze can have the same meaning.

Optical Combiner—An optic or optical system that causes two or more images to be superimposed on one another or within the same view, such as when a virtual image is combined with a real image as seen by a wearer of a system. In embodiments, the optical combiner can be a top down optical combiner coming down from the top of an AR Unit main body or a side across optical combiner coming from an end of an AR Unit main body. In embodiments, the optical combiner can be located in front of the eyeglass lens, behind the eyeglass lens, or incorporated within the eyeglass lens. In other embodiments, the optical combiner can be located at or above the upper edge of a pupil of a wearer or cover the top edge and lower edge of a pupil of an eye of the wearer. The optical combiner is capable of being use as applicable for one or more of XR, AR, Virtual Reality, and/or Mixed Reality.

Optical Engine—A system/device/apparatus, portion, or portions of an optical system/device/apparatus of an augmented reality or mixed reality system, that provides the optics required for causing an augmented reality image or mixed reality image to be seen by a wearer thereof.

OLED—OLED (organic light emitting diode). However, when used herein, OLED means the same as an OLED display Releasably Attached—Generally means that when something is attached, it can be detached and then reattached, etc.

Optical Window—Refers to an optical member that allows the transmission and/or reflection of a certain amount of light through and/or from such optical member. An eye(s) of the wearer of a system that includes an optical window can see through the optical window. An optical combiner can be included in, on, or be the same as an optical window. An optical window can support an optical combiner or, in effect, act as an optical combiner, or be a substrate on which an optical combiner is attached. An optical window can be an optic that is transparent or partially transparent or has a portion of which is transparent or partially transparent. An optical window can have no optical power. An optical window can have optical power. An optical window can include a reflector or reflective material for reflecting a virtual image back into the eye or a wearer. Such a reflector or reflective material can be embedded within the optical window or on a surface of the optical window. Such a reflector can be of a size that is only part of the optical window or can be the full size of the optical window. An optical window can support a waveguide. An optical window can act as or comprise a waveguide. An optical window can support a lightguide. An optical window can act as or comprise a lightguide. An optical window can comprise a transparent or partially transparent OLED. An optical window can support a transparent or partially transparent OLED. A transparent or partially transparent OLED can be called a TOLED. A TOLED can be a see-through OLED. An optical window can be or comprise a partial reflector, a beamsplitter, or a combiner. An optical window can be or comprise a reflecting spatial light modulator. An optical window can be or comprise an active transparent or partially transparent display, such as an OLED display. (See, e.g., FIGS. 56A, B, and C.)

Unit—Generally referred to herein as an apparatus, device, or system.

Vision System—A system/device/apparatus, portion, or portions of the Vision System of the Augmented Reality Unit or Mixed Reality Unit, which is the optical portion of the AR Unit or the Mixed Reality Unit that permits the wearer to experience seeing a real image or alternatively (when desired) a virtual image combined with the real image. The Vision system permits the wearer thereof to visually experience natural vision or, alternatively, augmented or mixed reality vision. The vision system permits the wearer to be able to switch between these two forms of vision as desired by the wearer thereof.

SUMMARY OF THE INVENTION

An AR Unit is provided, whereby the AR Unit utilizes existing eyewear as an attachment platform, and whereby the AR Unit is attachable to and detachable from a plurality of different eyewear having different shapes and sizes, whereby a portion of the AR Unit rests on the top of the eyewear, and whereby the AR Unit can provide unobstructed vision when the wearer is looking straight ahead. In certain embodiments, an optical combiner of the AR Unit is located at or above the upper edge of the pupil of the wearer. Said another way, in certain embodiments the optical combiner of the AR Unit is located above, immediately above, or higher above the line of sight of the wearer. (See, e.g., FIGS. 28-30) In other embodiments, the optical combiner is located within the line of sight of the pupil 2910. (See, e.g., FIG. 29.)

The AR Unit can be comprised of the following major parts: 1) AR main unit, 2) AR unit housing, 3) AR unit housing covering, 4) AR unit electrical conductive tether and electronic module that can, by way of example only, reside behind the wearer's head or neck, 5) Optical Engine (s), 6) Light Engine(s), 7) Vision System, 8) associated electronics, 9) camera(s) or image capture device(s), and 10) auditory system.

Utilizing the invention, a limited number of AR Unit shapes can fit most eyewear frame styles and sizes. In fact, five or fewer AR Units can fit most eyewear frame styles. This can be accomplished, by way of example only, by one of: the provider of the AR unit at the point of sale or the purchaser of the AR Unit for his or her eyewear, whether the eyewear be new eyewear or existing eyewear. The AR Unit's main body can fit on the top of an eyewear frame and can be adjusted or conformed to the top contour or shape of the eyeglass frame front's top. In certain embodiments, compressible material can be positioned between the top of the eyewear frame and the bottom of the AR Unit, or in a recess in the bottom of the AR Unit to wholly or partly fill in any open space that may exist or help achieve acceptable fit. In other embodiments, a façade can be placed beneath the AR Unit and above the top of the eyewear frame bridge to fill in any open space that may exist.

The AR Unit can provide monocular or binocular augmented reality. In certain embodiments, the horizontal length of the AR Unit (main body) is the same as or is shorter in length dimension than the horizontal length dimension of the eyewear frame front that is supporting it, and the middle of the horizontal AR Unit (main body) dimension is of a greater vertical height dimension than either end of the horizontal dimension length of the AR Unit (main body). (See, e.g., FIG. 8.) The front of the AR Unit main body can extend forward in front of and above the eyewear frame front to which it is attached. The rear of the AR Unit main body can extend slightly rear of and above the frame of the frame front to which it is attached. In most embodiments, but not all, the front of the AR Unit's main body extends forward from the AR Unit's main body more than that of the back of the AR Unit's main body relative to the eyewear frame front to which it is resting.

In certain embodiments, five or fewer AR Unit main body designs having one or more flex joints or made of a flexible or shapeable material can fit upwards of between 66.67+% and 80%, for example, of all eyewear styles and sizes. (See, e.g., FIG. 7.) In certain embodiments, the AR Unit main body is made of a flexible material that houses one or more rigid electronic and/or optical module(s). In certain embodiments, the AR Unit main body has a recess in the bottom side of the AR Unit. The AR Unit main body can have a recess that is of a length that accepts a portion of a top of an eyeglass frame. The AR Unit main body can have a recess that is of a length that accepts the top of an eyeglass frame. In certain embodiments, the bottom of the AR Unit can accept a pin from a conformable or compressible material. (See, e.g., FIGS. 9, 10.) The recess can accept a male ridge located on the top surface of a conformable or compressible material. (See, e.g., FIG. 9.) In certain embodiments, the AR Unit includes a permanent, integral, or removable conformable or compressible material. (See, e.g., FIG. 13.) In certain embodiments, the conformable or compressible material has a male ridge on its superior top surface that fits within a female recess of the bottom of the main AR Unit portion (see, e.g., FIG. 13), or the conformable or compressible material has a female recess that is on the lower bottom surface of the compressible material that fits over a portion of the top edge of the eyewear. The AR Unit main body may comprise a conformable or compressible material that extends across the majority of the AR Unit main body (see, e.g., FIG. 13), or that is located above the bridge of the eyewear (see, e.g., FIG. 14). The compressible material can be in one or more pieces.

In other embodiments, a bendable member is housed within or attached to a flexible portion of the AR Unit. The flexible portion of the AR Unit rests on top of an eyewear frame front. The bendable member can have little to no material memory, meaning that once it is bent it does not return to its original shape. The bendable member can be reshaped so to reshape the flexible portion of the augmented reality device. In aspects, the AR Unit main body is constructed of materials that permit being reshaped by a third party or the wearer to fit his or her eyewear frame and/or to allow for a customized look preferred by the wearer or third party when attached to his or her eyewear. It should be pointed out, that this patent disclosure anticipates that the seller of the AR Unit and/or an optical technician can also fit or shape the AR Unit for the eyewear of the wearer to the satisfaction of the wearer. Also, this patent disclosure anticipates that the purchaser can also fit or shape the AR Unit for his or her eyewear to their satisfaction.

In still other embodiments, the covering of the AR Unit is bendable or shapeable, while the internal electronic module and/or electronics are left largely unaltered. This permits the AR Unit's bottom to be reshaped without affecting other parts of the AR Unit. In other embodiments, the electronics within the AR Unit are housed within mostly rigid structures. These structures are divided into separate structural compartments permitting the AR Unit to be reshaped while leaving the electronics largely intact.

The AR Unit main body houses one or more electronic module(s) and thereby fully or partly covers and/or houses the electronic module(s). The AR Unit main body can house one or more of: conformable, bendable, formable, and/or malleable members. In aspects, when a single conformable member is utilized, the electronic module or modules are separate from the single conformable member. (See, e.g., FIGS. 44, 51-52.) The AR Unit Body may house an electronic module(s) having one or more of: conformable portions, malleable portions, and/or bendable portions. The one or more of: conformable, malleable, bendable, and/or formable member(s) or portion(s), can be adjusted to shape the AR Unit main body or portions of the body so that it is complementary to the eyewear frame front, on top of which the AR main body or AR Unit rests. The bendable materials can be made of any material that can be bent to a shape while retaining the shape to which it is bent; by way of example only, a thin metal. Such bendable materials having little to no memory, by way of example only, can include: tin, aluminum, polycarbonate, PMMA, or polystyrene. The following are, by way of example only, flexible materials that the AR Unit main body or its outer covering can be made of by way of example only: polyterephthlate, urethane, polybutadiene, polyisoprene, cross linked hydrogel, and/or rubber. The following are, by way of example only, malleable materials that may be used to shape the AR Unit main body. The malleable materials that have re-formable memory, by way of example only include: malleable thermosets based on polyimine networks, cross-linked polycaprolactone, or polyurethanes.

In certain embodiments, the AR Unit main body comprises an arm or arms. Each arm secures the unit to one of the two eyewear temples. Each arm can be attached to an eyewear temple by way of any mechanical attachment means, by way of example only, strap, hook, snap, magnet, male/female interface, and/or Velcro. In one embodiment, by example only, an arm can have a series of apertures which permit the arms to be adjusted. (See, e.g., FIGS. 16-17.) An arm can have two or more apertures. The apertures can be circular, elongated or of any shape. A male member that is connected to the eyewear temple permits engaging with an aperture of the arm. By choosing different apertures, the arms can be adjusted in length. In other embodiments, the arms can comprise a small magnet which then engages with a track comprising a ferromagnetic material or another magnet located on or about the temple. In a preferred embodiment, the arm attaches directly or indirectly to the inside side of the eyewear temple. The track can be attached to the eyewear temple or incorporated within the side of the eyewear temple. In other embodiments, the arms can comprise a ferromagnet material which then engages with a magnet located on or about the temple. In a preferred embodiment, the arm attaches directly or indirectly to the inside side of the eyewear temple. The track can be attached to the eyewear temple or incorporated within the side of the eyewear temple. In still another embodiment, two magnets can be used; one on the arm, and one that is embedded in or attached to the eyewear temple. In certain embodiments, the arm(s) are attached directly to the hinge which attaches a temple to the eyewear frame front.

In certain embodiments, the arm(s) can be attached to the AR Unit main body by, for example, a hinge or swivel joint. (See, e.g., FIG. 16.) This allows an arm to be rotated up or down depending upon the manner to which it attaches to the eyewear temple. For clarity, the arms of the AR Unit can be adjustable in length and/or also in positioning. This permits for attaching the AR Unit main body to a wide variety of different styles, sizes, and shapes of eyewear.

The AR Unit main body can be expanded or shortened horizontally to fit a larger or smaller frame front, respectively. The manner which the AR Unit's horizontal length can be expanded or shortened is, by way of example only, a pin or pins that pull in or out of each of the horizontal ends of the AR Unit's main body. In other embodiments, the horizontal length of the AR Unit's main body can be expanded or shortened by way of the covering of the AR Unit's main body being separated into two or more sections in a manner which it can be pulled apart or pushed together. In preferred embodiments, the AR Unit main body supports one or more optical windows, including two optical windows. When two optical windows are utilized, in aspects, one optical window can be up to 60 mm wide (horizontally) and up to 50 mm tall (vertically). In certain embodiments, one optical window can be used. In other embodiments, each optical window can be 20 mm or less wide (horizontally) and 20 mm or less tall (vertically). When one optical window is utilized for both eyes, the one optical window can be up to 150 mm horizontally and up to 50 mm tall (vertically). An optical window or a portion of the optical window(s) can be, support, comprise, include, or act as a partial reflector or a beamsplitter. For purposes of clarity, a partial reflector as used herein is meant to facilitate the same function; namely, to allow the transmission of a certain amount of light while reflecting a certain amount of light (see, e.g., FIG. 56A). An optical window or a portion of the optical window(s) can be, support, comprise, include, or act as an optical combiner or combiner. For purposes of clarity, an optical combiner and combiner as used herein are meant to facilitate the same function; namely, to cause two or more images to be superimposed on one another or within the same view, such as when a virtual image is combined with a real image as perceived by a wearer of a system. In certain embodiments, an optical window can have a width on one end of 3 mm to 7 mm for a certain distance and then enlarge to that of a 7 mm to 15 mm square, round, circle, oval, or some other shaped zone to which the pupil of the wearer's eye will look through. In certain embodiments, an optical window can be 10 mm-60 mm wide. In certain embodiments, an optical window can be 10 mm-50 mm high (vertically). An optical window can be taller vertically than it is wide horizontally. (See other possible dimensions, shapes, and sizes in, e.g., FIGS. 18-21.) The thickness of the optical window can be 0.25 microns to 3.0 mm thick. The materials can be made of, by way of example only, transparent soft, semi-rigid, and/or rigid materials. An optical window can be shorter vertically that it is wide horizontally (see, e.g., FIG. 31). In certain embodiments, one long horizontal optical window can be used that wholly or partly covers both eyes and is continuous over the nose of the wearer (see, e.g., FIGS. 32-33). When one optical window is utilized, a notched area is provided in the bottom edge of the optical window for clearing an area around the nose of the wearer (see, e.g., FIGS. 32-33). In this case, the long continuous optical window can be over 100 mm in the horizontal dimension. When the optical window is one long continuous unit, certain portions of the optical window can comprise, support, include, or have embedded a combiner (s), beamsplitter(s), or partial reflector(s). In certain embodiments, the previously disclosed one long continuous optical window can be split over the bridge of the nose to break the window into two windows so that each can be adjusted independently of one another (see, e.g., FIGS. 31, 50).

In certain embodiments, an optical window and/or optical combiner can be that of a top down optical window or optical combiner. The optical window and/or optical combiner can be attached to the AR Unit main body and extend down and in front of a lens housed by the eyewear frame to which it is attached or is resting thereupon. In certain other embodiments, the optical window and/or optical combiner can be attached to the AR Unit main body and extend down and behind a lens housed by the eyewear frame to which it is attached or is resting thereupon. In certain other embodiments, the optical window and/or optical combiner can be incorporated within the lens housed by the eyewear.

In certain embodiments, the bottom edge of the optical window is located at or above the top edge of the pupil of the eye(s) of the wearer. In other embodiments, the bottom edge of the optical window is located such to cover the bottom edge of the pupil. When the bottom edge of the optical window is located at or above the top edge of the pupil of the eye of the wearer, the wearer can experience unencumbered vision with normal gaze when looking straight ahead. When the bottom edge of the optical window is located at or above the top edge of the pupil of the eye of the wearer, the line of sight of the wearer is unencumbered by the optical combiner. In such an embodiment, when the wearer desires to see an augmented or mixed reality image, the wearer tilts his or her chin down between 5 and 45 degrees while keeping his or her eyes looking straight ahead in a horizontal manner relative to the ground on which they are standing (see, e.g., FIG. 57).

An optical window, or portions thereof, can made of a transparent, mostly transparent, translucent, mostly translucent, semi-transparent, transmissive, and/or partially transmissive material. All or a portion of the optical window can be made of a light transmission changing material such as, by way of example only, photochromic material, electrochromic material, and/or thermochromic material.

In certain embodiments, an electrical conductive tether and electronic module is part of or connected to the AR Unit. These can, by way of example only, reside behind the wearer's head or neck. In aspects, the electrical conductive tether connects certain electronics not housed in the AR Unit main body with those housed in the AR Unit main body. This allows for electronic components to be offloaded or located separately from the AR Unit main body and housed on or within the electrical conductive tether and electronic module. By way of example only, one or more of the following can be electrically connected to the electrical conductive tether or electronic module: power source, main power source, rechargeable battery, battery, coil, source of wireless communication, controller, transceiver, transmitter, receiver, GPS, CPU, memory storage, flash memory, random access memory, EEPROMs, earbud, hearing aid, assisted hearing device, wifi chip, Bluetooth chip, vibrator, communication system, antenna, audio system, radio, sensor, ASIC, switch, auditory system, sensor(s) and/or image processor. This reduces the size and weight of the AR Unit main body. This reduced size helps with making the AR Unit more fashionably acceptable and/or comfortable to the wearer when attached to the eyewear worn by the wearer. Also, the reduced weight helps with comfort of wearing the AR Unit when attached to the eyewear worn by the wearer.

The AR Unit can comprise an auditory system. The auditory system can utilize ear buds. The ear buds can be connected by a wired connection to the AR Unit. When wired to the AR Unit, the ear buds connect in most but not all cases to the electronic tether. The ear buds can be wirelessly connected to the AR Unit. The auditory system can utilize bone conduction for audio transmission. A personal assistant can be part of the auditory system.

BRIEF DESCRIPTION OF THE DRAWINGS

The accompanying drawings illustrate certain aspects of embodiments of the present invention and should not be used to limit the invention. Together with the written description the drawings serve to explain certain principles of the invention.

FIG. 1 is a chart showing embodiments of hardware and an operating system.

FIG. 22 is a schematic diagram of a depiction of one possible embodiment of the apparatus.

FIG. 26 is a schematic diagram of a depiction of one possible embodiment of the apparatus.

FIG. 27 is a schematic diagram of a depiction of one possible embodiment of the apparatus.

FIG. 55 is a schematic diagram of a depiction of one possible embodiment of the apparatus.

DETAILED DESCRIPTION OF VARIOUS EMBODIMENTS OF THE INVENTION

Figure 2:
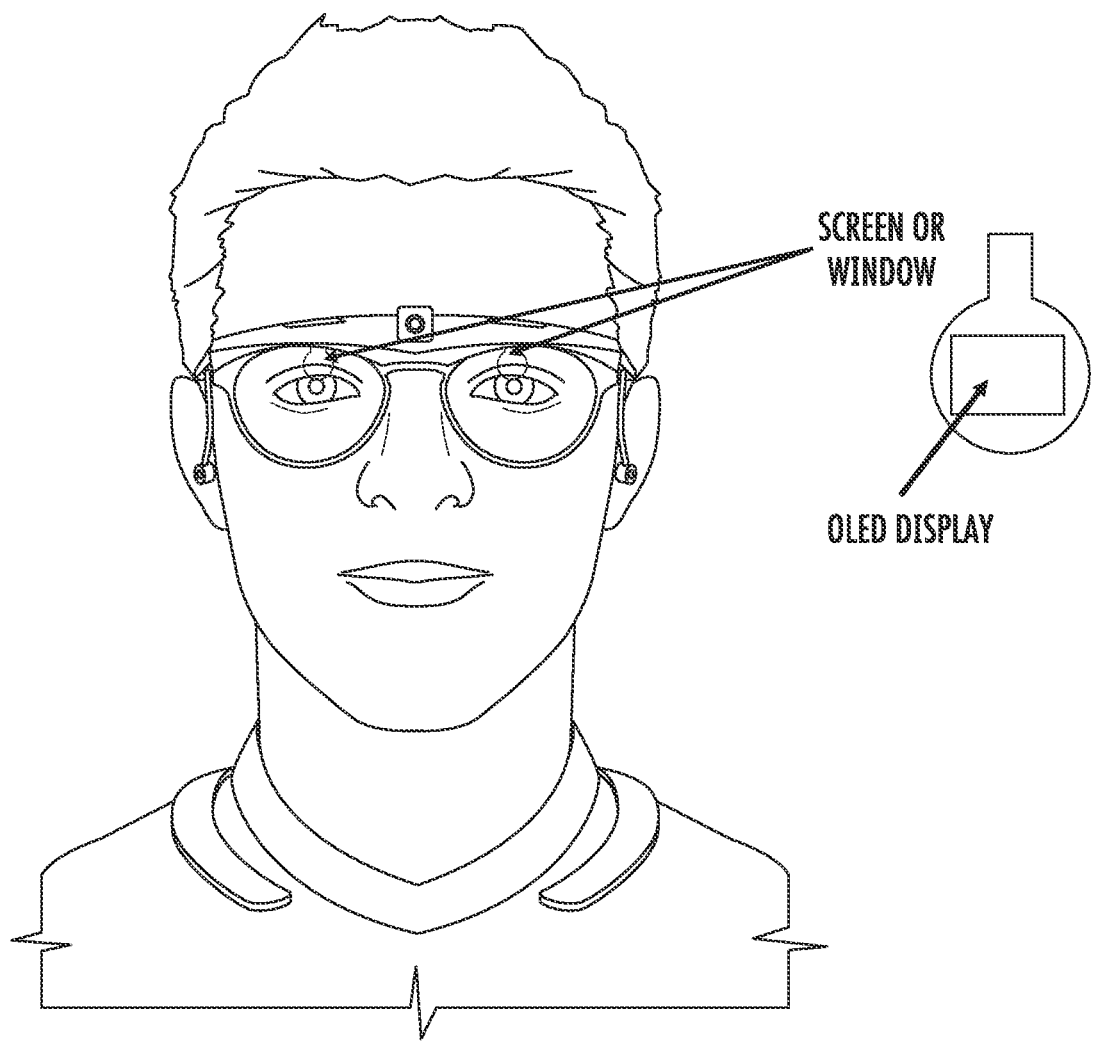
FIG. 2 is a schematic diagram of a depiction of one possible embodiment of the apparatus.

Reference will now be made in detail to various exemplary embodiments of the invention. It is to be understood that the following discussion of exemplary embodiments is not intended as a limitation on the invention. Rather, the following discussion is provided to give the reader a more detailed understanding of certain aspects and features of the invention.

The present invention has been described with reference to particular embodiments having various features. It will be apparent to those skilled in the art that various modifications and variations can be made in the practice of the present invention without departing from the scope or spirit of the invention. One skilled in the art will recognize that these features may be used singularly or in any combination based on the requirements and specifications of a given application or design. Embodiments comprising various features may also consist of or consist essentially of those various features. Other embodiments of the invention will be apparent to those skilled in the art from consideration of the specification and practice of the invention. The description of the invention provided is merely exemplary in nature and, thus, variations that do not depart from the essence of the invention are intended to be within the scope of the invention. All references cited in this specification are hereby incorporated by reference in their entireties.

Embodiments of the invention also include a computer readable medium comprising one or more computer files comprising a set of computer-executable instructions for performing one or more of the calculations, steps, processes and operations described and/or depicted herein. (See, e.g., FIG. 1.) In exemplary embodiments, the files may be stored contiguously or non-contiguously on the computer-readable medium. Embodiments may include a computer program product comprising the computer files, either in the form of the computer-readable medium comprising the computer files and, optionally, made available to a consumer through packaging, or alternatively made available to a consumer through electronic distribution. As used in the context of this specification, a "computer-readable medium" is a non-transitory computer-readable medium and includes any kind of computer memory such as floppy disks, conventional hard disks, CD-ROM, Flash ROM, non-volatile ROM, electrically erasable programmable read-only memory (EEPROM), and RAM. In exemplary embodiments, the computer readable medium has a set of instructions stored thereon which, when executed by a processor, cause the processor to perform tasks, based on data stored in the electronic database or memory described herein. The processor may implement this process through any of the procedures discussed in this disclosure or through any equivalent procedure.

In other embodiments of the invention, files comprising the set of computer-executable instructions may be stored in computer-readable memory on a single computer or distributed across multiple computers. A skilled artisan will further appreciate, in light of this disclosure, how the invention can be implemented, in addition to software, using hardware or firmware. As such, as used herein, the operations of the invention can be implemented in a system comprising a combination of software, hardware, or firmware.

Embodiments of this disclosure include one or more computers or devices loaded with a set of the computer-executable instructions described herein. The computers or devices may be a general purpose computer, a special-purpose computer, or other programmable data processing apparatus to produce a particular machine, such that the one or more computers or devices are instructed and configured to carry out the calculations, processes, steps, operations, algorithms, statistical methods, formulas, or computational routines of this disclosure. The computer or device performing the specified calculations, processes, steps, operations, algorithms, statistical methods, formulas, or computational routines of this disclosure may comprise at least one processing element such as a central processing unit (i.e. processor) and a form of computer-readable memory which may include random-access memory (RAM) or read-only memory (ROM). The computer-executable instructions can be embedded in computer hardware or stored in the computer-readable memory such that the computer or device may be directed to perform one or more of the calculations, steps, processes and operations depicted and/or described herein.

Additional embodiments of this disclosure comprise a computer system for carrying out the computer-implemented method of this disclosure. The computer system may comprise a processor for executing the computer-executable instructions, one or more electronic databases containing the data or information described herein, an input/output interface or user interface, and a set of instructions (e.g. software) for carrying out the method. The computer system can include a stand-alone computer, such as a desktop computer, a portable computer, such as a tablet, laptop, PDA, or smartphone, or a set of computers connected through a network including a client-server configuration and one or more database servers. The network may use any suitable network protocol, including IP, UDP, or ICMP, and may be any suitable wired or wireless network including any local area network, wide area network, Internet network, telecommunications network, Wi-Fi enabled network, or Bluetooth enabled network. In one embodiment, the computer system comprises a central computer connected to the internet that has the computer-executable instructions stored in memory that is operably connected to an internal electronic database. The central computer may perform the computer-implemented method based on input and commands received from remote computers through the internet. The central computer may effectively serve as a server and the remote computers may serve as client computers such that the server-client relationship is established, and the client computers issue queries or receive output from the server over a network.

The input/output interfaces may include a graphical user interface (GUI) which may be used in conjunction with the computer-executable code and electronic databases. The graphical user interface may allow a user to perform these tasks through the use of text fields, check boxes, pull-downs, command buttons, and the like. A skilled artisan will appreciate how such graphical features may be implemented for performing the tasks of this disclosure. The user interface may optionally be accessible through a computer connected to the internet. In one embodiment, the user interface is accessible by typing in an internet address through an industry standard web browser and logging into a web page. The user interface may then be operated through a remote computer (client computer) accessing the web page and transmitting queries or receiving output from a server through a network connection.

A first embodiment disclosed herein is that of a wearable apparatus capable of providing a virtual image, wherein the apparatus is an AR Unit, wherein the AR Unit's main body supports one or more light engine(s) for lighting an image perceived by the wearer, wherein the lighted image is perceived to be a virtual image, wherein one or more optical engine(s) causes the wearer of the apparatus to perceive a virtual image mixed with a real image, wherein the apparatus comprises an outer covering, wherein a shape of the bottom surface of the covering is present for accepting a top surface of an eyewear frame, wherein the apparatus can be adjusted to fit a plurality of different eyewear frames and wherein the apparatus is releasably attachable to the plurality of different eyewear frames.

A second embodiment is a wearable apparatus capable of providing a virtual image, wherein the wearable apparatus is releasably attachable to a plurality of different eyewear frames, wherein the apparatus is capable of resting on the top of the plurality of different eyewear frames, wherein the apparatus supports two light engines that provide the light for what becomes a virtual image and two optical engines that cause a wearer of the apparatus to perceive a binocular virtual image combined with a binocular real image, wherein the two optical engines include two optical combiners and wherein a bottom edge of the two optical combiners is positioned at or above a top edge of the pupils of the wearer of the apparatus when the wearer is looking straight ahead with normal gaze.

A third embodiment disclosed herein is that of a wearable apparatus capable of providing a virtual image, wherein the wearable apparatus is releasably attachable to a plurality of different eyewear frames, wherein the apparatus is capable of resting on the top of a plurality of different eyewear frames, wherein the apparatus supports one or more light engine(s) generating the light that creates a virtual image and one or more optical engine(s) for causing the wearer to perceive the virtual image mixed with a real image, wherein a common part for the optical engine and that of the light engine is that of a see-through OLED and whereby the see-through OLED is utilized as an optical combiner and also part of the light engine.

A fourth embodiment disclosed herein is that of a wearable apparatus capable of providing a virtual image, wherein the apparatus is an AR Unit, wherein the AR Unit's main body supports one or more light engine(s) for lighting an image perceived by the wearer, wherein the lighted image is perceived to be a virtual image, wherein one or more optical engine(s) causes the wearer of the apparatus to perceive a virtual image mixed with a real image, wherein the apparatus comprises an outer covering, wherein the AR Unit main body can be adjusted to fit a plurality of different eyewear frames, wherein the apparatus is releasably attachable to the plurality of different eyewear frames and wherein a façade is located beneath the bottom of the AR Unit's main body and the top of the eyewear frame front superior to the bridge of the eyewear.

The invention can be thought of in terms of several parts; for example only, the AR Unit can be comprised of three or more of the following major parts: 1) AR main unit, 2) AR unit housing, 3) AR unit housing covering, 4) AR unit electrical conductive tether and electronic module that can, by way of example only, reside behind the wearer's head or neck, 5) Optical Engine(s), 6) Light Engine(s), 7) Vision System, 8) associated electronics, 9) camera(s) or image capture device(s), and/or 10) auditory system.

In aspects, a Light Engine can comprise one or more of the following: electronic displays, such as LCD, micro OLED or micro LED (μLEDs), LED display, OLED display, OLED see-through display, DLPs, LCOS, as well as scanning display types such as a vibrating fiber, laser scanning display, laser-based projector, a lenticular (based on micro-lens arrays), focusing lens, spatial modulator, collimator, optical coupler, projector, and/or direct laser scanning into or onto the retina.

In aspects, an Optical Engine can comprise one or more of the following: waveguide(s), lightguide(s), mirror(s), lens(es), optic(s), collimator(s), optical coupler(s), grating(s), optical fiber(s), lightpipe(s), reflective element(s), beam splitter(s), Pupil Relay(s), segmented reflector(s), Fresnel or diffractive facet(s), optical combiner(s), combiner(s), see-through OLED display, coating(s), diffractive element(s), optical window(s), and/or optical substrate(s).

In aspects, a Vision System comprises one or more of the following: spectacle lens(es) which can be that of prescription or non-prescription, optic(s), optical combiner(s) which can have optical power or no optical power. The optical combiner is a component of the optical engine but may be considered to be part of the vision system. The optical combiner can be located behind the spectacle lens closest to the eye, embedded within the spectacle lens, on a surface of the spectacle lens, or in front of the lens away from the eye. The vision system can be monocular or binocular. The AR unit can provide a monocular augmented reality image or a binocular augmented reality image. The AR unit can provide a monocular virtual image or a binocular virtual image. The AR unit can provide a monocular mixed reality image or a binocular mixed reality image. When the AR unit provides a binocular virtual image then the number of components that create and communicate the virtual image to the wearer may comprise more than that of an AR Unit providing a monocular virtual image. By way of example only, when a monocular virtual image is communicated to the wearer, only one optical combiner is required. When a binocular virtual image is communicated to the wearer, two optical combiners are required. Said another way, a monocular AR unit requires one optical engine and one light engine, whereas a binocular AR Unit requires two optical engines and two light engines.

Figure 32:
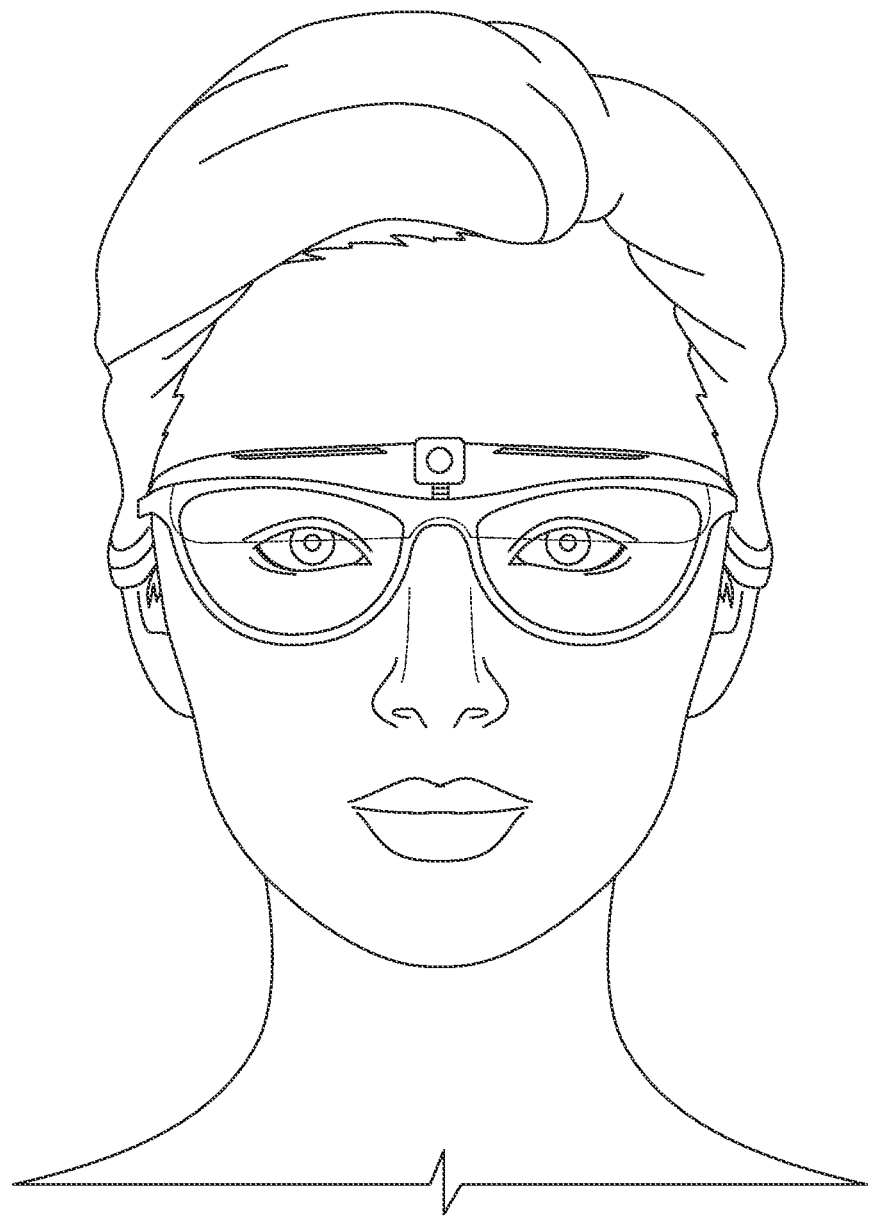
FIG. 32 is a schematic diagram of a depiction of one possible embodiment of the apparatus.
Figure 33:
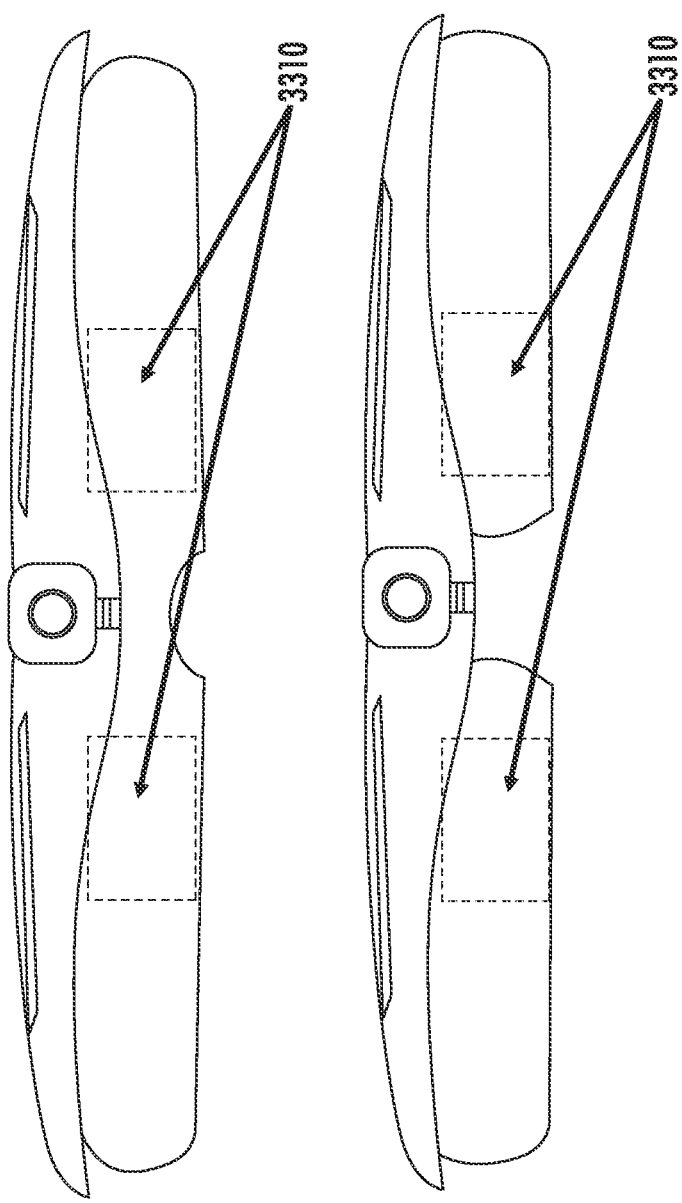
FIG. 33 is a schematic diagram of a depiction of one possible embodiment of the apparatus.
Figure 34:
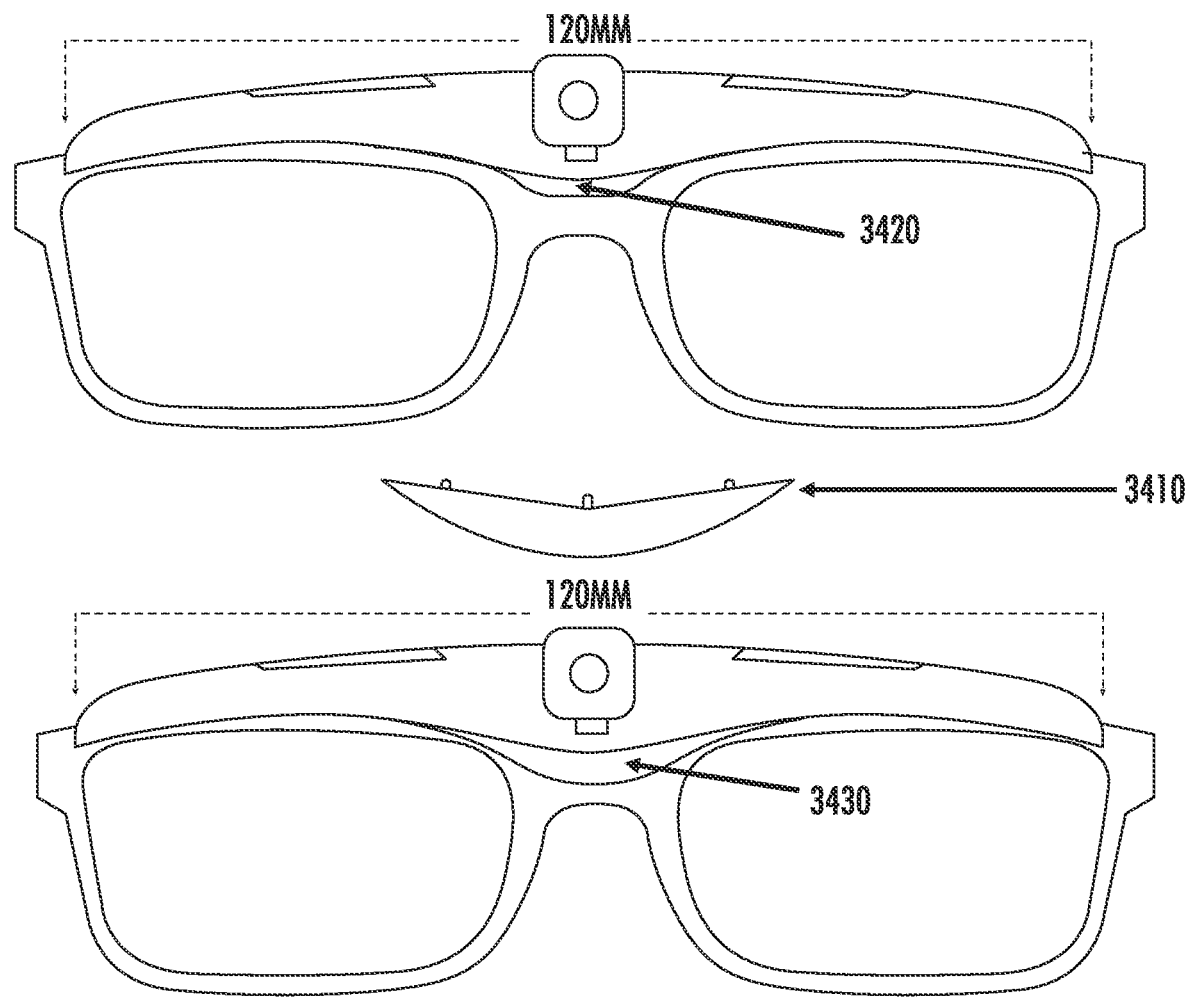
FIG. 34 is a schematic diagram of a depiction of one possible embodiment of the apparatus.
Figure 35:
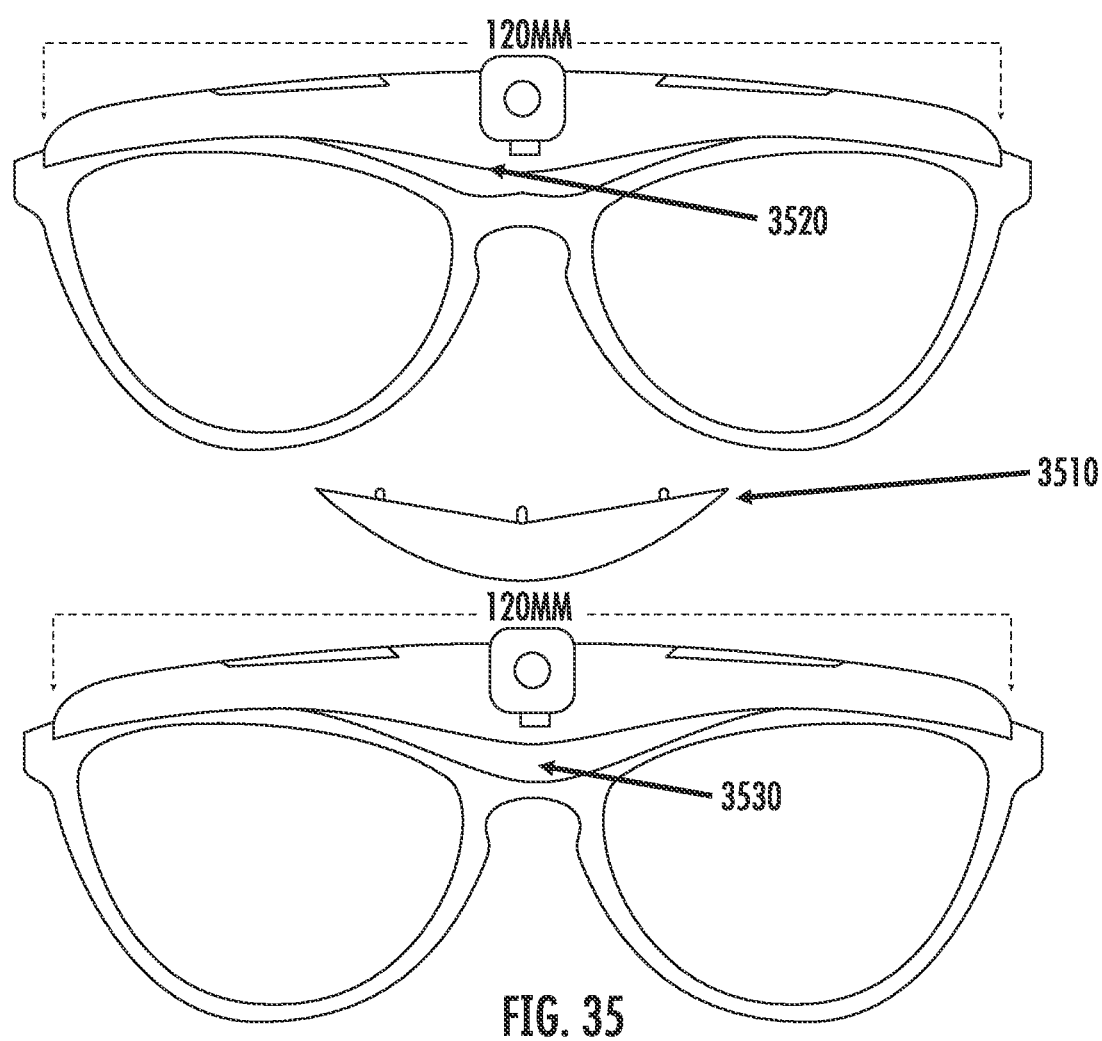
FIG. 35 is a schematic diagram of a depiction of one possible embodiment of the apparatus.
Figure 36:
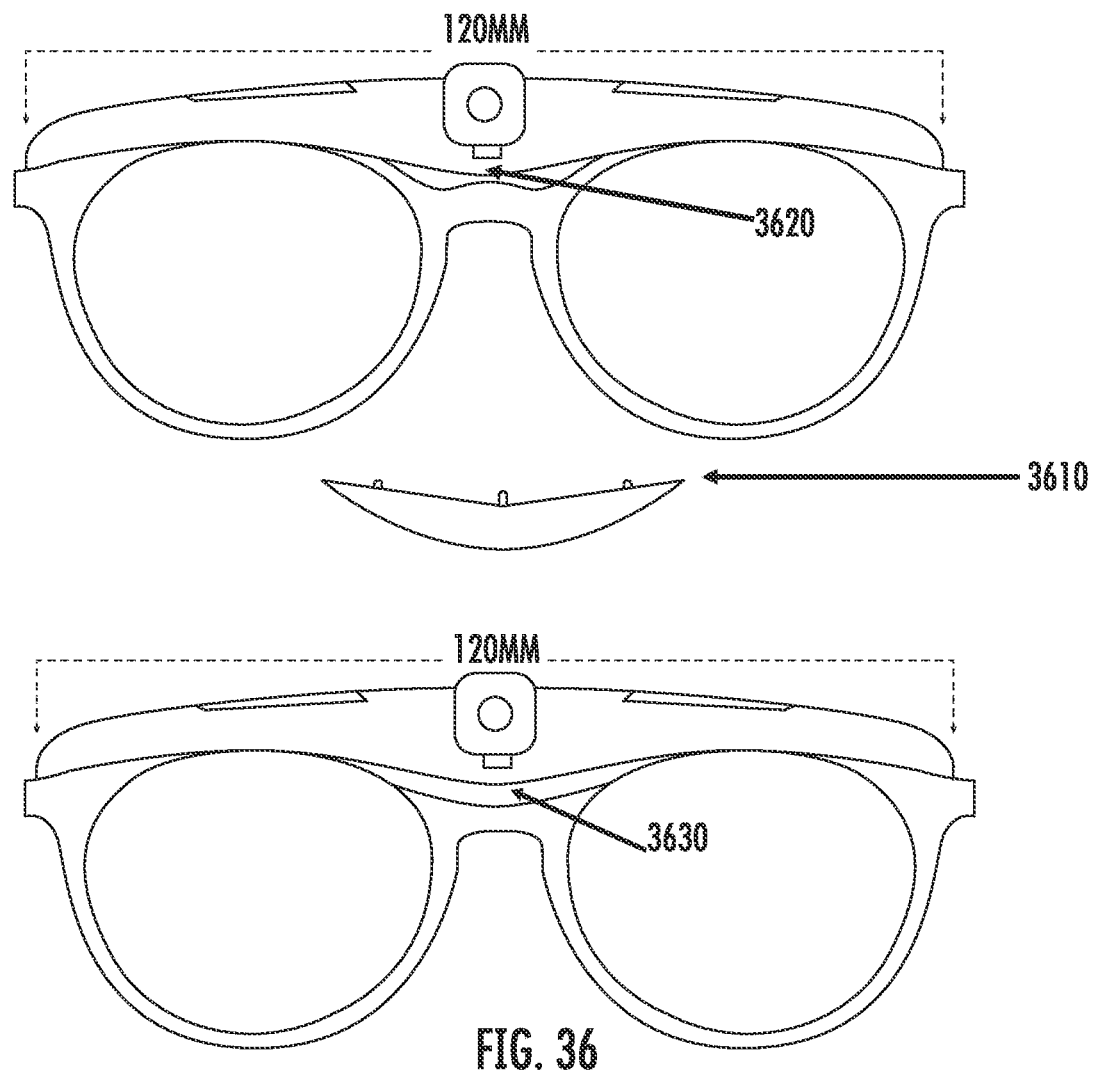
FIG. 36 is a schematic diagram of a depiction of one possible embodiment of the apparatus.
Figure 37:
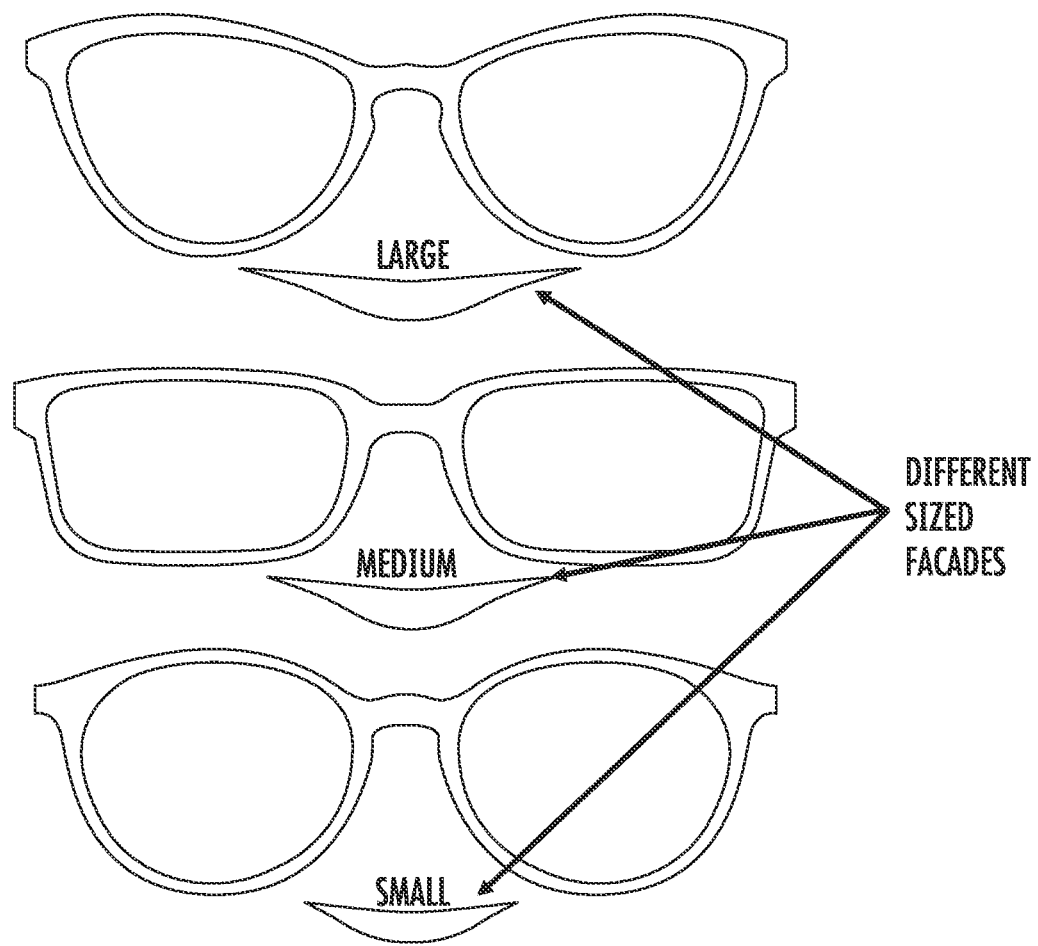
FIG. 37 is a schematic diagram of a depiction of one possible embodiment of the apparatus.
Figure 56A:
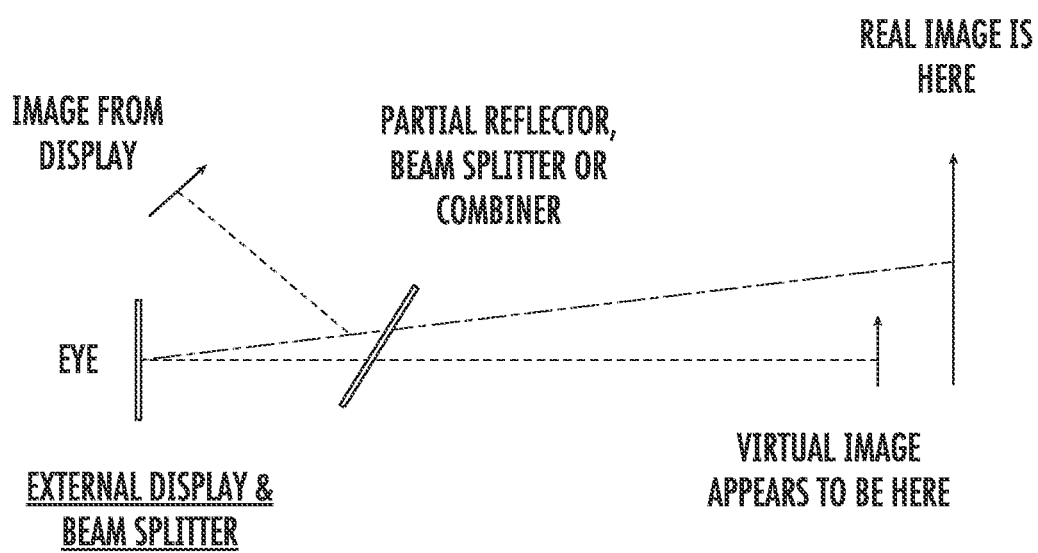
FIGS. 56A, 56B, and 56C are schematic diagrams of depictions of possible embodiments of the apparatus, including examples of the underlying optics.
Figure 56B:
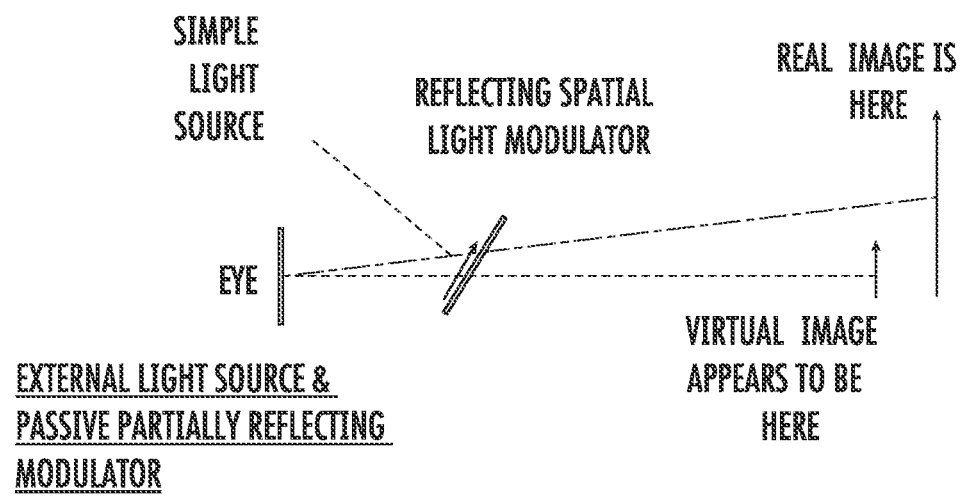
Figure 56C:
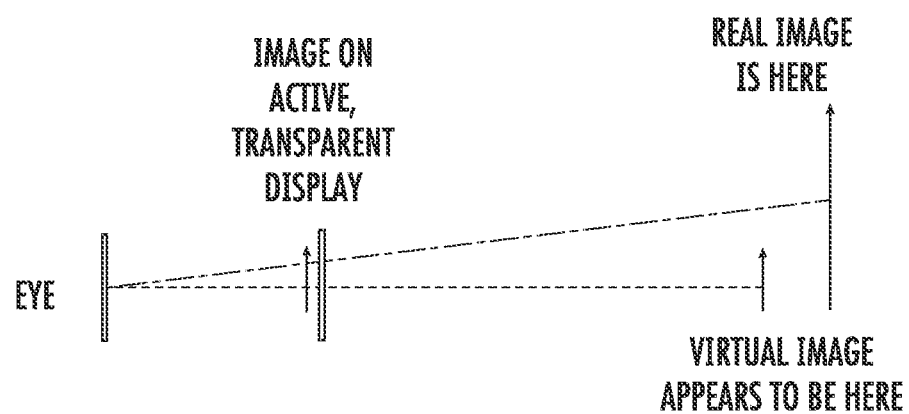

An optical window can be a transparent or mostly transparent substrate. An optical window can be made of, by way of example only, plastic or glass. An optical window can be made of, by way of example only, a rigid, semi rigid, soft, and/or flexible material. An optical window can be planar or curved. In certain embodiments, the optical window is flat. In other embodiments the optical window is curved. The curve can be similar to an eyeglass lens front surface. In still other embodiments the optical window is curved to match the front convex surface of the spectacle lens to which it sits in front of. When used as a substrate, the optical window can have the same refractive index or within the range of 0.01-0.05 refractive index units and more preferably within the range of 0.01-0.03 refractive index units of the material as the member that is attached. An optical window can transmit an image from a projector or a display, such as the embodiment shown in FIG. 56A or 56B, or an optical window can transmit an image internally through the material the optical window is made of, such as the embodiment shown in FIG. 56C (e.g., a transparent OLED display or an image created by an external display and transmitted to the optical window using an image-preserving waveguide array). An optical window can support the transmission of an image from a projector or a display, such as if it includes a partial reflector, or an optical window can support the transmission of an image, such as if it includes a see-through OLED display or an image created by an external display and transmitted to the optical window using an image-preserving waveguide array. An optical window can itself also reflect an image from a projector or display. An optical window, or portion(s) thereof, can be that of an optical combiner or combiner. An optical window, or portion(s) thereof, can support an optical combiner or combiner. An optical window can be antireflective coated on one or both surfaces. An optical window can be removably attachable to the AR Unit, such as magnetically to the AR Unit (see, e.g., FIGS. 50-52 at 5030, 5130, and 5230). An optical window can be removably attached mechanically or permanently attached to the AR Unit. An optical window can be one continuous optical window for both eyes (see, e.g., FIGS. 32-33). An optical window can be a monocular optical window for one eye. An optical combiner 3310 can take up a portion of the optical window. An optical combiner can comprise all of the optical window. One continuous optical window can be notched to fit around the nose of the wearer. One continuous optical window can have one optical combiner for one eye (monocular) or two optical combiners for two eyes (binocular). (See, e.g., FIG. 33.) When removably attached to the AR Unit, a magnetic attachment or mechanical attachment can properly align the optical communication from the light engine to the optical window. In certain embodiments, an optical window can be located in front of the eyeglass lens, furthest away from the eye of the wearer. In certain other embodiments, an optical window is located behind the eyeglass lens closest to the eye of the wearer. In still other embodiments the optical window can be embedded within the eyeglass lens housed by the eyewear.

Figure 57:
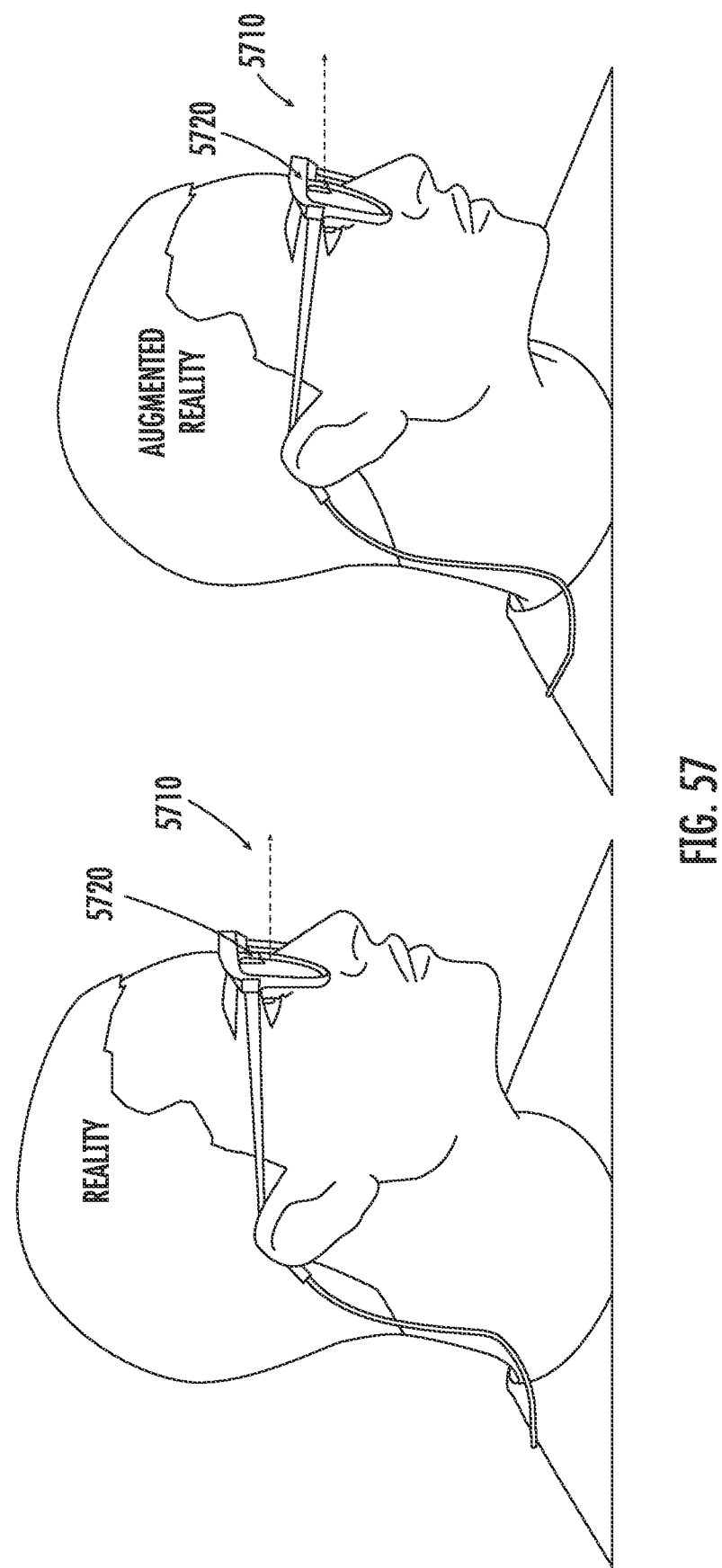
FIG. 57 depicts schematic diagrams of one possible embodiment of the apparatus.

In certain embodiments, the bottom edge of the optical window is located at or above the top edge of the pupil of the eye of the wearer. In other embodiments, the bottom edge of the optical window is located to cover the bottom edge of the pupil. When the bottom edge of the optical window is located at or above the top edge of the pupil of the eye of the wearer, the wearer can experience unencumbered vision with normal gaze when looking straight ahead. When the bottom edge of the optical window is located at or above the top edge of the pupil of the eye of the wearer, the line of sight of the wearer is unencumbered by the optical combiner. In such an embodiment, when the wearer desires to see an augmented or mixed reality image, the wearer tilts his or her chin down between 5 and 45 degrees while keeping his or her eyes looking straight ahead in a horizontal manner relative to the ground on which they are standing. (See, e.g., FIG. 57.) In FIG. 57, the wearer's line of sight 5710 is shown by the dotted line and the optical combiner is shown by 5720. As shown in the figure, when the wearer is looking straight ahead, the optical combiner 5720 is above his pupil(s) and out of the line of sight 5710. When he tilts his chin down and looks ahead, his line of sight passes through the optical combiner 5720.

In still other embodiments the optical window can cover the pupil of the wearer when the wearer is looking straight ahead. In these embodiments the optical window is larger than in the embodiments where the wearer must tilt his or her chin down to see through the optical combiner. When the optical window covers the pupil of the wearer when the wearer is looking straight ahead, the optical window can be one of: the same size as that of the eyewear frame lens outer dimensions, smaller than the eyewear frame lens outer dimensions, or larger than the eyewear frame lens outer dimensions.

Both the optical window(s) and the eyeglass lens(s) may be coated with an antireflection coating. In certain embodiments an index matching or index averaging oil can be applied between the front of the eyeglass lens and the back of the optical window to enhance light transmission between the eyeglass lens and the optical window.

Figure 19:
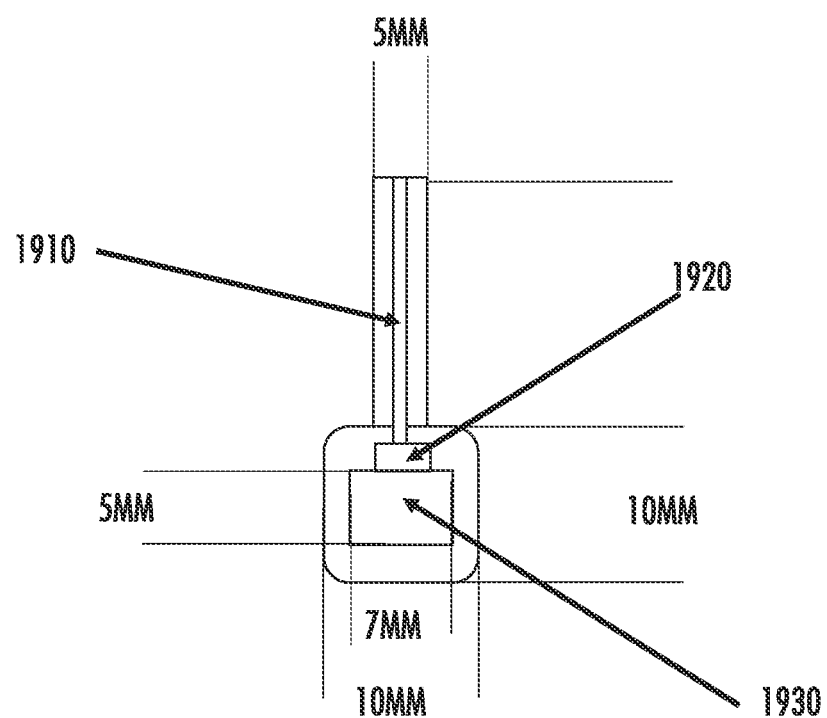
FIG. 19 is a schematic diagram of a depiction of one possible embodiment of the apparatus.
Figure 20:
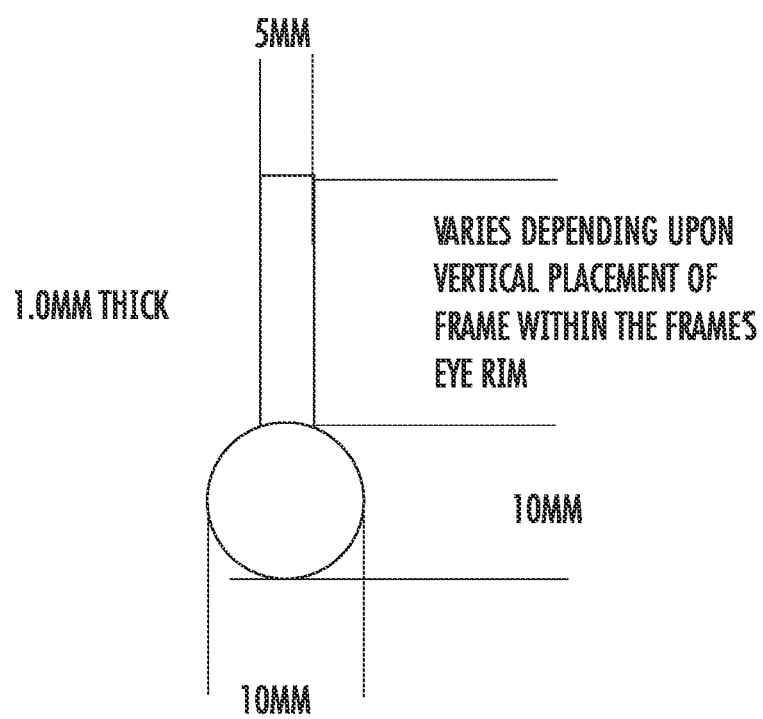
FIG. 20 is a schematic diagram of a depiction of one possible embodiment of the apparatus.
Figure 21:
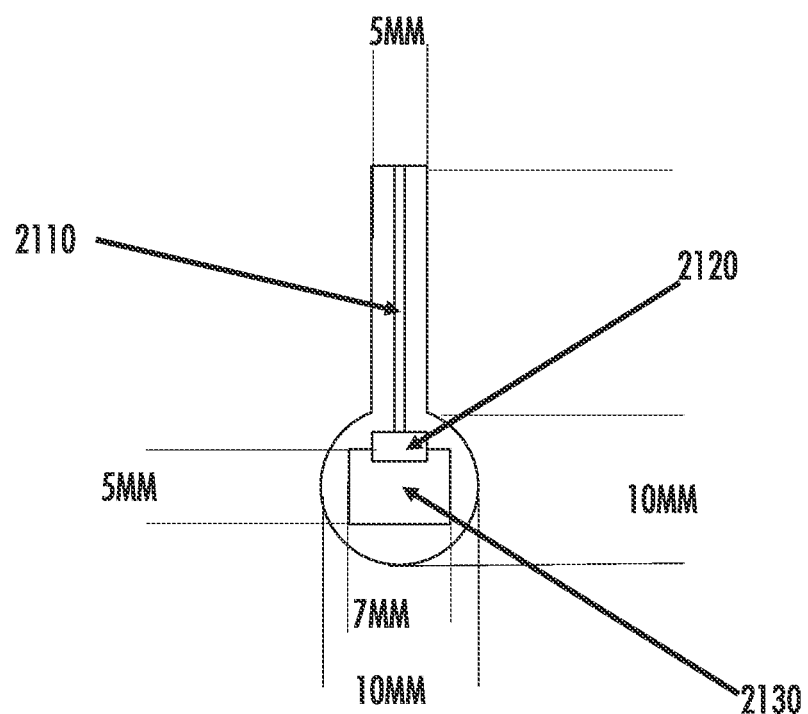
FIG. 21 is a schematic diagram of a depiction of one possible embodiment of the apparatus.
Figure 23:
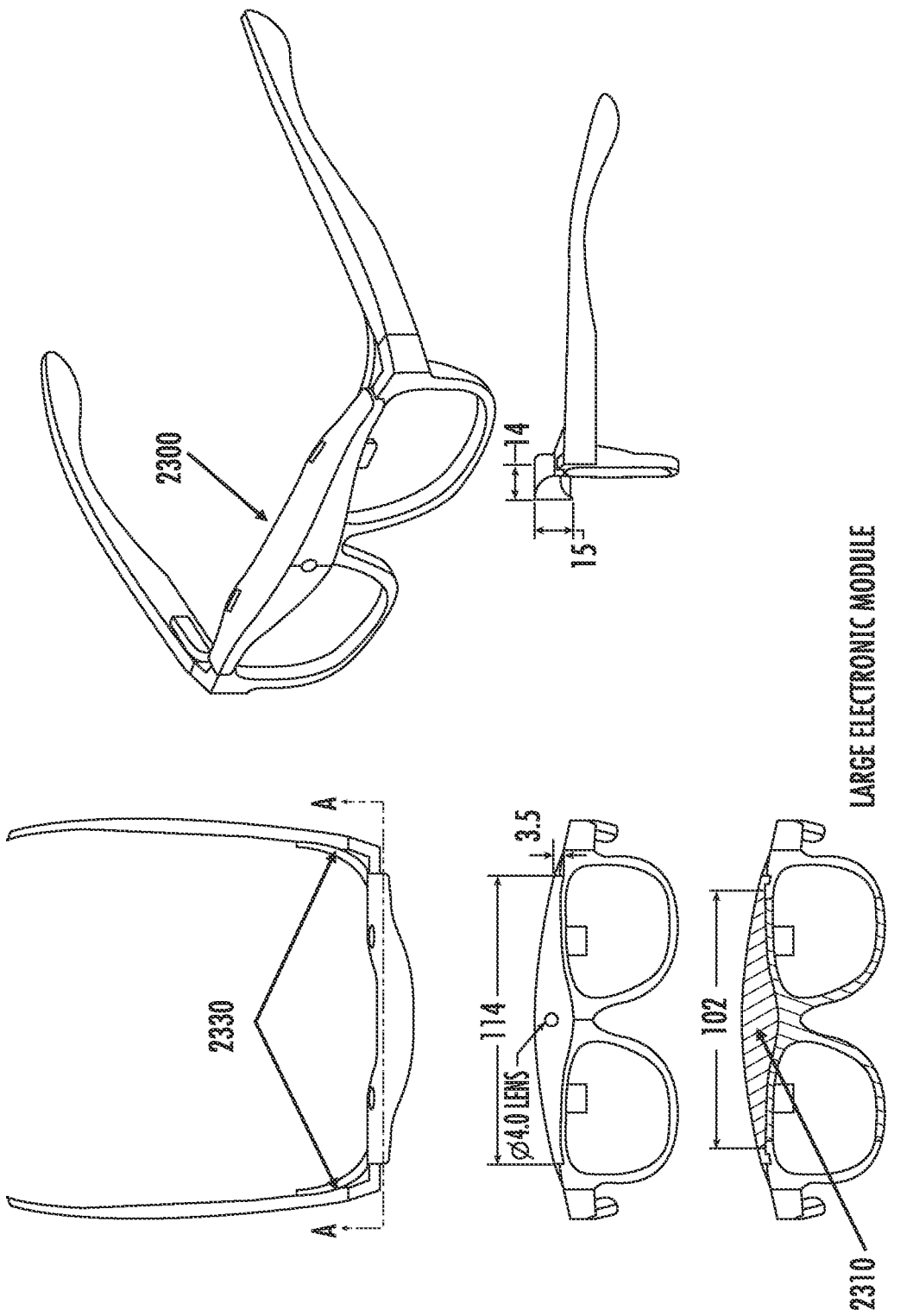
FIG. 23 is a schematic diagram of a depiction of one possible embodiment of the apparatus.

An optical window can support a reflector or partial reflector. The reflector may provide optical power. A reflector having optical power can alter the focal length of the image, correct an optical aberration, magnify an image, minify an image, alter the focus of an image. The reflector can be free of optical power. An optical window can have a reflector embedded within the optical window. An optical window can have a reflector attached to its surface. The reflector can be sized to be only a portion of the optical window. The reflector can be the full size of the optical window. The reflector can be a partially transmissive mirror. A reflector can be a mirror. A reflector can be a mirror with aspheric power. A reflector can be a spherical powered mirror. The reflector can be a pin mirror. An optical window can comprise a fiber optic light bundle on the side closest to the eye. Alternatively, an optical window can comprise a fiber optic light bundle on the side away from the eye. An optical window can support a fiber optic light bundle and/or a waveguide array. An optical window can support, include, and/or comprise a waveguide array. An optical window can support, include, and/or comprise a lightguide. An optical window may be a waveguide array. An optical window may be a lightguide. An optical window can support, include, be, and/or act as a display. The display can be, by way of example only, a see-through OLED display. An optical window can support, include, be, incorporate, and/or act as a lightpipe 1910, 2110, as well as an image expander, diffractive optic(s), and/or mirror(s) 1920, 2120. (See, e.g., FIGS. 19, 21.)

An optical window can support and/or include that of a partially transparent or see-through OLED. An optical window can be, support, and/or include that of a display; the display can be, by way of example only, one of: a LCD, micro OLED or micro LED (µLEDs), LED display, OLED display, OLED see-through display, DLPs, LCOS or back lit display. An optical window can comprise an optical combiner which creates an eye box 1930, 2130. An optical window can be, support, and/or include one or more of waveguide(s), waveguide array, lightguide(s), mirror(s), lens(es), optic(s), grating(s), optical fiber(s), lightpipe(s), reflective element(s), beam splitter(s), Pupil Relay(s), segmented reflector(s), Fresnel or diffractive facet(s), microlens array, optical combiner(s), combiner(s), coating(s), and/or diffractive element(s)

An optical window can have steps on its surface. These steps can be in the upper 50% of the height of the optical window for accepting a rotating mechanical member providing upward and downward movement of the optical window. An optical window can be adjustable from one position to another, by way of example only, an optical window can be moved in one or more of the following directions: horizontally, vertically, clockwise, counter clockwise, rotated such that its bottom edge is moved further away from the front surface of an eyeglass lens or moved closer to the front surface of an eyeglass lens.

A portion of the upper 50% of the vertical height of the optical window can be opaque with the remaining up to 50% being transparent. The optical window can darken when in sunlight. An optical window can be darkened and/or lightened in light transmission. Such techniques for darkening and lighting the optical window are well known in the art. By way of example only, an optical window can be photochromatic, thermochromic, electrochromic, mirror coated, clear, darkened by dichroic liquid crystal, and/or tinted.

In certain embodiments, the AR Unit can have two optical windows and each optical window can be, include, and/or support an optical combiner. Each optical window can support one fiber optic bundle. Each optical window can support a fiber optic bundle and an optical combiner. The fiber optical bundle can be superior to that of the optical combiner.

In certain embodiments, the optical window be, include, and/or support a transparent OLED. The optical combiner can be, include, and/or support a see-through OLED. A transparent OLED or TOLED can be that of a see-through OLED. In certain embodiments the optical window can be, include, and/or or support a see-through OLED comprising a microlens array. In certain embodiments the optical window can be, include, and/or support a microlens array attached to a see-through OLED. The see-through OLED and/or microlens array can be curved in a similar manner as the front surface of the eyeglass lens to which it is in front of. Such a curve can be similar to the base curve of such eyeglass lens. When the AR Unit utilizes a see-through OLED for its optical combiner, the AR Unit's main body can be reduced in size and weight. This is due to the fact that the AR Unit's light engine and the optical engine can be reduced in number of components and size. In addition, the energy use can in most cases be reduced as well. In certain embodiments, each optical window can support a waveguide and see-through OLED. In certain embodiments, each optical window can support a lightguide and see-through OLED. In certain embodiments, each optical window can support a fiber optic bundle and see-through OLED. In certain embodiments, an optical window can support a see-through OLED. In certain embodiments, the see-through OLED is an optical combiner. In certain embodiments, an OLED is a light source for the light engine. In certain embodiments, the see-through OLED is a portion of the optical engine. In certain embodiments, the see-through OLED is the optical engine. In certain embodiments, the see-through OLED is the light source for the light engine and is also a portion of the optical engine. In certain embodiments, the see-through OLED is the light source for the light engine and is also the optical engine.

The AR Unit can support two optical combiners, one for each eye. The AR Unit can support one optical combiner. The optical combiner can be lined up relative to a pupil of the wearer.

An edge of the optical combiner can be at the peripheral edge of the virtual augmented reality bubble defined by the field of view that is created by the unit's optical combiner within a real image and can be feathered (or smoothed out) by way of a refractive index gradient formed within the material of the optical combiner effectively reducing the brightness of the augmented reality bubble at its periphery. By way of example only, if the section of the optical combiner has an index of refraction of 1.8, refractive index would transition from 1.8 at the center of the optical combiner to a refractive index of 1.5 at the outer edge of the section of the optical combiner. This change in refractive index may be applied over a length of 0.5 mm to 3.0 mm, preferably 0.5 mm to 1.0 mm. A short refractive index gradient serves to reduce the intensity of the edge without affecting the brightness of the overall virtual image. Such an index gradient can be fabricated by any means known in the art for creating such an index gradient, including by way of example only, deposition of an additional layer of a second material. Such a second layer may be of thickness 5 microns to 500 microns, preferably 25 microns to 100 microns.

When the AR Unit main body is flexed or bent to conform to the top of the eyewear frame front, this may cause the optical windows and other visual, light, and optical components to rotate out of alignment with respect to the optic axis of the eye. The optical windows, for example, could become rotated and not straight up and down vertically upon conforming the AR Unit main body or outer covering to properly fit or look best upon the top of the eyewear frame front. Should this occur, in certain embodiments, either the optical window or the connection to the optical windows can be rotated in the appropriate direction to allow for the optical windows to become realigned vertically. This adjustment requires a rotatable fixture that can rotate along one axis, two axes or three axes. Also, each optical window can be adjustable by way of rotating clockwise or counter clockwise.

In certain embodiments, the vertical height of the optical combiner of the optical window can be adjustable by way of edging the waveguide optical combiner of the optical window to the desired vertical height for a given frame eye size and style relative to the wearer's pupil. In certain embodiments the vertical height of the optical combiner is manufactured to be of the appropriate height. The displayed augmented reality image can be programmed to be displayed in relation to the usable optical combiner dimensions (vertical and horizontal) that control the field of view. In preferred embodiments, the bottom edge of the optical combiner is set above the top edge of the pupil at primary gaze. The optical window or optical combiner may also be angled such that the bottom of the optical window or optical combiner can be rotated forward and then up and over, as shown at 2230 in FIG. 22. In certain embodiments, the bottom edge of the optical window or optical combiner (when fit above the top edge of the pupil of the eye of the wearer) can be rotated away from the front of the eyewear lens. By doing this, it offsets certain of the angle of the head tilt when the wearer's chin is tilted down and the eyes continue to look forward and straight ahead to experience augmented reality. By offsetting certain of the angle of the head tilt and having the bottom edge of the optical window or optical combiner rotated away from the front of the eyewear lens, the line of sight of the wearer strikes the optical combiner in a mostly perpendicular manner. (See, e.g., FIG. 55.) In certain cases, this is preferred and in other cases the bottom edge of the optical combiner is not rotated away from the eyeglass lens to which it sits in front of.

As shown in FIG. 22, optical window(s) can be rotated counterclockwise 2210 and/or clockwise 2220 while supported by the AR Unit. When one optical window is used, an optical window can rotate so that the bottom of the optical window located nearest the pupil of the eye is rotated temporally. When two optical windows are used (one in front of each eye, for example), each optical window can rotate so that the bottom of the optical window located nearest the pupil of the eye is rotated temporally. Also, when two optical windows are used (one in front of each eye, for example), each optical window can rotate so that the bottom of the optical window located nearest the pupil of the eye is rotated nasally. An optical window can be moved horizontally and/or vertically while supported by the AR Unit. The optical window can be rotated along the Z axis when not in use such that the bottom of the optical window is rotated out and up and back.

An optical window(s) can be moved nasally and/or temporally while supported by the AR Unit. When the optical window is moved horizontally, it generally is moved to align the wearer's pupillary distance. The pupillary distance is the distance between the wearer's pupils when looking at a particular distance (which is usually far, intermediate and near) measured under a standard level of illumination. An optical window can be moved vertically and/or horizontally when supported by the AR Unit. An optical window can be moved automatically or semi-automatically by the AR Unit. An optical window can be moved mechanically or manually by the wearer of the AR Unit. The optical window or optical windows can be moved out of the field of view of the wearer when the AR Unit is not being used thus allow for the wearer to have unencumbered vision when looking straight ahead or otherwise. In certain embodiments, the optical window can be magnetically detached from the AR Unit and magnetically reattached to the AR Unit such that the proper optical alignment is maintained. The mechanism for effecting the movement of the optical window may comprise using a sensor, a controller, and/or a motor. The motor can be a micro motor. The motor can be mems device. The AR Unit can support one or multiple prisms. The AR Unit can support one or multiple reflectors. The AR Unit can support one or multiple illumination sources. The AR Unit can support one or multiple optical engines. The AR Unit can support one or multiple light engines.

The AR Unit can comprise one or more of the following: waveguide(s), waveguide array(s), lightguide(s), mirror(s), lens(es), optic(s), collimator(s), microlens array(s), optical coupler(s), grating(s), optical fiber(s), lightpipe(s), reflective element(s), beam splitter(s), Pupil Relay(s), segmented reflector(s), Fresnel or diffractive facet(s), optical combiner(s), combiner(s), coating(s), diffractive element(s), optical window(s), and/or optical substrate(s).

The AR Unit can comprise one or more of the following: electronic displays, such as LCD, micro OLED or micro LED (mLEDs), LED display, OLED display, OLED see-through display, TOLED, DLPs, LCOS, as well as scanning display types such as a vibrating fiber, laser scanning display, laser-based projector, a lenticular (based on micro-lens arrays), focusing lens, spatial modulator, collimator, and/or optical coupler, projector, and/or direct laser scanning into or onto the retina. One, two, or more white LEDs can be utilized within a light engine.

In certain embodiments, the focal length of a projector or display used within a light engine of the AR Unit can be altered by moving the focusing lens closer to the projector or further away. The movement can be by way of MEMs system and/or a micro motor. The movement can be automatically, semi-automatically, or manually controlled. In certain embodiments, the illumination source illuminates the micro display, light from which is collected, focused and transmitted into a fiber optic delivery system or a waveguide. The micro-display forms the virtual image to be projected at a desired distance from the eye of the wearer. The fiber optic, waveguide, or lightguide delivery system can carry the AR image information to the combiner which is then directed to the pupil. In certain embodiments, a fiber optic delivery system may comprise a plurality of optical fibers that end in a second optical coupling device which may comprise a prism and/or a combination of, by way of example only, a lens and a prism, or a stack of partially transmissive thin layer films. The waveguide or lightguide delivery system may end in a second optical coupling device which may comprise a prism and/or a combination of, by way of example only, a lens and a prism, or a stack of partially transmissive thin layer films. The optical coupling can include an optical grating. In certain embodiments, a single projector with a beamsplitter can illuminate two optical windows.

In certain embodiments, the optical combiner combines light emanating from the projector carrying an AR image information with light coming from real objects that the wearer is looking at and thereby enables the AR virtual image to be located at a distance, by way of example only, from 40 centimeters to 6 meters in the real environment. The AR Unit can be designed to combine and align the wearer's convergence and accommodation for that of a virtual image seen by the wearer with that of a real image seen by the wearer.

Figure 53:
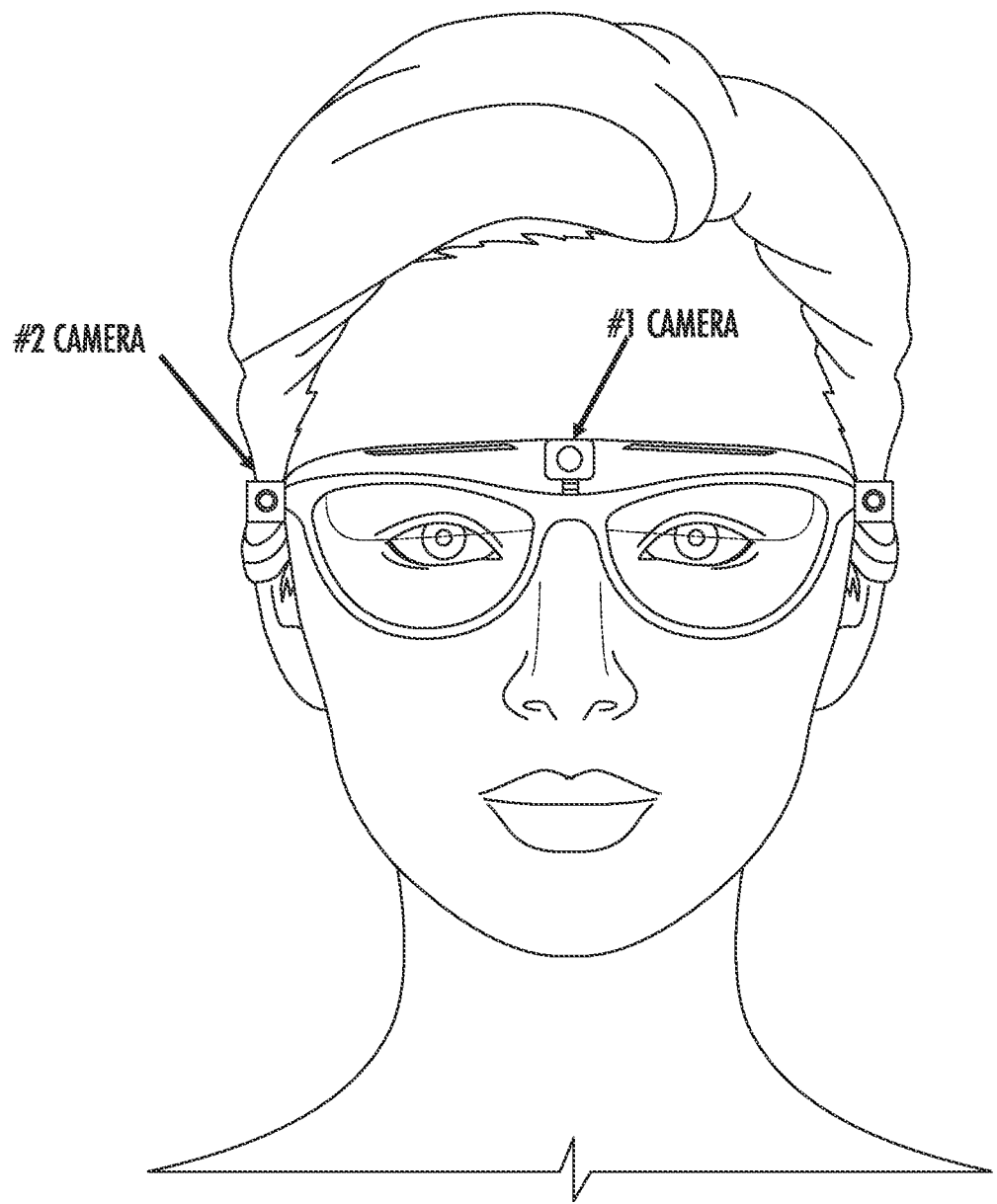
FIG. 53 is a schematic diagram of a depiction of one possible embodiment of the apparatus.
Figure 54:
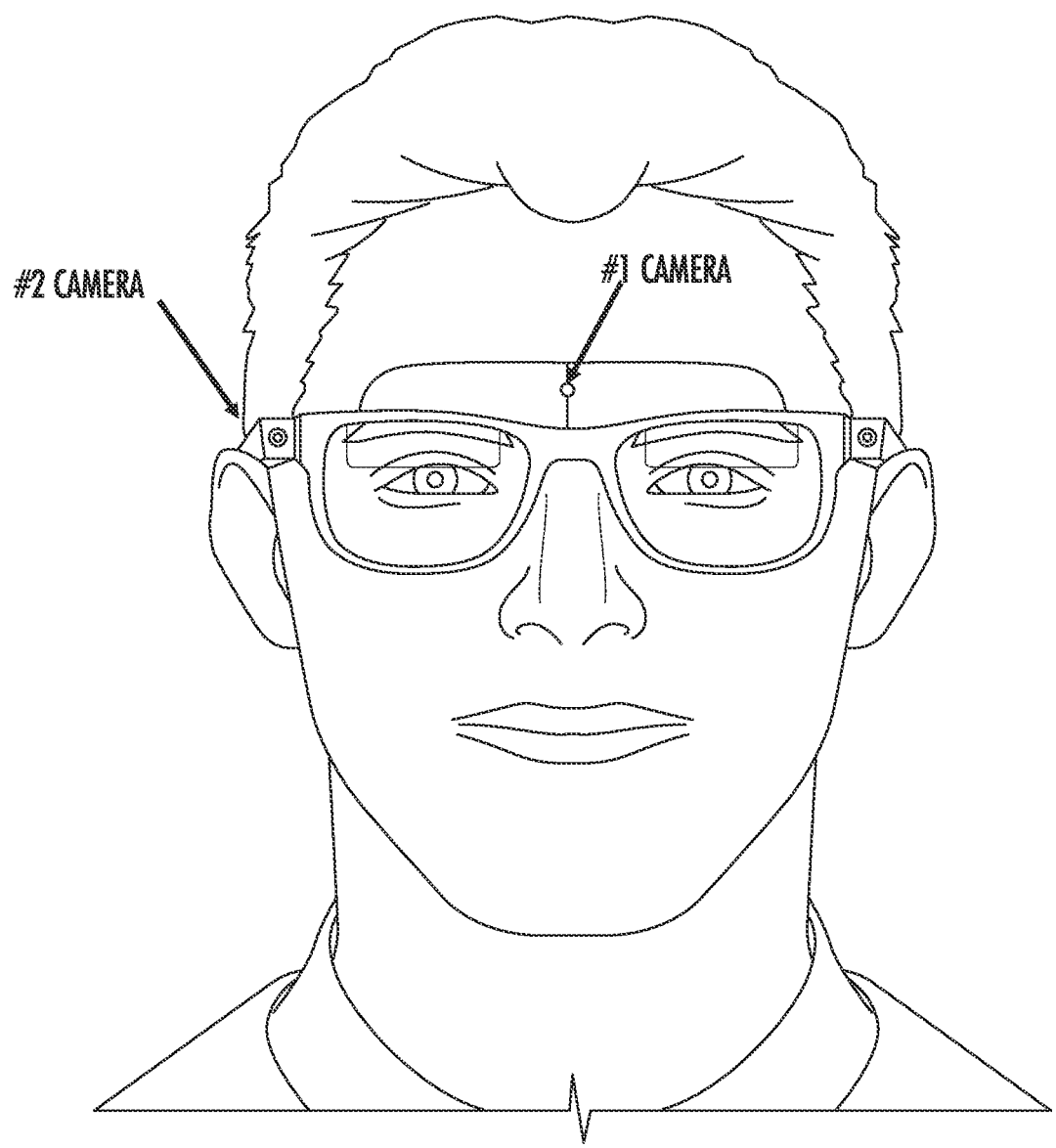
FIG. 54 is a schematic diagram of a depiction of one possible embodiment of the apparatus.

The AR Unit can support one or multiple cameras. In certain cases, when multiple cameras are utilized, they can be spaced to provide for an increased 3D effect. In other cases, when multiple cameras are utilized, they can be utilized for spatial location. When multiple cameras are used they can be distance separated from one another. When multiple cameras are utilized, one can be located at or near the horizontal center of AR Unit's main body and the other attached to a temple of the eyewear or located on or near one of the horizontal ends of the AR Unit's main body. (See, e.g., FIGS. 53-54.) When one camera is utilized the camera can be located at approximately the horizontal center of the AR Unit main body. One or more of the cameras can be capable of capturing one or both of a still image and video.

The AR Unit may comprise a power source, including an energy harvesting power source. In certain embodiments, the AR Unit can be attached to and detached from a solar power or other power unit. In certain aspects, the AR Unit may connect to a visor or other structure, whereby the visor harvests solar energy. Such a visor or other structure can comprise a plurality of solar cells.

Figure 28:
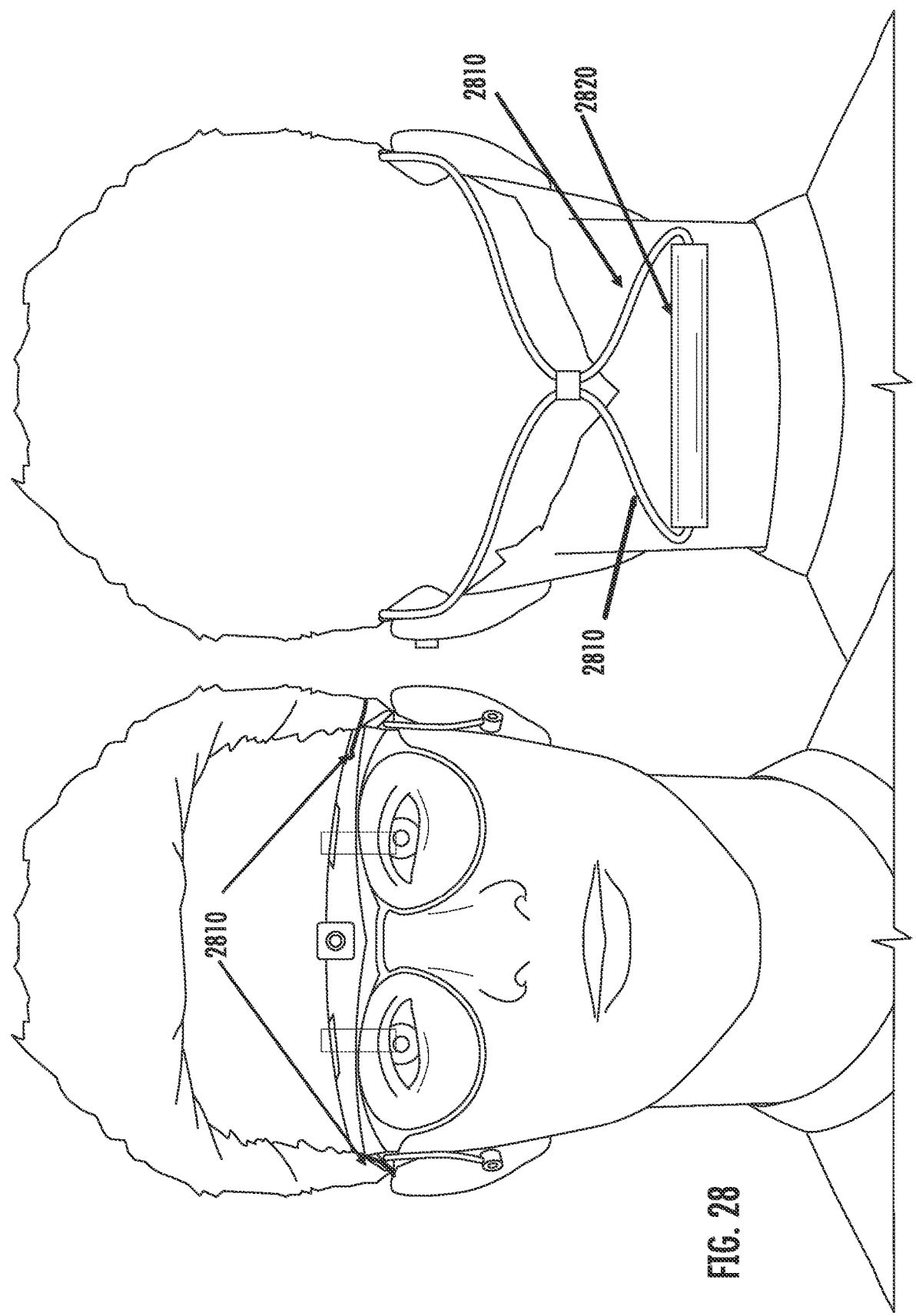
FIG. 28 is a schematic diagram of a depiction of one possible embodiment of the apparatus.
Figure 29:
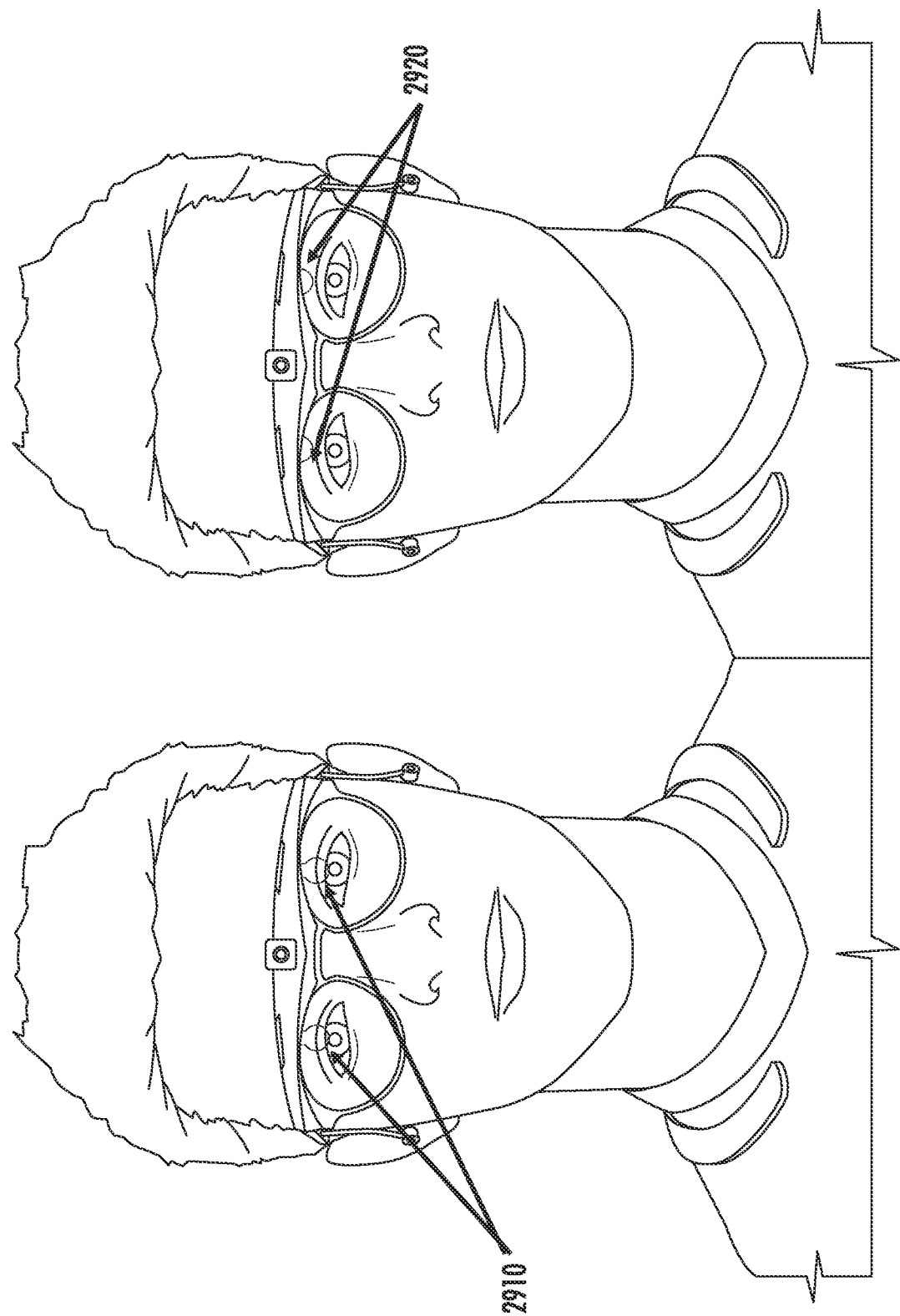
FIG. 29 is a schematic diagram of a depiction of one possible embodiment of the apparatus.
Figure 30:
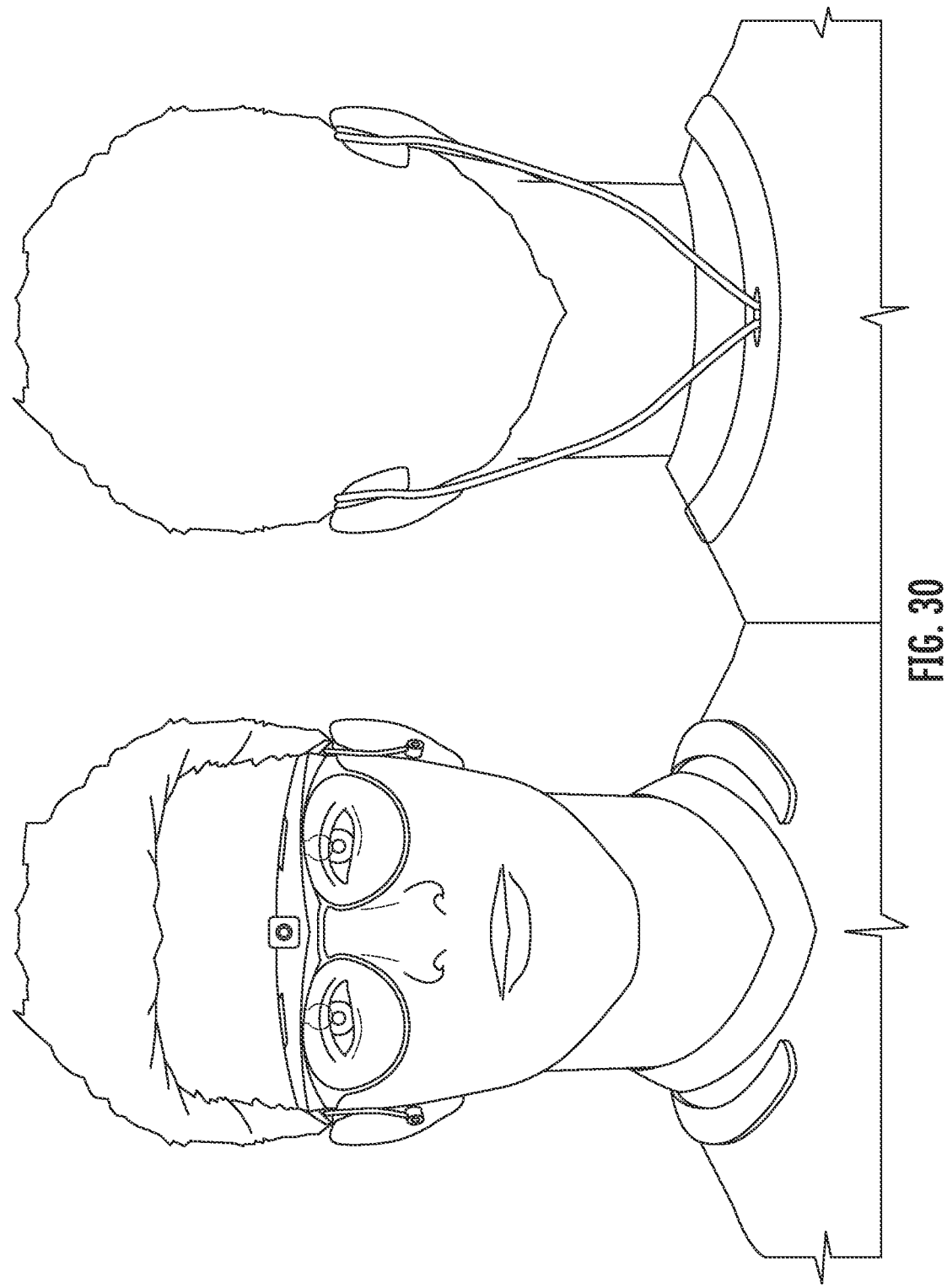
FIG. 30 is a schematic diagram of a depiction of one possible embodiment of the apparatus.
Figure 31:
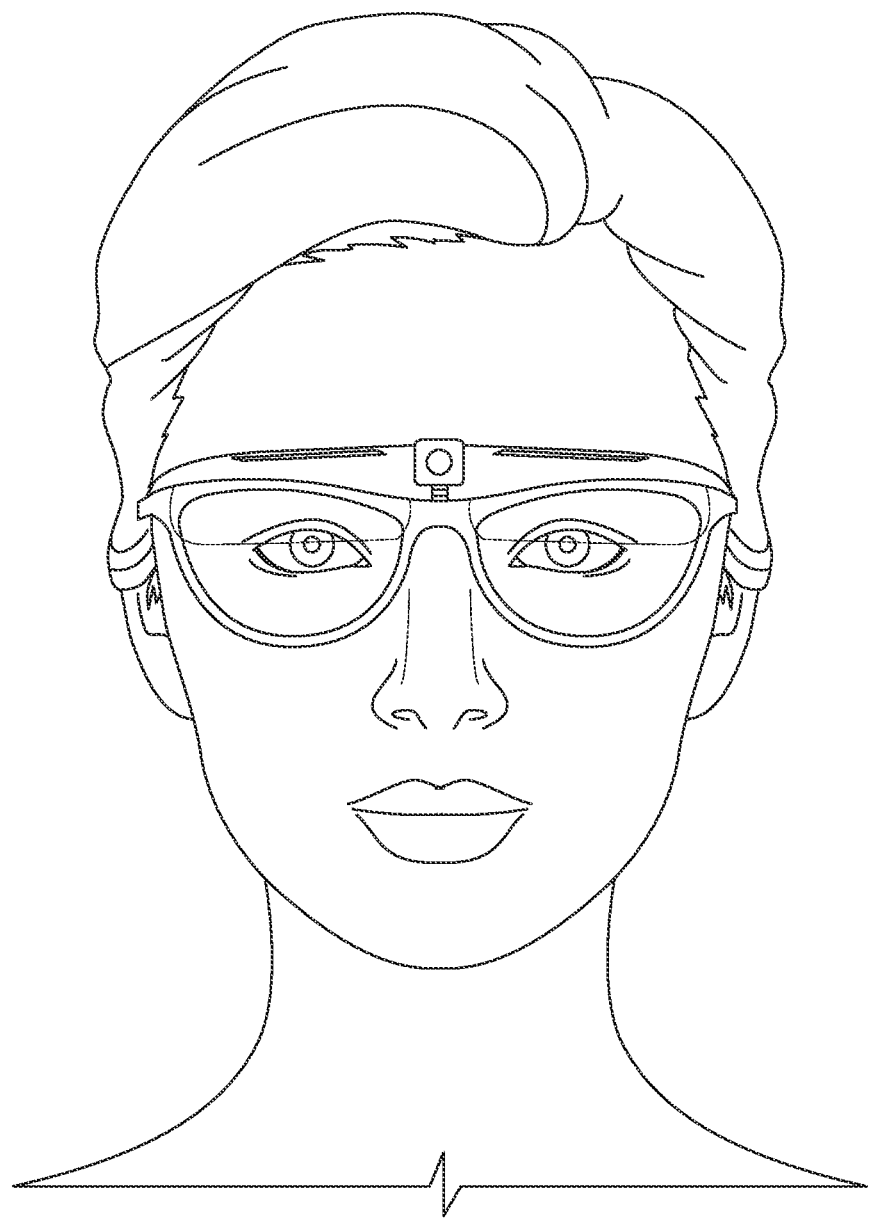
FIG. 31 is a schematic diagram of a depiction of one possible embodiment of the apparatus.

In certain embodiments, the AR Unit comprises an electrical tether that fits around the head, behind, the head, behind the neck, or around the neck, of a wearer. (See, e.g., FIGS. 28-30.) The electronic tether can have two strands 2810; one that comes from the right side of the AR Unit and one that comes from the left side of the AR Unit. The electronic tether can be electrically connecting to the AR Main Unit body. The electronic tether can comprise one or more electronic modules. Electronic components can be attached to or included in all or a portion of the tether or the modules. By way of example only, the electrical tether may be attached to a battery 2820. The battery can be a rechargeable battery. The battery can be recharged by a wired connection or by wireless power.

The electronic tether and electrically connected electronics module can house, support, or be connected to one or more of the following electronic components, by way of example only: memory storage, flash memory, random access memory, EEPROMs, an electrical power unit, such as a battery or rechargeable battery, earbud, assisted hearing device, wife chip, Bluetooth chip, vibrator, communication system, antenna, audio system, GPS, sensor, ASIC, CPU, controller, switch, transceiver, transmitter, receiver, and/or an auditory system. The electronic components can be housed within a module that is connected or supported by the electrical tether. The module can be sweat resistant and water resistant. The module can be sweat proof and water proof.

The AR Unit can comprise an auditory system. The auditory system can utilize ear buds. The ear buds can be connected by a wired connection to the AR Unit. When wired to the AR Unit, the ear buds connect in most but not all cases to the electronic tether. The ear buds can be wirelessly connected to the AR Unit. The auditory system can utilize bone conduction for audio transmission. A personal assistant can be part of the auditory system.

The AR Unit can connect to and disconnect from, wirelessly or by a wire, one of, by way of example only, a smart phone, computer device, tablet, laptop, or computer processing unit.

The AR Unit, when attached to an eyewear frame being worn by a wearer, can be capable of being positioned above the head of a wearer. In aspects, the AR Unit can be positioned on top of an eyewear frame front when in use and worn above or below the head of the wearer when not in use or when detached from the eyewear frame. In certain embodiments, the AR Unit main body provides for a recess on its bottom side that accepts the top of an eyewear frame front. In certain embodiments, a pin or pins can connect the AR Unit main body to a compressible material. The compressible material can be attachable or attached to the AR unit main body. The compressible material can be available in multiple sizes, compression factor, and a variety of colors. The compressible material can be one of, by way of example, sponge, sponge-like, foam, or foam-like. In certain embodiments, the compressible material can be utilized when there is an open space between the top of the eyewear frame front and the bottom of the AR Unit. When a compressible material is used to fill such an open space, the compressible material attaches to the bottom of the AR Unit's main body and the top of the eyewear frame front. In certain embodiments, a façade is utilized to fit under the bottom of the AR Unit's main body and above the top of the eyewear frame front above the eyewear bridge. The façade fills in an opening above the bride of the eyewear frame and beneath the bottom of the AR Unit's main body. Such a façade can be held in place either by, by way of example only, one or more of a pressure fit, mechanical attachment, or structural attachment.

In certain embodiments, the AR Unit's main body includes a horizontal slit aperture in which an optical window is attached to, transcends through, and/or descends from. In other embodiments, the optical window(s) do not include or need horizontal slit(s). The AR Unit can have two horizontal slit apertures to which two optical windows transcend. The horizontal slit aperture, in aspects, can be longer horizontally than that of the width of the top of an optical window. This permits the optical window to be adjusted horizontally to align the optical combiner with the pupillary distance of the wearer's eyes. When the optical window is located in front of the eyewear frame, the horizontal slit(s) can be located in the portion of the AR Unit's main body that overhangs in front of the eyewear frame (further from the head of the wearer). When the optical window is located behind the eyewear frame, the horizontal slit(s) can be located in the portion of the AR Unit's main body that extends behind the frame closest to the head of the wearer. And when the optical window is located in the lens of the eyeglass frame, the slits can be located above the eyewear frame.

In certain embodiments, the AR Unit can, by way of example only, use or comprise (one or more of): edge computing, cloud computing, artificial intelligence, image intelligence, facial recognition, GPS, a range finder, laser, sensor, UV Sensor, InfraRed Sensor, electro mechanical sensor, mechanical sensor, pressure sensor, temperature sensor, accelerometer, magnetometer, gyroscope, communication system, pedometer, audio system, ear bud, bone conduction system, image processor, image capture device, camera, 3D image capture system, BlueTooth chip, Wifi chip, BlueBooth system, wifi system, solar cell, power source, energy harvesting, rechargeable battery, eye tracking system, gas sensor, air quality sensor, vibrator, buzzer, speaker, microphone, activity tracker, radiation sensor, clock, voice recognition system, intelligent personal assistant system, intelligent virtual assistant system, projector, micro display, back lit display, optical window, optical combiner, eye tracking system, geo location system, and/or OLED display.

In certain embodiments, the AR Unit can also include or support, by way of example only: IR camera, still camera, video camera, image sensor, repeater, resonator, optical sensor, electrooptical sensor, geo location sensor, body sensor, fall detection sensor, motion sensor, alertness sensor, physiology sensor, health sensor, fitness sensor, mood sensor, acoustic sensor, CO sensor, CO detector, $CO_2$ sensor, $CO_2$ detector, air particulate sensor, UV sensor, IR sensor, IR meter, thermal sensor, moisture sensor, sweat sensor, air sensor, radiation sensor, breath sensor, pupil sensor, eye movement sensor, thermal meter, hearing aid, sound amplifier, directional microphone, spectrometer, directional microphone, microphone, camera system, infrared vision system, night vision aid, night light, wireless cell phone, mobile phone, wireless communication system, projector, holographic device, holographic system, radio, data storage, memory storage, power source, speaker, fall detector, alertness monitor, pulse detection, gamming, pupil monitoring, alarm, poor air monitor, bad breath sensor, bad breath monitor, alcohol sensor, alcohol monitor, motion sensor, tilt sensor, motion monitor, thermometer, smoke sensor, smoke detector, pill reminder, audio playback device, audio recorder, speaker, acoustic amplification device, acoustic canceling device, hearing aid, video playback device, video recorder device, image sensor, alertness monitor, health monitor, fitness monitor, air particulate meter, physiology monitor, mood monitor, stress monitor, pedometer, motion detector, geo-location, pulse detection, wireless communication device, gaming device, eye tracking device, pupil monitor, automated reminder, light meter, UV meter, IR meter, cell phone device, mobile communication device, poor air quality alert device, sleep detector, doziness detector, refractive error measurement device, wave front measurement device, aberrometer, magnetometer, smoke detector, speaker, cell, kinetic energy source, microphone, projector, virtual keyboard, face recognition device, voice recognition device, radioactive detector, radiation detector, radon detector, moisture detector, humidity detector, atmospheric pressure indicator, loudness indicator, noise monitor, audio bone conduction, acoustic sensor, range finder, laser system, topography sensor, motor, micro motor, nano motor, switch, audio bone conduction transmitter, virtual personal assistant, by way of example only, Amazon Alexa or Apple Siri, artificial intelligence, image enhancement, image enhancement algorithms, facial recognition, and/or facial recognition algorithm.

The AR Unit may comprise an optical coupler, which can be used to couple one of a lightpipe, optical fiber, or micro-display to that of the optical window. An optical coupler can be used to couple a micro-display to one of an optical window, lightpipe, or optical fiber. An optical coupler can be used to couple a lightpipe or an optical fiber to an optical combiner. An optical coupler can be used to optically couple a waveguide to a light engine or light source. An optical coupler can be used to optically couple a lightguide to a light engine or light source. In certain embodiments, as used herein, lightpipe, waveguide, and lightguide refer to an underlying mechanism to perform the same or substantially the same function; namely, to transmit or otherwise transport light from a display to the eye of a wearer of the apparatus (e.g., in certain embodiments to transmit light from the light engine to the eye of the wearer by way of the light engine).

In certain embodiments, the bottom of the optical combiner can be angled away from the eye. In aspects, the bottom of the combiner can be angled away from the eye such that the line of sight of the user is perpendicular to the combiner when his or her chin is tilted down and when looking straight ahead. By way of example only (see e.g., FIG. 55) the optical window/optical combiner 5510 can be tilted with its bottom away from the eyeglass lens so that the line of sight of the wearer with head tilted and looking straight ahead is looking perpendicular thru the optical combiner. In other embodiments, the bottom edge of the optical combiner is not tilted away from the front of the eyeglass lens.

In certain embodiments, the AR Unit can include an eye tracking system. Such systems are known in the art. The image generated by the light engine(s) and or optical engine(s) can be controlled to move in concert with that of the eye(s) of the wearer, as located by the eye tracking system.

Figure 38:
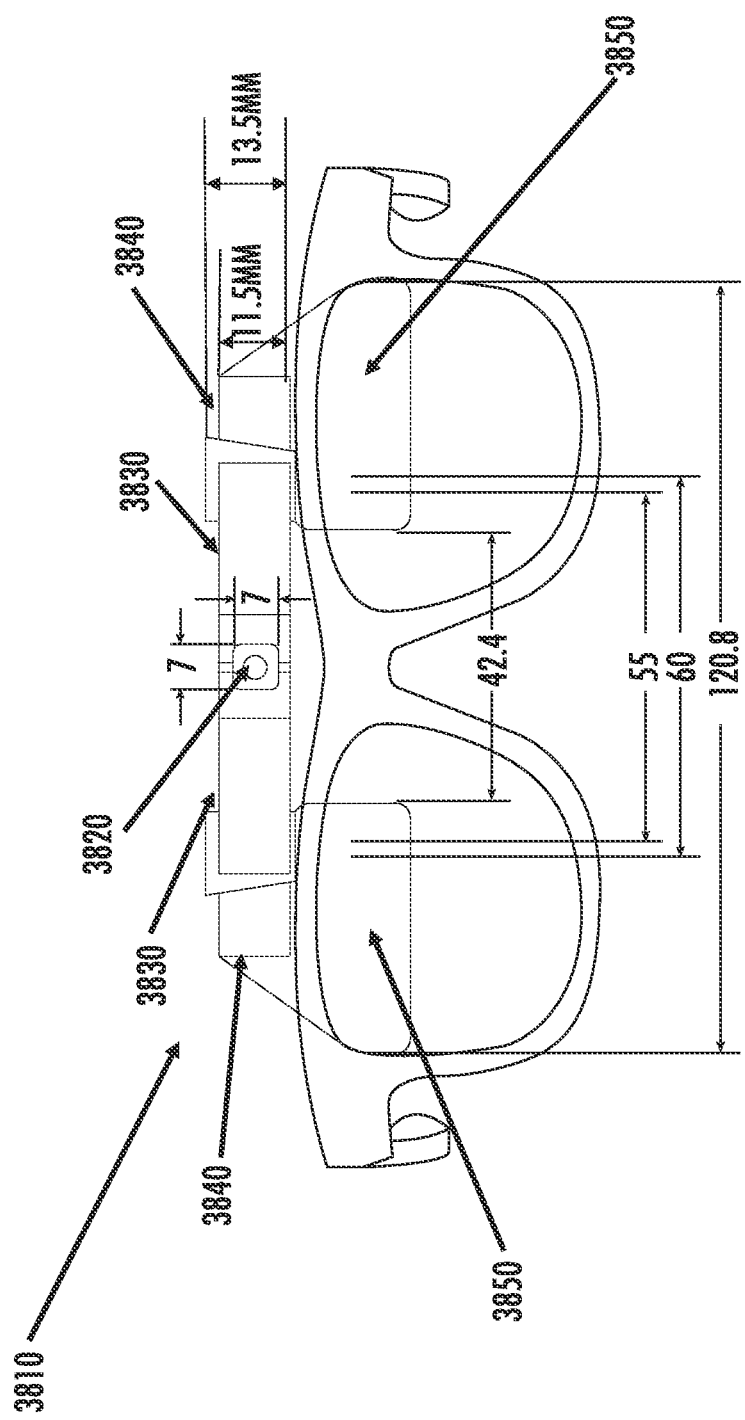
FIG. 38 is a schematic diagram of a depiction of one possible embodiment of the apparatus.
Figure 39:
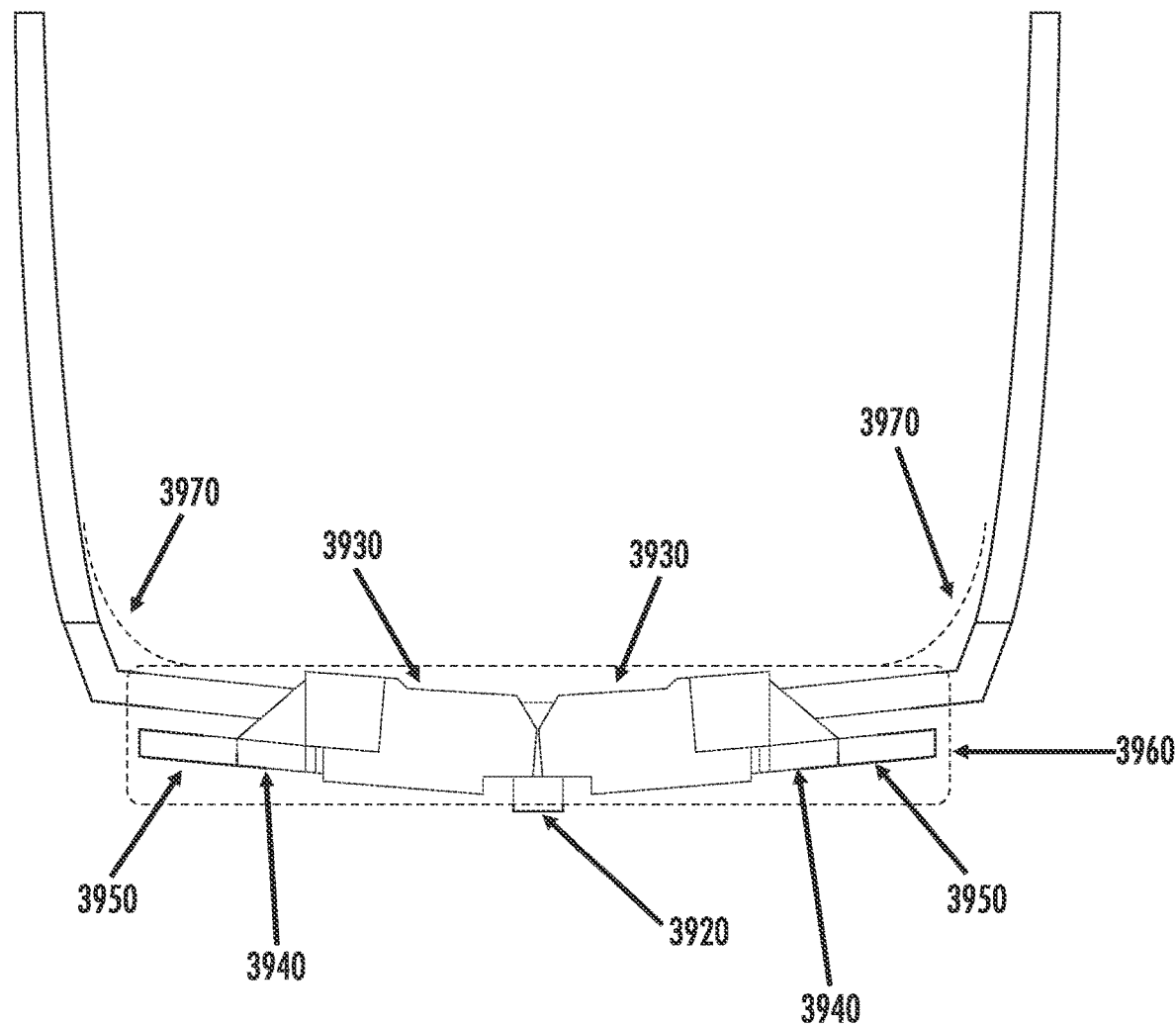
FIG. 39 is a schematic diagram of a depiction of one possible embodiment of the apparatus.

In certain embodiments, such as those in FIGS. 38-39, the AR Unit comprises one or more of eight parts: 1) The main body of the AR Unit 3960, which is located above the top of an eyewear frame, 2) certain optical engine components 3840, 3850, 3940, 3950 that provide and cause the virtual image to be merged with a real image, 3) certain light engine components 3830, 3930 that generates the virtual image, 4) a connector means (not shown) that supports and connects the AR Unit to the eyewear frame, 5) an electronic tether 3970 that connects the main AR unit to that of an electronic module worn on about the head or mostly behind the neck of the wearer, 6) an electronic module, which is part of the electronic tether located behind the head or neck of a wearer, and which comprises multiple electronic components as well as the major battery/power supply for the AR unit, 7) electronic components (not shown but certain of which are listed herein) that are located within the AR Unit main body 3960 (these components can be compartmentalized and housed in one or more modules) and/or 8) an image capture system 3820, 3920.

The electronic module of #6 above may also include, by way of example only, one or more of facial recognition, a GPS system, a sensor, a UV Sensor, an electro mechanical sensor, a mechanical sensor, a pressure sensor, a temperature sensor, an accelerometer, a communication system, a pedometer, an audio system, an image processor, a BlueTooth chip, a wifi chip, a BlueBooth system, a wifi system, a solar cell, a gas sensor, an air quality sensor, a vibrator, a buzzer, a speaker, a microphone, an activity tracker, a radiation sensor, a time clock, a voice recognition system, an intelligent personal assistant system, an intelligent virtual assistant system, a geo location system, and/or a GPS system.

The light engine of #3 above may comprise one or more of, by way of example only, a display unit(s) and/or projector(s) 3830, 3930, electronic displays, such as LCD, micro OLED or micro LED (μLEDs), LED display, OLED display, see-through OLED display, TOLED, DLPs, LCOS, as well as scanning display types such as a vibrating fiber, laser scanning display, laser-based projector, a lenticular (based on micro-lens arrays), focusing lens, spatial modulator, collimator, and/or optical coupler, projector, and/or direct laser scanning into or onto the retina, focusing lens(es), collimator(s), microlens array(s), optical coupler(s), diffractive optic(s), spherical lens(es), aspheric lens(es), prism(s), mirror(s), reflector(s), optical combiner(s), focusing optic(s), tunable optic(s), magnifying optic(s), de-magnifying optic(s), and/or optical grating(s), collimator(s), and/or optical coupler(s).

The optical engine of #2 above can comprise one or more of the following: waveguide(s), waveguide array(s), lightguide(s), mirror(s), lens(es), optic(s), collimator(s), microlens array(s), optical coupler(s), grating(s), optical fiber(s), lightpipe(s), reflective element(s), beam splitter(s), Pupil Relay(s), segmented reflector(s), Fresnel or diffractive facet(s), optical combiner(s), combiner(s), coating(s), diffractive element(s), optical window(s), and/or optical substrate(s). The optical engine can also comprise focusing lens(es), optical coupler(s), diffractive optic(s), spherical lens(es), aspheric lens(es), prism(s), mirror(s), reflector(s), optical combiner(s), see-through OLED display, focusing optic(s), tunable optic(s), magnifying optic(s), de-magnifying optic(s), optical grating(s), collimator(s), and/or optical coupler(s).

Certain component(s) of the optical engine can provide pupil multiplication. In most embodiments disclosed herein, one or more of the optical window or optical combiner is that of a top down member. By way of example only, one or more of the waveguide, lightguide, optical window, and/or optical combiner, can be attached to the AR Unit's main body located above the eyewear frame, thus providing for a top down optical combiner or optical window when attached to the AR Unit's main body and located in front of the pupil of the wearer when an augmented reality image is viewed by the wearer. In other embodiments, the optical combiner can be attached to the side and come across from a side of the AR Unit's main body.

The image capture system or #8 above can capture photos and HD videos. The image capture system can be a camera. A courtesy light can be located on the AR Unit to inform an individual whose image is being captured that such an action is occurring. A courtesy light can be located near or adjacent to the image capture system of the AR Unit. However, it should be noted that a courtesy light can be located anywhere on the AR unit such to provide a front facing light. In some cases, a second camera can be attached to the temple and/or to the AR Unit, as shown in, for example, FIGS. 53-54.

Figure 24:
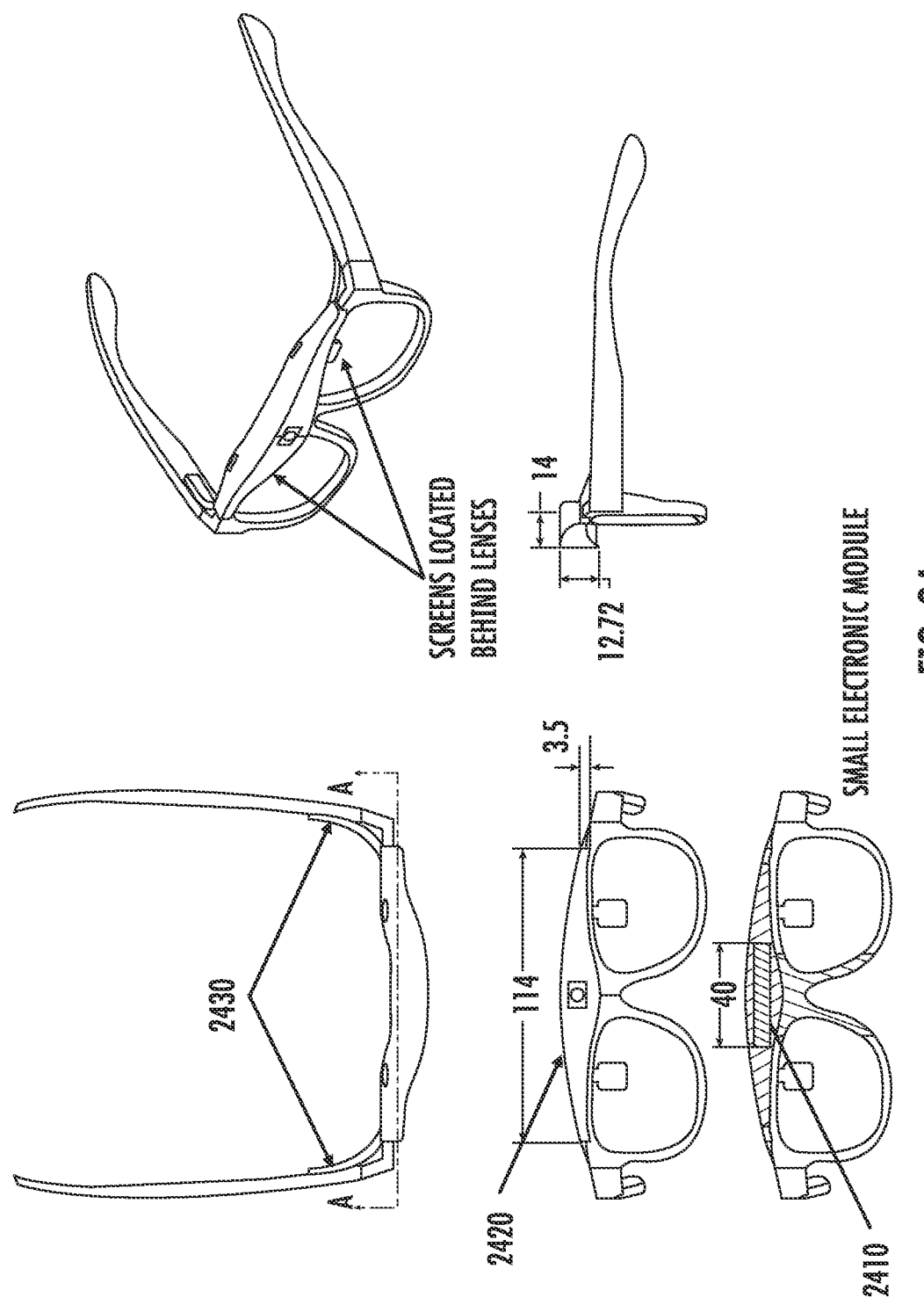
FIG. 24 is a schematic diagram of a depiction of one possible embodiment of the apparatus.
Figure 25:
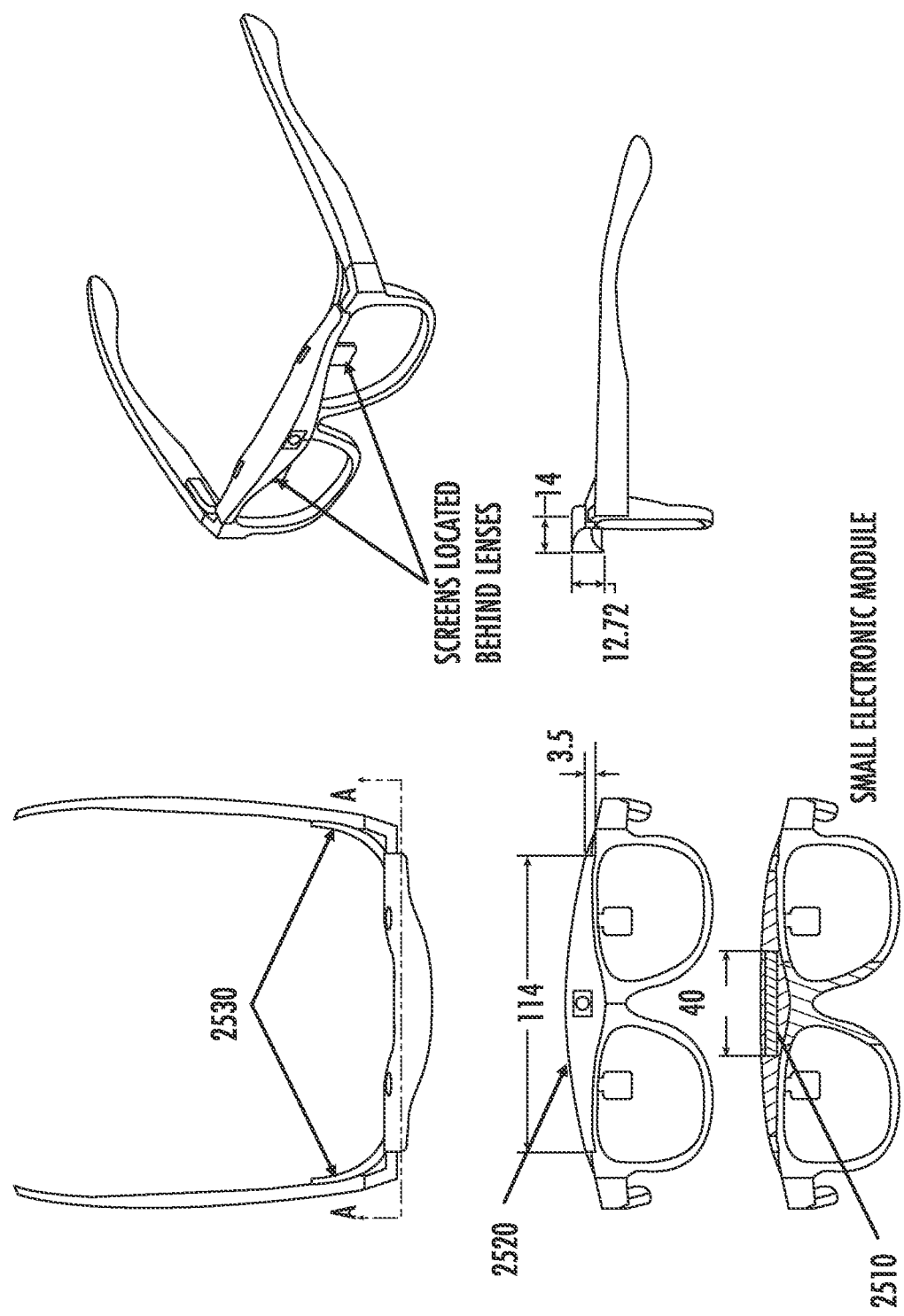
FIG. 25 is a schematic diagram of a depiction of one possible embodiment of the apparatus.

In certain embodiments, the optical window(s) can be located in front of the lens, further away from the eye (see, e.g., FIGS. 25, 38). In other embodiments, the optical window(s) can be located behind the spectacle lens closest to the eye (see, e.g., FIG. 24). In still other embodiments, the lens of the eyewear acts as an optical window and includes an optical combiner. In this case, the optical combiner can be, by way of example only, a reflector or mirror. Such a reflector or mirror can comprise optical power to reduce aberrations.

When the optical window is located behind the spectacle lens closest to the eye or incorporated in the spectacle lens, a tunable lens is required to properly align the wearer's accommodation and convergence with that of the virtual and real images. In certain embodiments where the spectacle lens is that of a filler lens having no optical power, a tunable lens is not required. In certain embodiments this can be accomplished by mechanically moving a focusing lens closer or further from the projector or display. When a tunable lens is utilized, such tunable lenses are known in the art.

Figure 41:
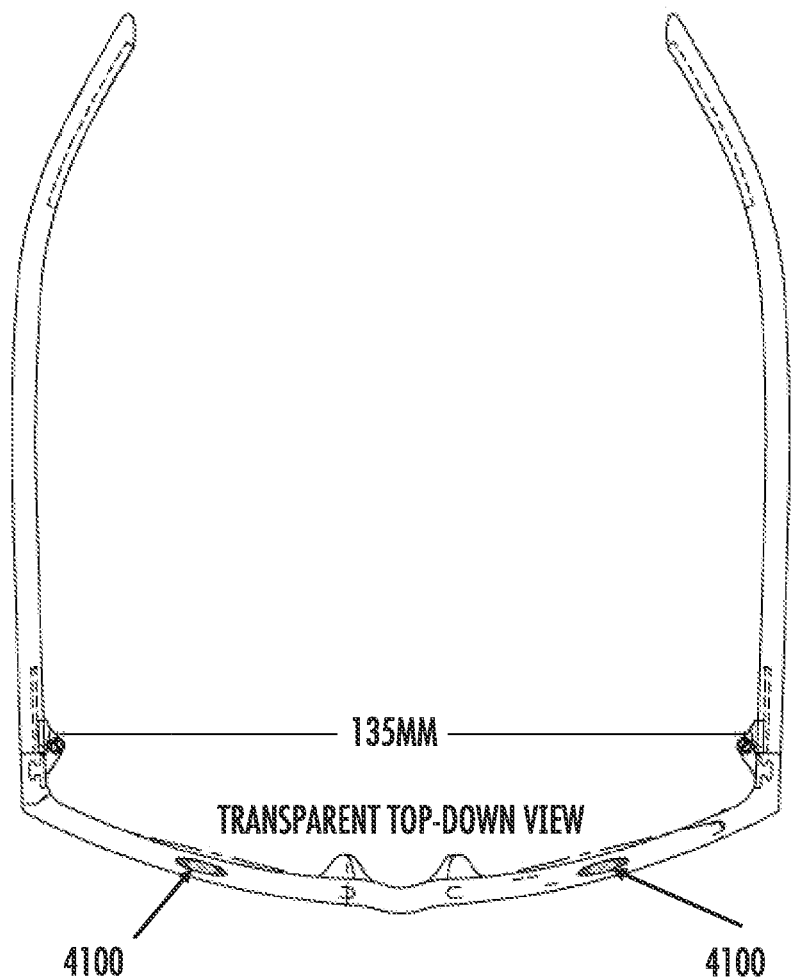
FIG. 41 is a schematic diagram of a depiction of one possible embodiment of the apparatus.

In certain embodiments, the spectacle lens of the eyewear acts as the optical window and/or the optical combiner. In these embodiments, the optical window/optical combiner is not moveable, and the optical combiner must be aligned to the pupil of the wearer. As stated earlier, in certain embodiments, a reflecting material properly aligned acts as an optical combiner. Such a reflective material can be on a surface (inner or outer convex or concave) of the lens or embedded within the lens matrix. When this occurs, the optical combiner can be properly positioned relative to the pupil of the wearer when the lens is edged for the shape of the eyeglass frame and inserted into the eyeglass frame. The optical combiner may be located by way of example only, in the lens in front of the pupil of the eye of the wearer, in the lens above the pupil of the eye of the wearer, and/or in the lens above the line of sight of the wearer. Both lenses of the eyewear can each comprise one optical combiner. When a lens or two lenses are used as the optical window/optical combiner, the image being optically communicated can be transmitted from the top edge of the lens thru the lens to the optical combiner which can be incorporated therein or in other embodiments located on the surface of the lens. The image being optically communicated can be projected at the required location on the top edge of the lens so that it is incident on the optical combiner within or on the lens. The top edge of the lens can comprise an optical coupler that transmits the optically communicated image. The optically communicated image can be the augmented reality image or the virtual image that is seen by the wearer of the AR Unit. The upper rim of the eyewear frame front that houses a lens can comprise an aperture to allow the optically communicated image (e.g., projected image) to be transmitted through the eye frame rim, as shown in FIG. 41. This aperture of the eyewear frame can be formed as an oval or rectangle having its longest dimension horizontally along a length of the top eye frame rim of the eyewear frame. This aperture 4100 allows for the optically communicated image to pass through the frame eye rim and be communicated to the lens (optical window). In another embodiment, the edge of the lens is formed with a protrusion on the lens itself, near or adjacent to its edge, such that the optically communicated image can be communicated without the frame eye rim interfering. In aspects, when both lenses are used as optical windows comprising optical combiners, the top of each eye frame rim that houses each of the lenses will have an aperture formed therein. In some embodiments, an optical coupler is used to connect the optic transmitting the optically communicated image to the top edge of the lens. In aspects, the optic transmitting the optically communicated image is positioned adjacent to, but not bonded to, the top edge of the lens. The top edge of the lens can be shaped to be flat or of any topography that will best transmit the optically communicated image. In a different embodiment, the edge of the lens is formed with a protrusion of the lens itself such that the optically communicated image can be communicated by the communicating optic without the eye frame rim interfering. The communicating optic can be coupled to the protrusion near or adjacent to the edge of the lens. The communicating optic can be bonded to the protrusion near or adjacent to the edge of the lens. The communicating optic can be placed adjacent to the protrusion near the edge of the lens. The protrusion near the edge of the lens can be polished.

Figure 50:
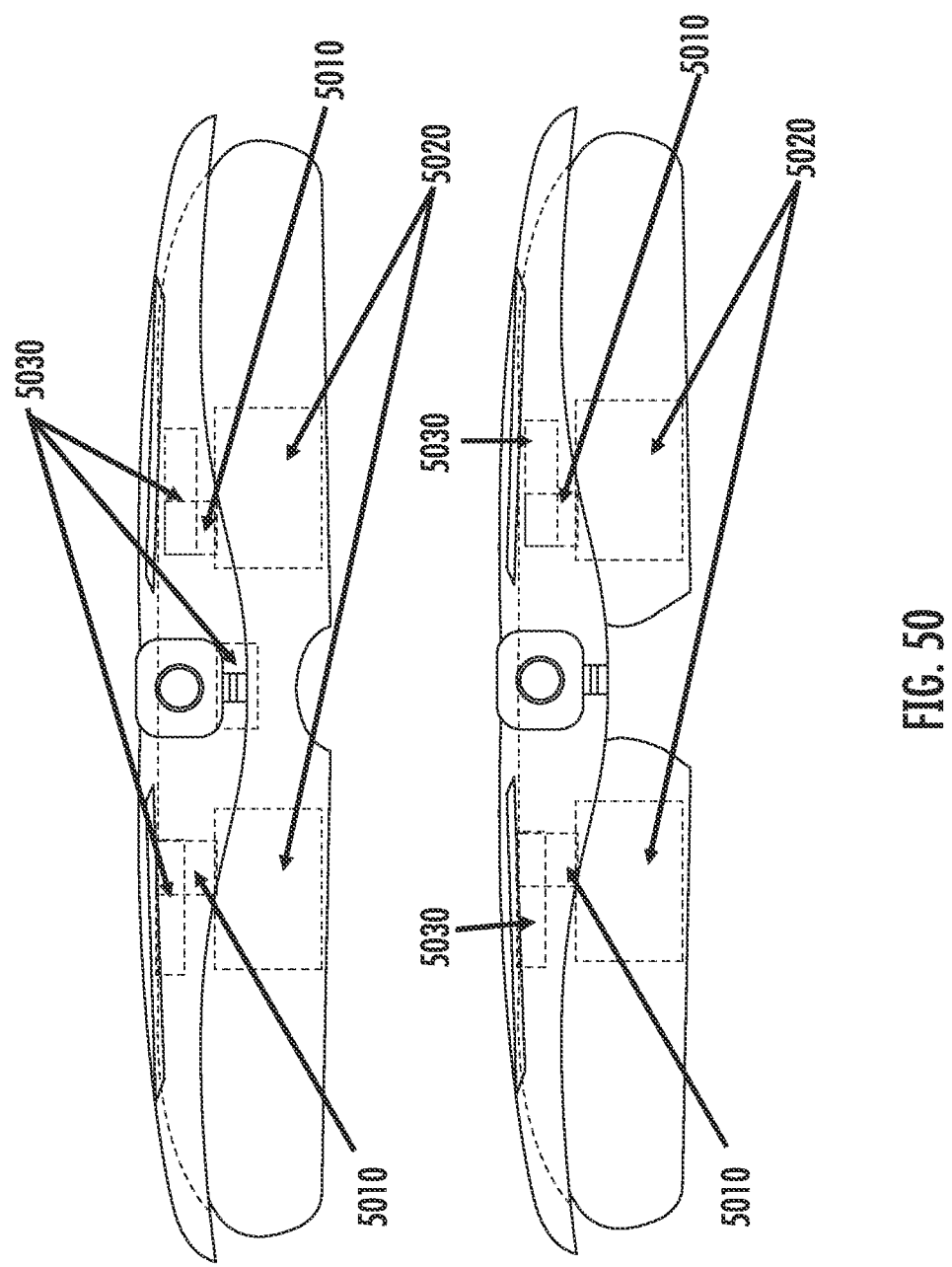
FIG. 50 is a schematic diagram of a depiction of one possible embodiment of the apparatus.
Figure 51:
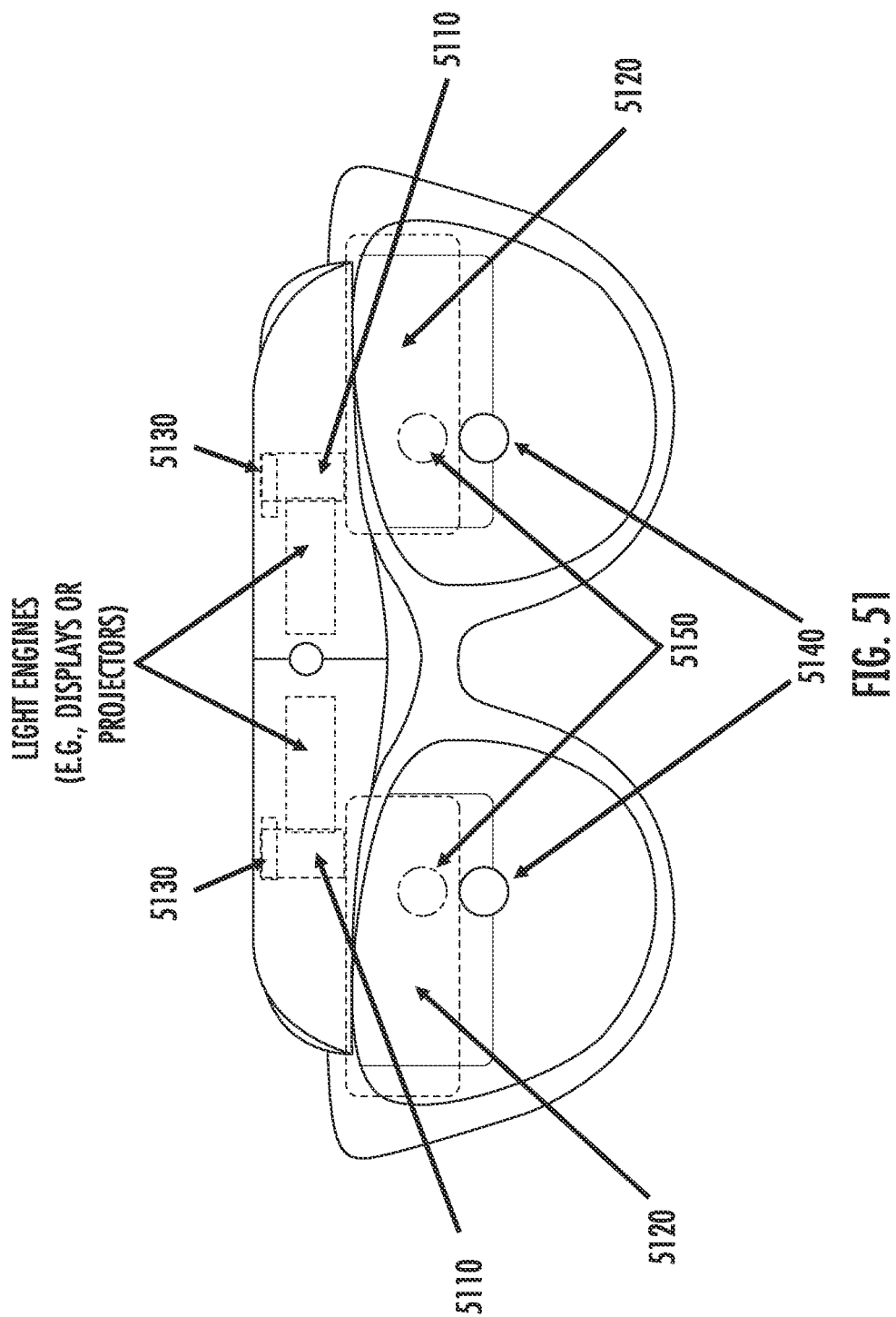
FIG. 51 is a schematic diagram of a depiction of one possible embodiment of the apparatus.
Figure 52:
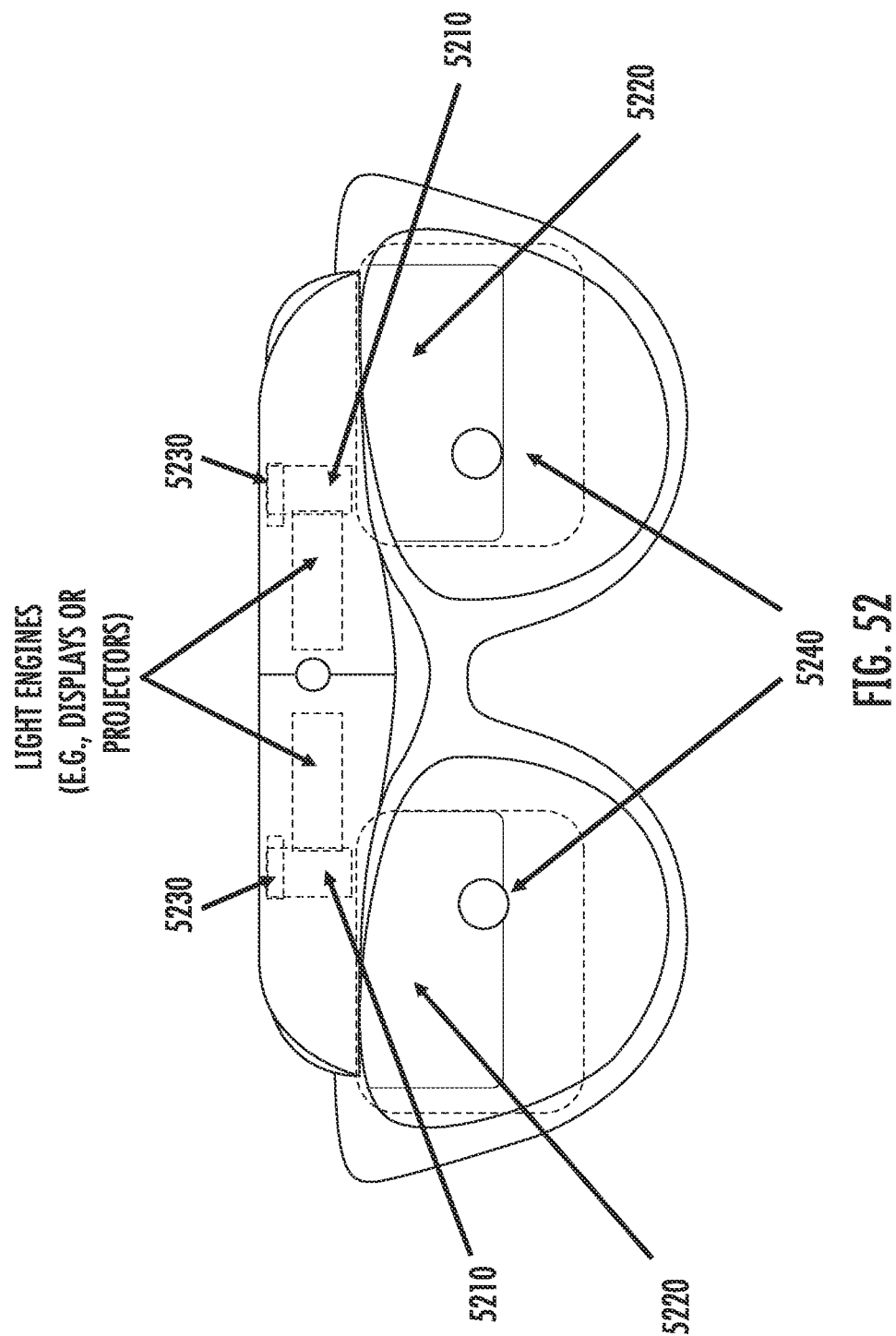
FIG. 52 is a schematic diagram of a depiction of one possible embodiment of the apparatus.

In still other embodiments, as shown in for example, FIGS. 50-52, an optical grating 5010, 5110, 5210 is used to optically communicate the image from the light engine (e.g., projector or display) to an optical combiner via a waveguide 5020, 5120, 5220. In embodiments, the AR Unit main body includes one waveguide optical combiner of the optical window for monocular use or two for binocular use. In FIGS. 38 (front view)-39 (top view), a waveguide optical combiner and optical window are depicted as 3850, 3950. The vertical height of the waveguide optical combiner of the optical window is adjustable by way of edging the waveguide optical combiner of the optical window to the desired vertical height for a given frame eye size and style relative to the wearer's pupil. The optical combiner or optical window can be located with its bottom edge at or above the top edge of the pupil(s) of the eye(s) of the wearer. The optical combiner or optical window can be located with its bottom edge at or below the lower edge of the pupil(s) of the eye(s) of the wearer. The displayed augmented reality image can be programed to be displayed in relation to the usable waveguide optical combiner/optical window dimensions (vertical height and horizontal width). In embodiments, the bottom edge of the waveguide optical combiner of the optical window can be set above the top edge of the pupil 5140 as shown in, for example, FIG. 51. At 5140 is where the pupils are located when the wearer is looking straight ahead; 5150 is where pupils would be when the user tilts the head forward, for example. Alternatively, in FIG. 52, an embodiment is shown wherein the optical combiners make up the full optical window(s). In this embodiment, the optical window(s) are of a vertical height so that they cover the wearer's pupils even when looking straight ahead without the head tilted 5240. The waveguide optical combiners/optical windows can be positioned in front of, behind the spectacle lens(es) of the wearer, or embedded within the spectacle lens(es) of the wearer. But in a preferred embodiment, they are positioned in front of the spectacle lens(es) of the wearer furthest from the eyes of the wearer.

In embodiments, the AR Unit connects to the internet, the cloud, and/or an edge computing unit. In aspects, the AR Unit can include one or more of, by way of example only, a receiver, wireless transmitter, wireless transceiver, memory storage, memory storage chip, CPU, and/or a rechargeable battery. The AR Unit can work with, by way of example only, Android, iOS, or other software, applications, and platforms. In certain embodiments, the AR Unit connects directly in a wired manner to a wearer's smart phone or computer and utilizes an application stored on the smart phone or computer and can be linked or connected, for example, to the internet. In certain embodiments, the AR Unit connects in a wireless manner to a wearer's smart phone or computer and utilizes an application stored on the smart phone or computer and can be linked or connected, for example, to the internet. In certain embodiments, the AR Unit can be capable of displaying a photo, video, hologram, text, number, sentence and/or symbol to the wearer. In certain embodiments, the AR Unit can support a switch and/or be controlled remotely. In certain embodiments, the AR Unit can turn on automatically with a head tilt, such as if the wearer tilts his/her chin down towards the chest. In certain embodiments, the AR Unit can turn off automatically when the wearer's head is not tilted downward. This default means the AR Unit saves energy when the wearer is not utilizing augmented reality with his or her eyewear. The AR Unit can comprise, by way of example only, one or more of: a manual switch, capacitance switch, tilt switch, motion sensor switch, and/or acoustic sensor switch. The AR Unit can communicate feedback to the wearer of the AR Unit by, by way of example only, one or more of: vibration, sound, and/or light. In certain embodiments, the AR Unit can communicate with the wearer by way of a personal assistant such as, by way of example only, Siri or Alexa. In certain embodiments, the AR Unit can respond to voice commands by the wearer. In certain embodiments the AR Unit can respond to gesture commands by the wearer. In certain embodiments, the AR Unit can respond to eye commands by the wearer, such as a force blink, blink, wink, roll of eyes, and/or eye flutter.

The AR Unit can be water proof. The AR Unit can be water resistant. The AR Unit can be sweat proof. The AR Unit can be sweat resistant.

In certain embodiments, the AR Unit can project a virtual image at one or more of: a near, intermediate, or far distance. The AR Unit can adjust the location of the virtual image and its magnification so that the convergence of the wearer's eye viewing the virtual image is consistent with the accommodative stimulus experienced by the eye. The AR Unit can align the location of the virtual image, so the accommodation and convergence of the wearer's eyes are aligned with the real image. The AR Unit can equalize the magnification seen by the wearer of the virtual image and the real image when combined.

In certain embodiments, the AR Unit can adjust the focus and magnification of the virtual image anywhere within the field of view in order to allow for the wearer's convergence at any point of regard. In certain embodiments, the AR Unit's projection system can alter its focus for different distances. This can be accomplished with a tunable lens or a tunable optical system. Such lenses or systems are known in the art.

Regarding eyewear frames, the AR Unit main body fits on eyewear having prescription lenses or a pair of eyewear having non-prescription lenses. The spectacle lenses can be single vision, multifocal, trifocals, and/or progressive addition lenses. The spectacle lenses can have optical power or no optical power. The spectacle lenses can be tinted or clear. The AR Unit main body can fit on an eyewear frame having no lenses. The AR Unit's main body itself may comprise one or more ophthalmic lens. The eyewear on which the AR unit's main body fits and/or attaches can be that of any eyewear, by way of example only, one of: sports, shooting, swimming, safety, industrial, welding, enterprise, dress, fashion, sunglass, space, and/or goggles. The eyewear can be, by way of example only, one of: wire frames, plastic frames, and/or a combination of wire and plastic frames. The AR Unit can be releasably attached to the eyewear on which it rests. In certain embodiments, the AR Unit is releasably attachable to the eyewear frame and the optical window is part of the AR Unit. In other embodiments, the AR Unit is releasably attachable to the eyewear frame and the optical window is part of the eyewear. When the optical window is part of the eyewear frame, it can be embedded within the eyewear lens(es), in front of the eyewear lens and attached to the frame front, or behind the eyewear lens and attached to the frame front. When the optical window is part of the frame front it will limit the available selection of eyewear styles available to the consumer having such a feature.

In preferred embodiments, the AR Unit's main body comprises one or more flex joint allowing for the AR Unit to better conform to the shape of an eyewear frame. A portion of the AR Unit's main body may be made from a flexible material. A portion of the AR Unit's main body can be made by way of example only, a urethane material. As shown in FIGS. 23-25 and 43, the AR Unit's main body 2300 can comprise one or more internal rigid electronic module 2310, 2410, 2510. In certain embodiments, multiple rigid separated electronic modules can be utilized within the AR Unit's main body. These multiple electronic modules can be connected by a member whereby the member permits one module to be rotated or flexed away from or closer to the other. The AR Unit's main body can comprise a rigid electronic module embedded within a flexible outer body covering of the AR Unit's main body. The rigid electronic module can have one or multiple flex joints (see, e.g., FIG. 43). The rigid electronic module can be partially or fully embedded in the AR Unit's main body. As shown in FIG. 26, the module 2610 may have, for example, conformable wing structures, such that the electronic module comprises one or more conformable or bendable portion. In aspects, two portions to the right and left of the module 2640 can be bent to conform to a shape complimentary with the eyeglass frame front on which the AR Unit's main body rests and/or electronic module rest. As shown in FIG. 27, in another embodiment, the electronic module 2710, may comprise a single conformable member 2750, which may be bent to conform to a shape complimentary with the eyeglass frame front on which the AR Unit's main body rests. The flexible AR Unit's main body can have a groove located in the bottom edge of the AR Unit's main body for receiving a portion of the top edge of an eyewear frame. The AR Unit' main body can have a groove for receiving a connector member on the top outer surface of the AR Unit's main body. The AR Unit's main body can have multiple grooves for receiving a connector member on the top outer surface of the AR Unit's main body. The AR Unit's main body can contain one or more magnet, ferromagnetic material, and/or an aperture. The AR unit's main body can rest upon the top of the eyewear frame front (as shown, e.g., at 2420, 2520) and be connected to one or both eyewear temples 3970. The AR Unit's main body can be connected to an eyewear temple. The AR Unit's main body can be connected to two eyewear temples 2330, 2430, 2530. (See, e.g., FIGS. 23-25.) The AR Unit's main body can be connected to the eyewear frame front. The connection to the eyewear frame front can be by way of a connection member, by way of example only: a strap, loop, ring, fastener, clip, and/or magnetic attachment. The strap, loop, ring, or fastener can be adjustable and/or elastic.

Figure 17:
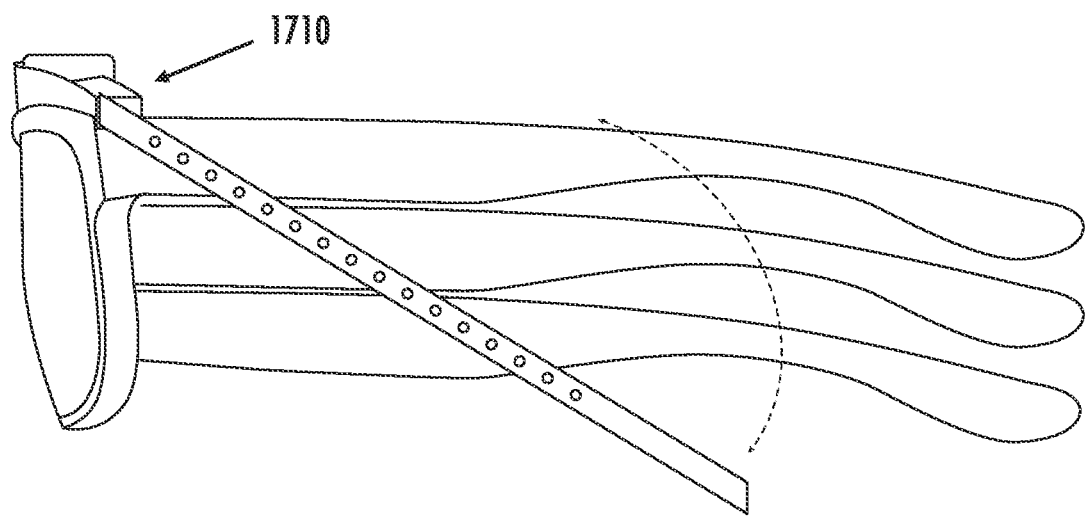
FIG. 17 is a schematic diagram of a depiction of one possible embodiment of the apparatus.
Figure 18:
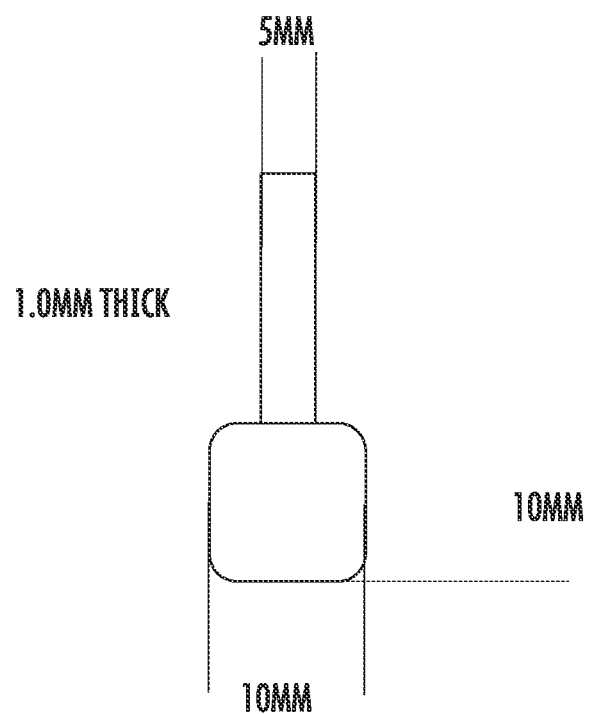
FIG. 18 is a schematic diagram of a depiction of one possible embodiment of the apparatus.

When connected to the frame front, the connection can be by way of example only, the eyewear rim, bridge, and/or temple region of the frame. The connection to the eyewear temple can be at the bottom of the eyewear temple, the top of the eyewear temple, the inside of the eyewear temple, the outside of the eyewear temple, around the eyewear temple, and/or on a side of the eyewear temple. The connection to the eyewear temple can be attached to a track, groove or male feature designed into the side of the eyewear temple. The connection to the eyewear temple can be attached to a track, groove or male feature applied to the side of the eyewear temple. The connection to the eyewear temple can be attached to a connector that is attached to the eyewear temple. The connection to the eyewear temple can allow for the eyewear temple to slide through the connection member and tightened once in position to keep the connection in place. The AR Unit's main body can be held in place by an arm that connects with a temple track. The AR Unit's main body can be held in place by an arm having multiple spaced holes to which a male member that is attached or part of the eyewear temple attaches to. (See, e.g., FIG. 17.) The arm may be hinged or otherwise moveable or adjustable 1710. The male member may be located on the inside side of the eyewear temple. The member can be located on the outside side of the eyewear temple. The male member can be part of a connector strap or ring that goes around the temple. Thus, the arm shown in FIG. 17, for example, would be located and connected to the "inside side" of the eyewear temple located closest to the head of the wearer and the male member would be inserted within the appropriate hole that allows the AR Unit's main body to be held properly in place.

This can be reversed with the male member being located on the arm and the female member being located on the connector strap or ring. Also, the connection can be on the outside side of the eyewear temple. The AR Unit's main body can be held in place by an arm (or arms) that is adjustable. An arm of the AR Unit's main body can be attached by any mechanical means to the temple, such as by way of example only, a strap, hook, snap, magnet, magnetic attraction, belt, loop, clip, bracket, band, male/female interface, and/or Velcro. An arm of the AR Unit's main body can attach to an intermediary member that is attached to the temple. An arm of the AR Unit's main body can be flexible and/or bendable. In certain embodiments, the AR Unit's main body can have one or multiple arms that are extensions of the AR Unit's main body. In certain embodiments, the AR Unit's main body receives attaching arms which connect to the eyewear frame. The attachment to the eyewear frame can be to the frame front or to one or both temples.

Figure 16:
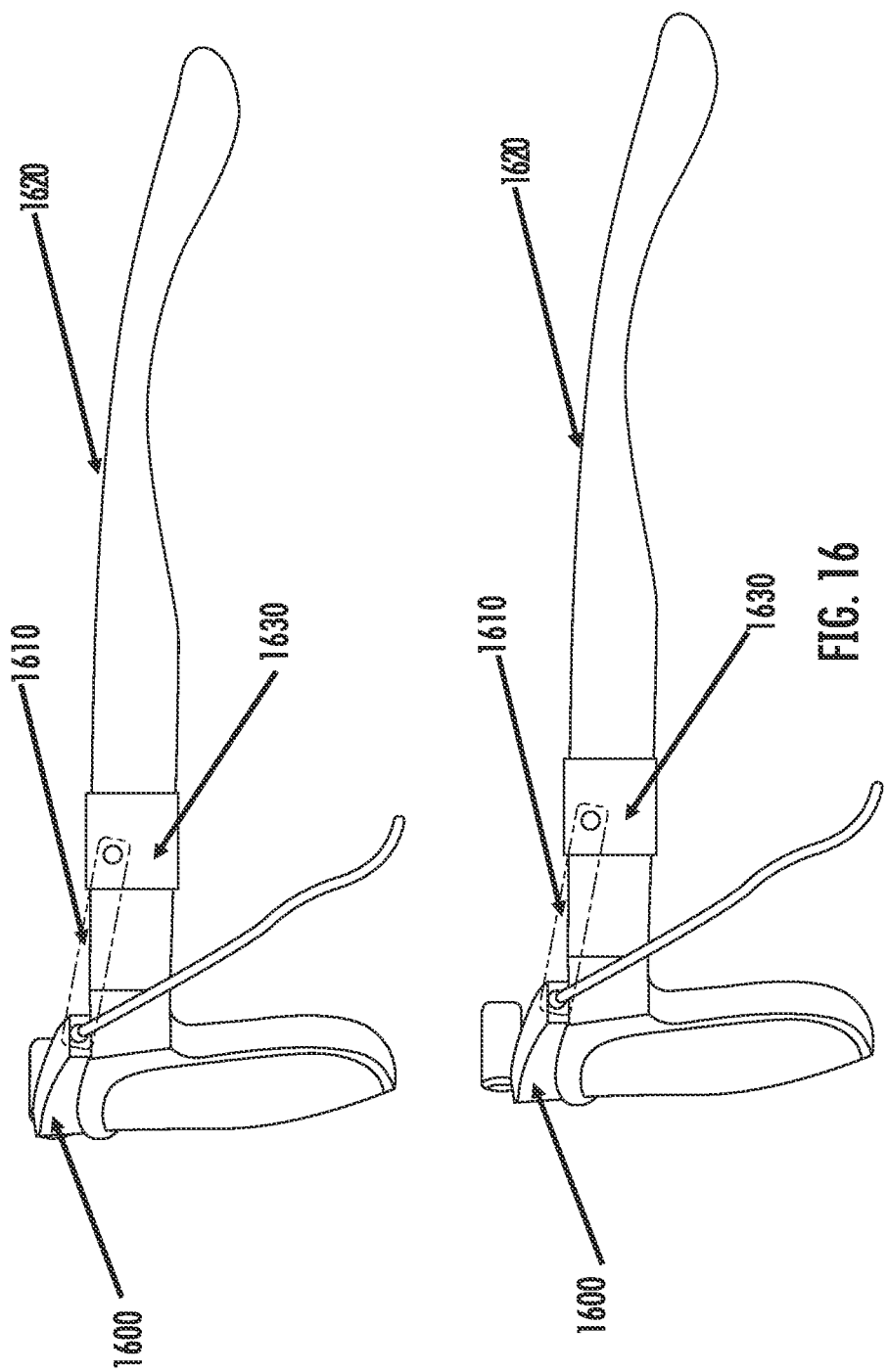
FIG. 16 is a schematic diagram of a depiction of one possible embodiment of the apparatus.

The AR Unit's main body 1600 can have one or two arms that attach directly or indirectly to the eyewear's temples. (See, e.g., FIG. 16.) The arm(s) 1610 of the AR Unit's main body can be flexible and/or adjustable so that they connect 1630 directly or indirectly to the eyewear temple(s) 1620. An intermediary connection member(s) can be attached to the eyewear temple(s) and then attached to the arm(s) of the AR Unit's main body.

Figure 15:
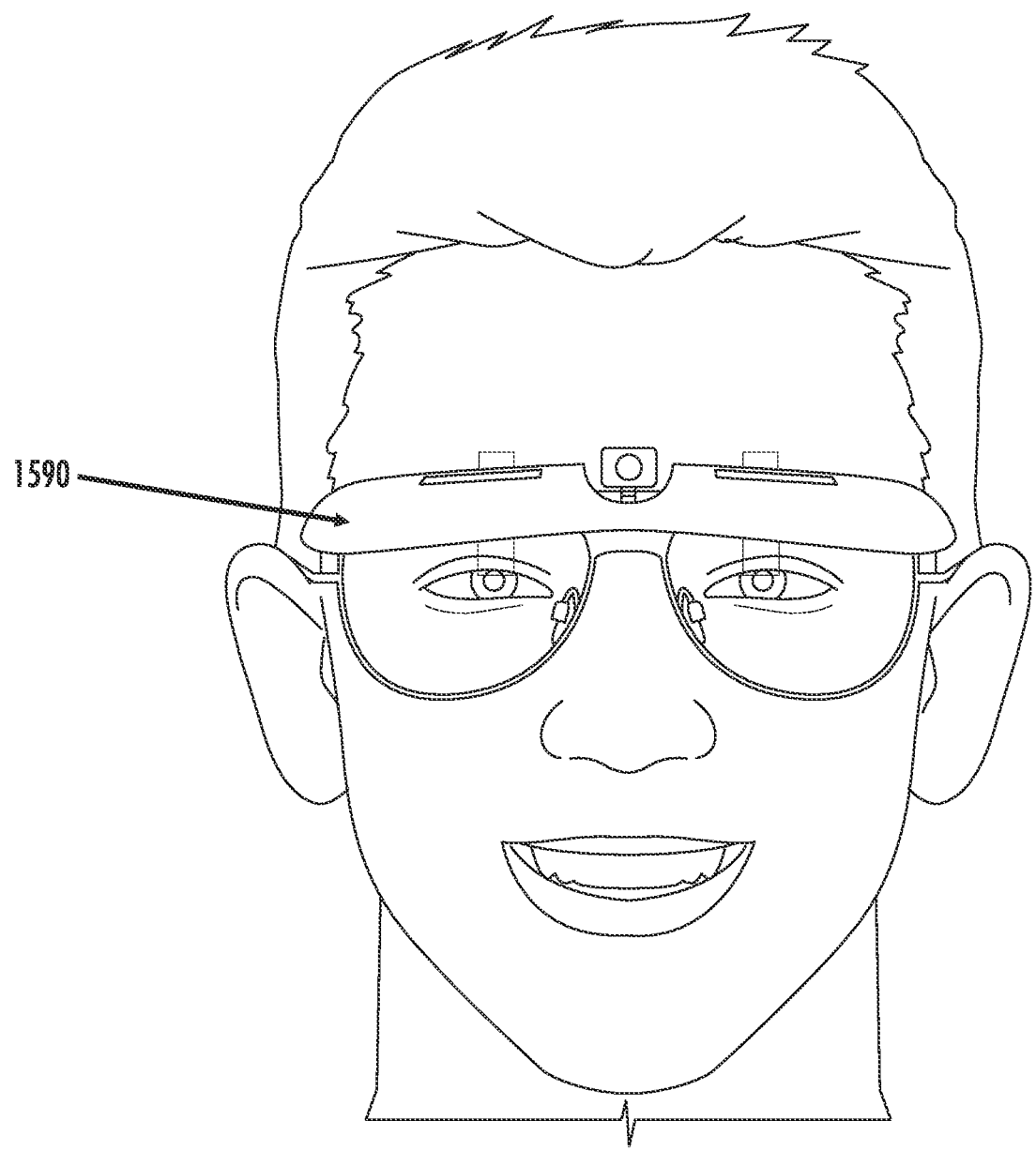
FIG. 15 is a schematic diagram of a depiction of one possible embodiment of the apparatus, including an energy harvesting visor that may be attachable to and detachable from the apparatus.
Figure 42:
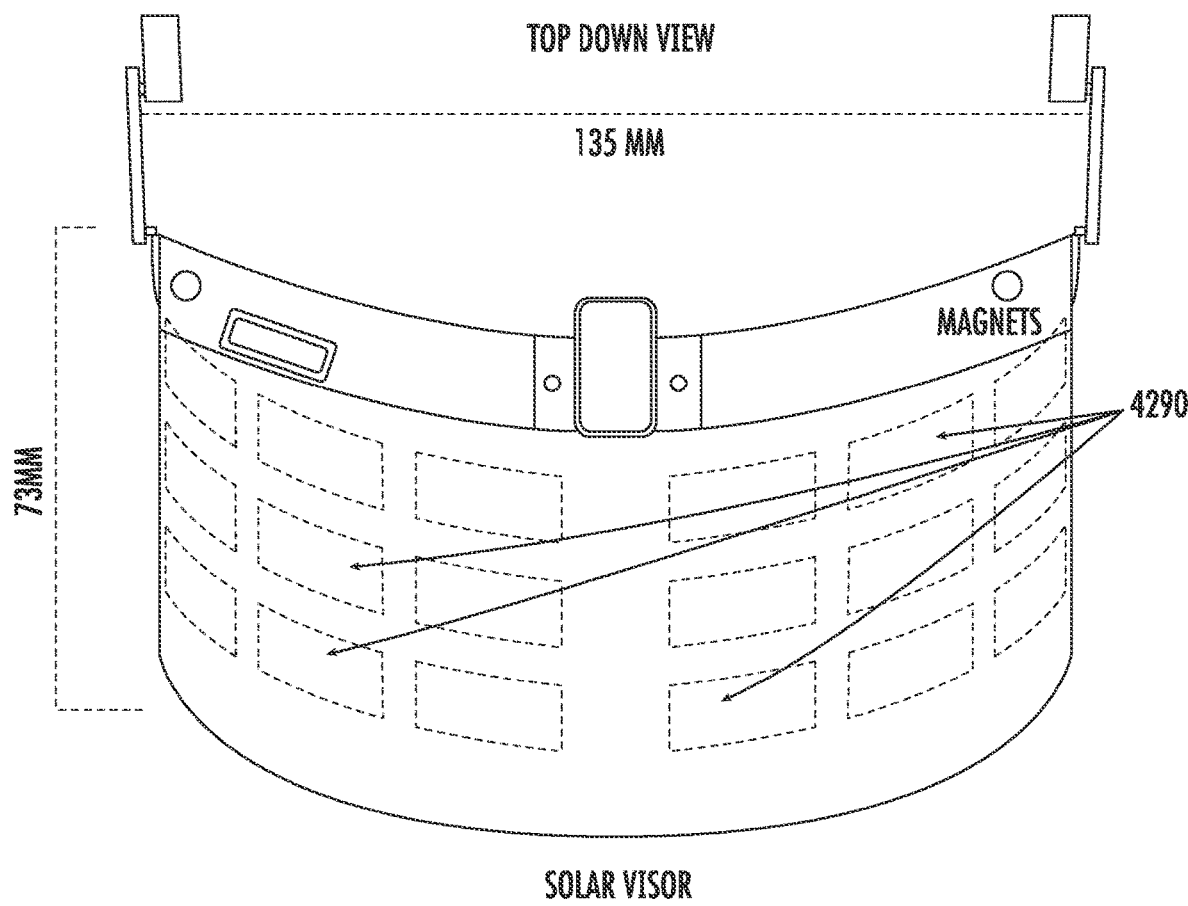
FIG. 42 is a schematic diagram of a depiction of one possible embodiment of the apparatus.
Figure 43:
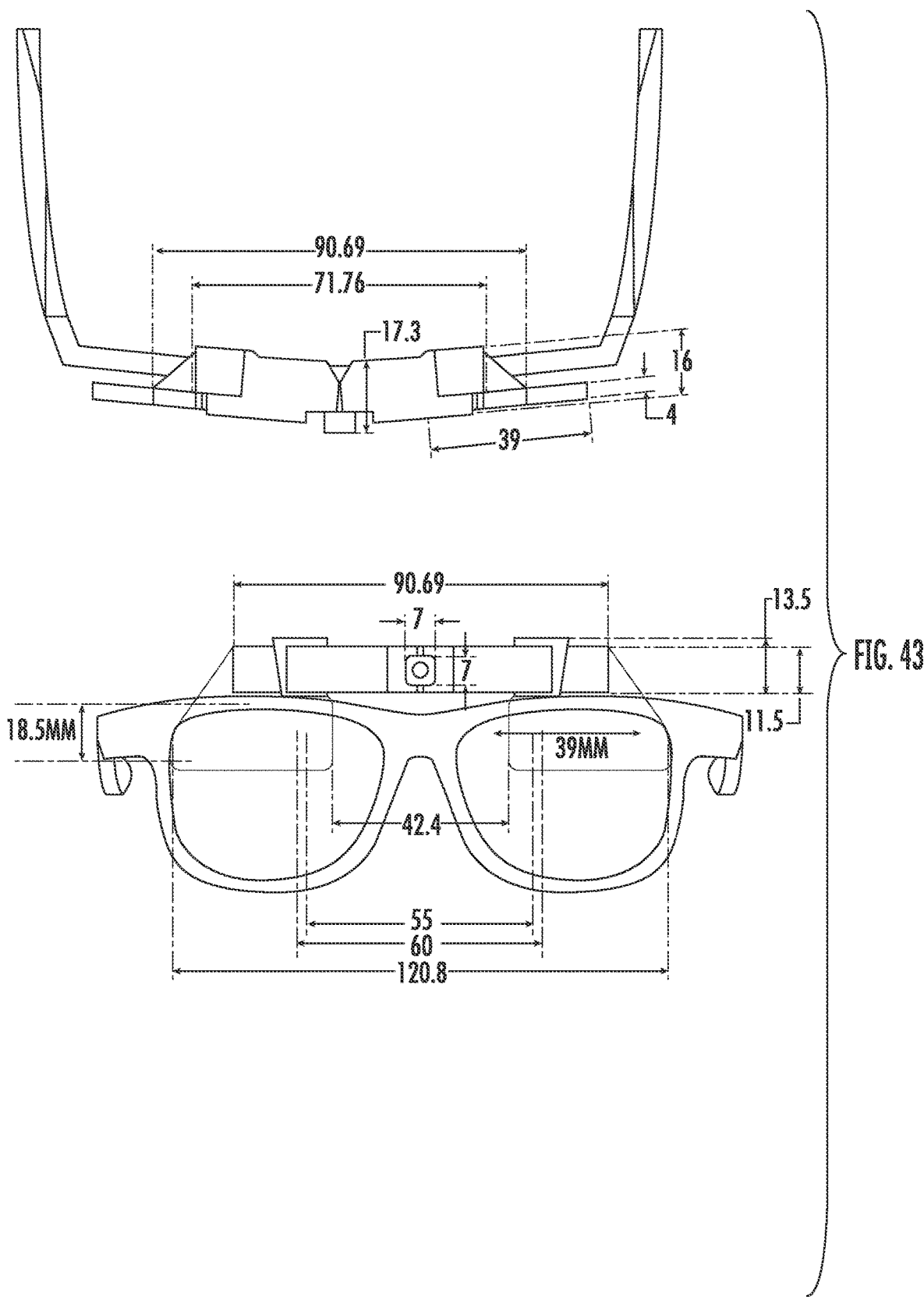
FIG. 43 is a schematic diagram of a depiction of one possible embodiment of the apparatus.
Figure 44:
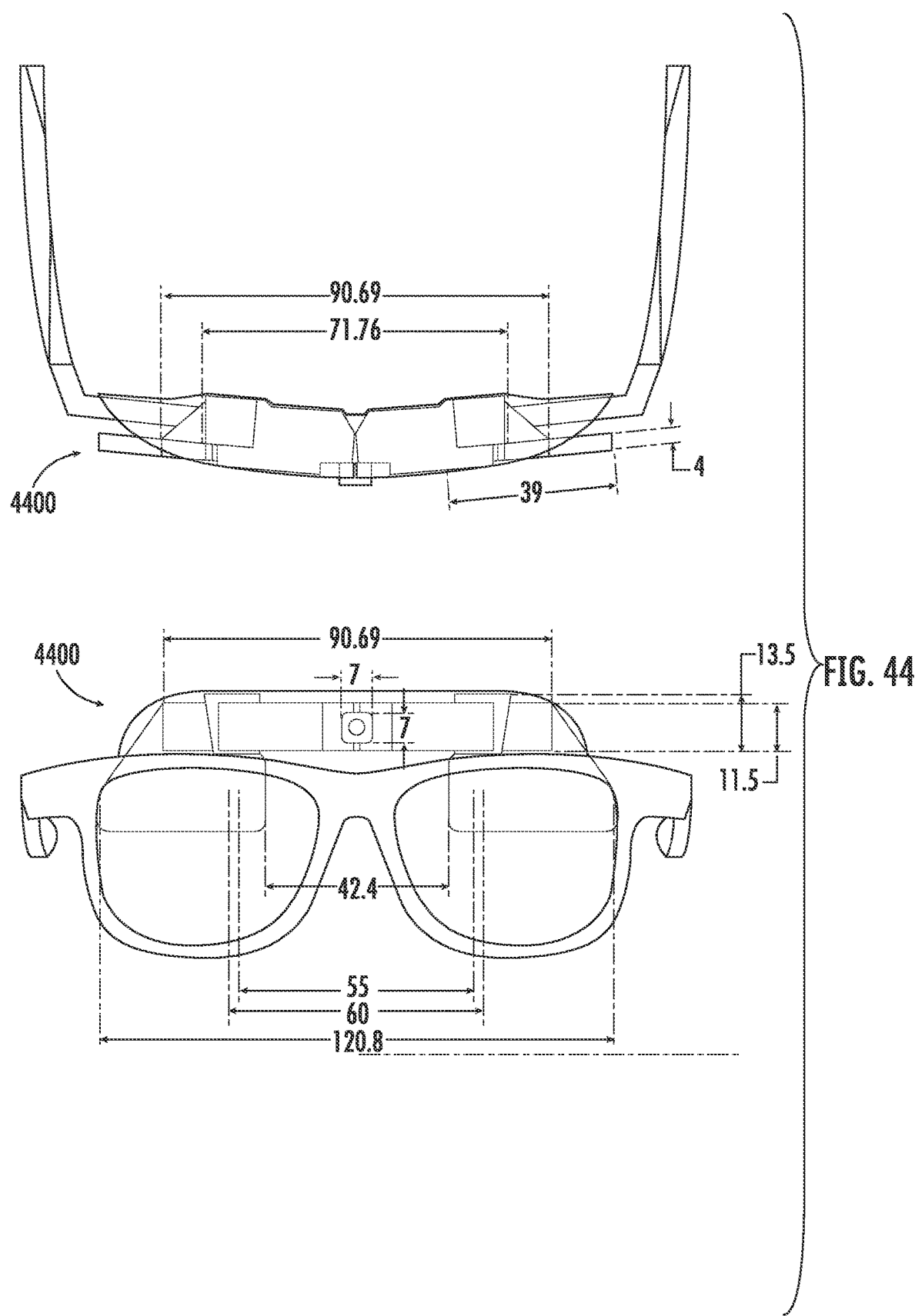
FIG. 44 is a schematic diagram of a depiction of one possible embodiment of the apparatus.
Figure 45:
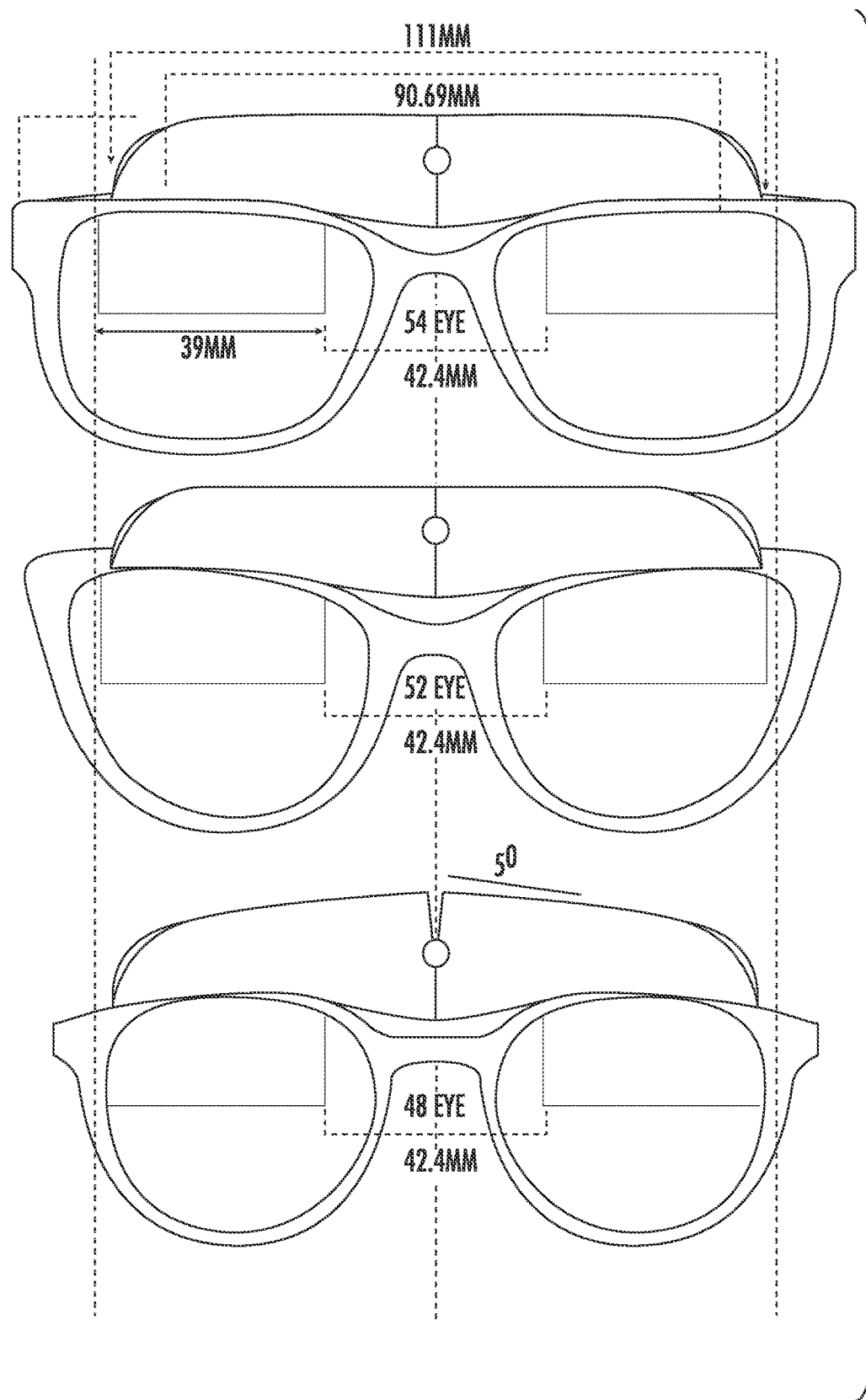
FIG. 45 is a schematic diagram of a depiction of one possible embodiment of the apparatus.

The AR Unit's main body can further support a solar visor that can be attached to the AR Unit's main body and extend forward from the head of the wearer. (See, e.g., FIGS. 15, 42.) The attachment means can be by way of example only: magnets, clamps, ties, clips, and/or snaps. The solar visor can have a plurality of solar cells 1590, 4290. The solar visor can be attachable and detachable. The solar visor can be electrically connectable to a rechargeable battery that provides additional power for the AR Unit's main body. In certain embodiments, the solar visor mechanically attaches to the eyewear frame. In other embodiments, the solar visor mechanically attaches to the eyewear frame and/or the AR Unit's main body. In still other embodiments, the solar visor mechanically attaches to the AR Unit's main body only. In certain embodiments, the solar visor magnetically attaches to the eyewear frame. In other embodiments the solar visor magnetically attaches to the eyewear frame and/or the AR Unit's main body. In other embodiments, the solar visor magnetically attaches to the AR Unit's main body only. In still other embodiments, a solar harvesting member is attached and electrically connected to the electronic tether of the AR Unit and is worn by the wearer around the neck and shoulders of the wearer. In still other embodiments, a solar harvesting member is attached and electrically connected to the electronic tether of the AR unit and is worn on the head of the wearer, by way of example only, a cap, hat, or visor.

Figure 5:
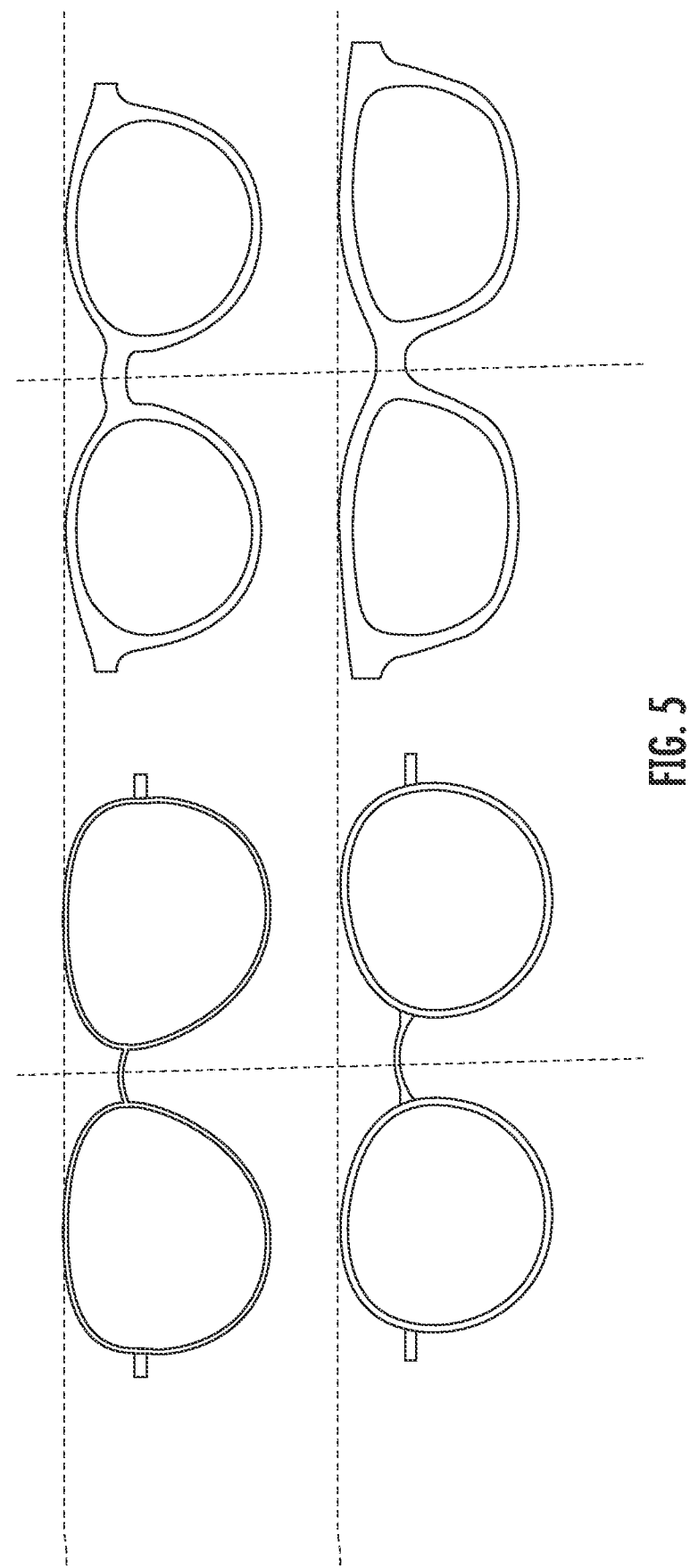
FIG. 5 is a schematic diagram of a depiction of eyewear frames compatible with embodiments of the invention as taught herein.
Figure 6:
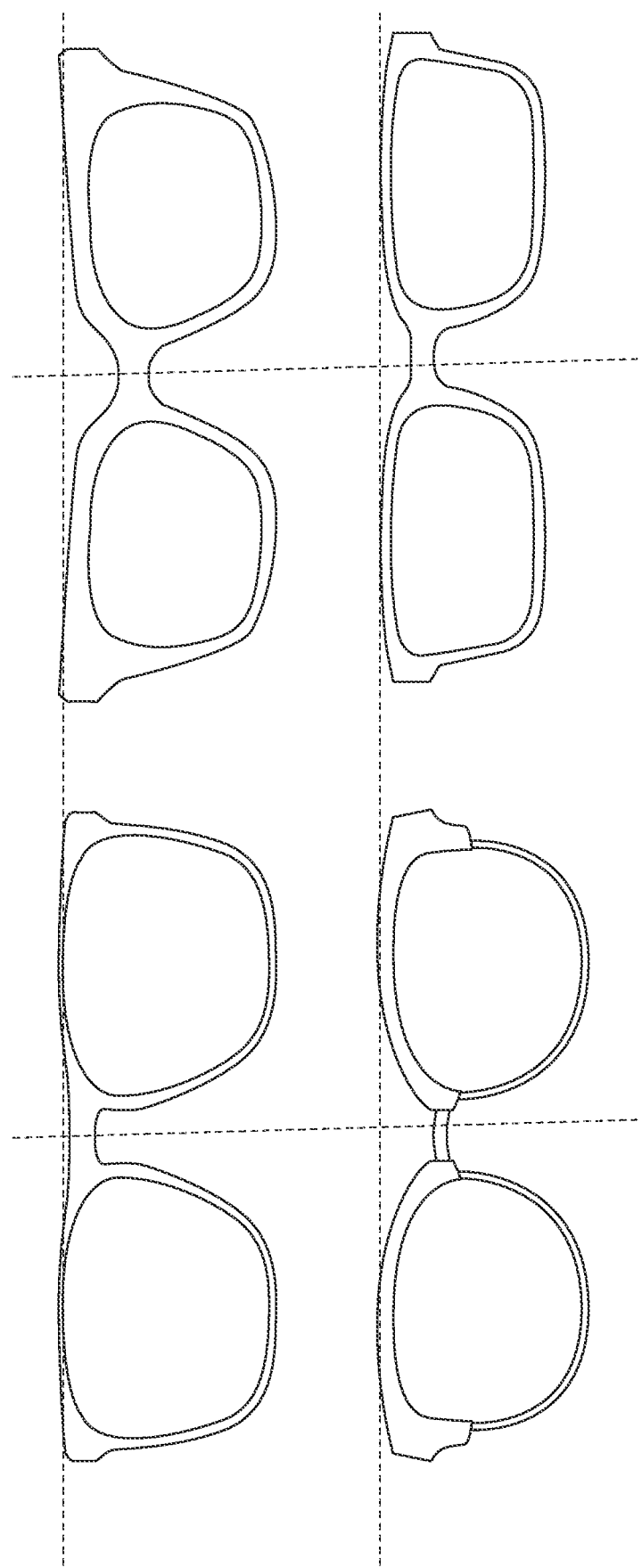
FIG. 6 is a schematic diagram of a depiction of eyewear frames compatible with embodiments of the invention as taught herein.
Figure 7:
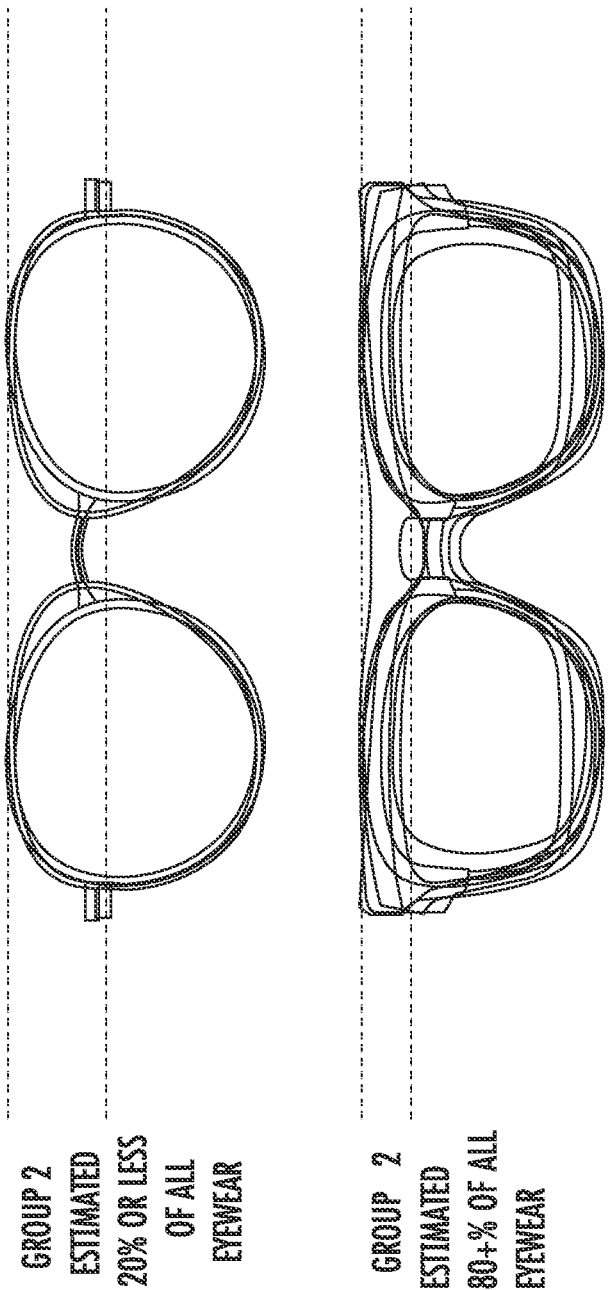
FIG. 7 is a schematic diagram of a depiction of eyewear frames compatible with embodiments of the invention as taught herein.
Figure 8:
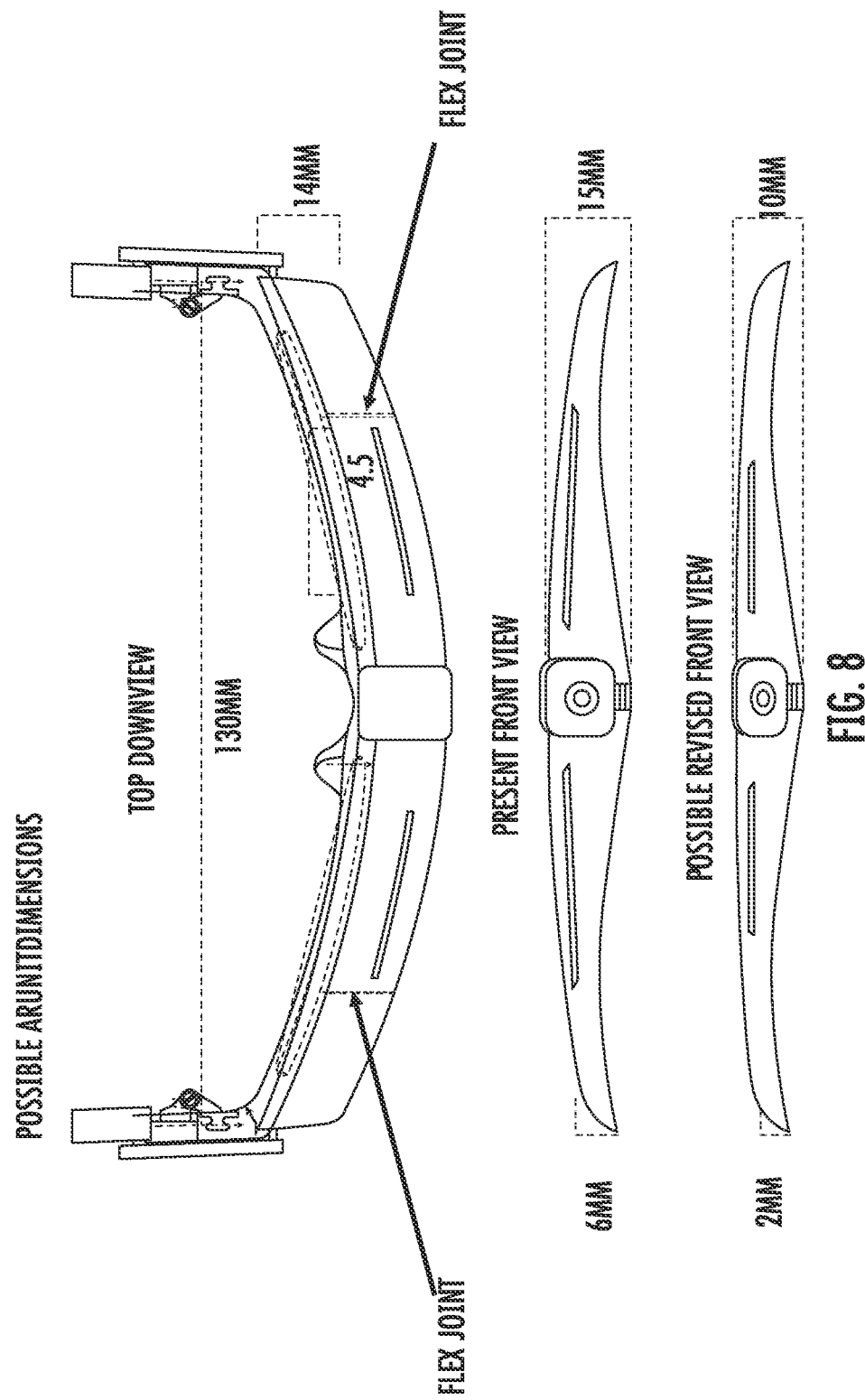
FIG. 8 is a schematic diagram of a depiction of one possible embodiment of the apparatus.
Figure 9:
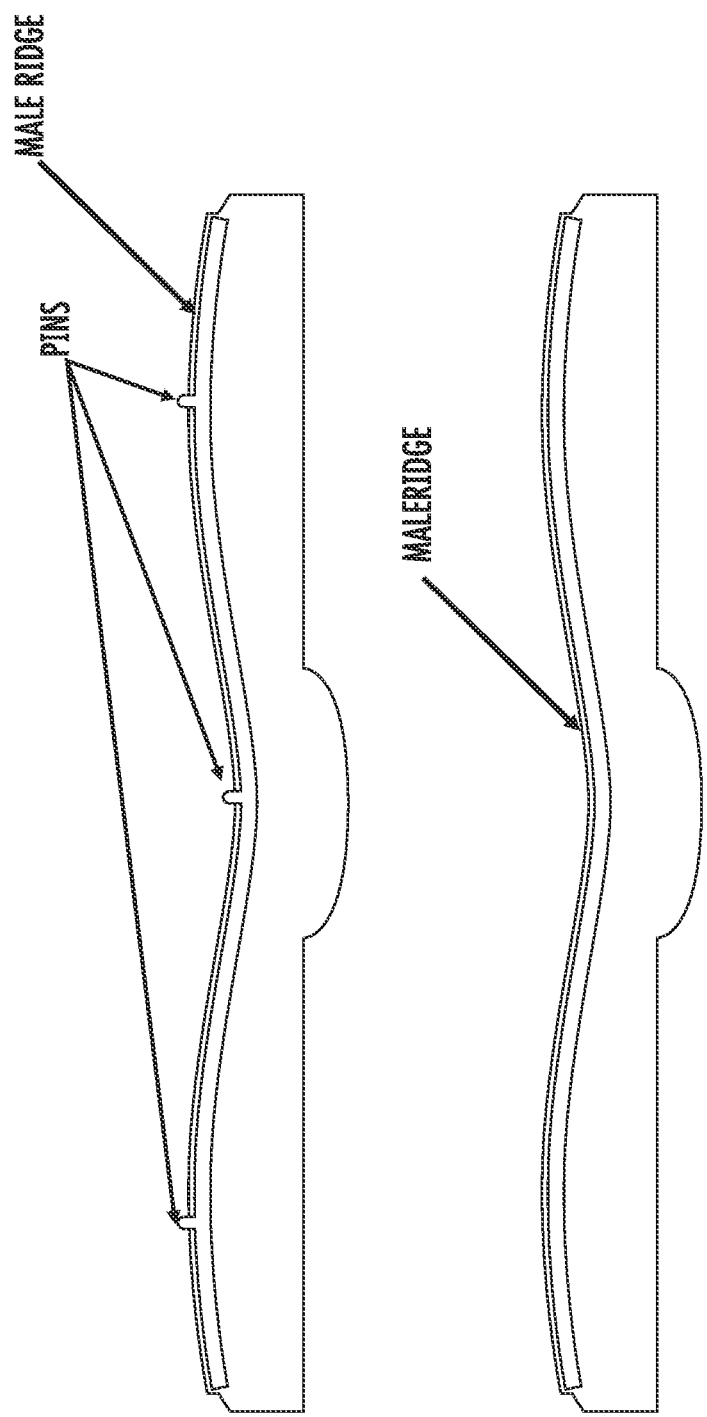
FIG. 9 is a schematic diagram of a depiction of one possible embodiment of the apparatus.
Figure 10:
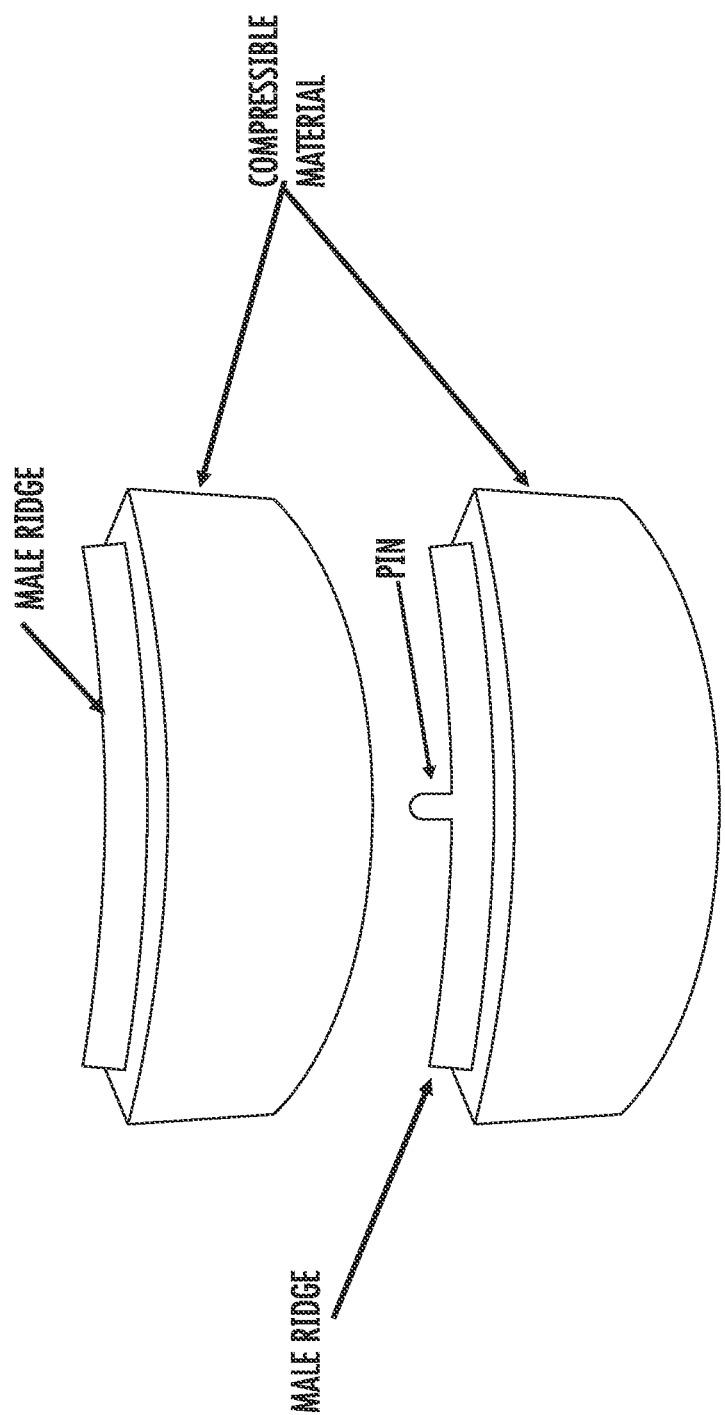
FIG. 10 is a schematic diagram of a depiction of one possible embodiment of the apparatus.
Figure 12:
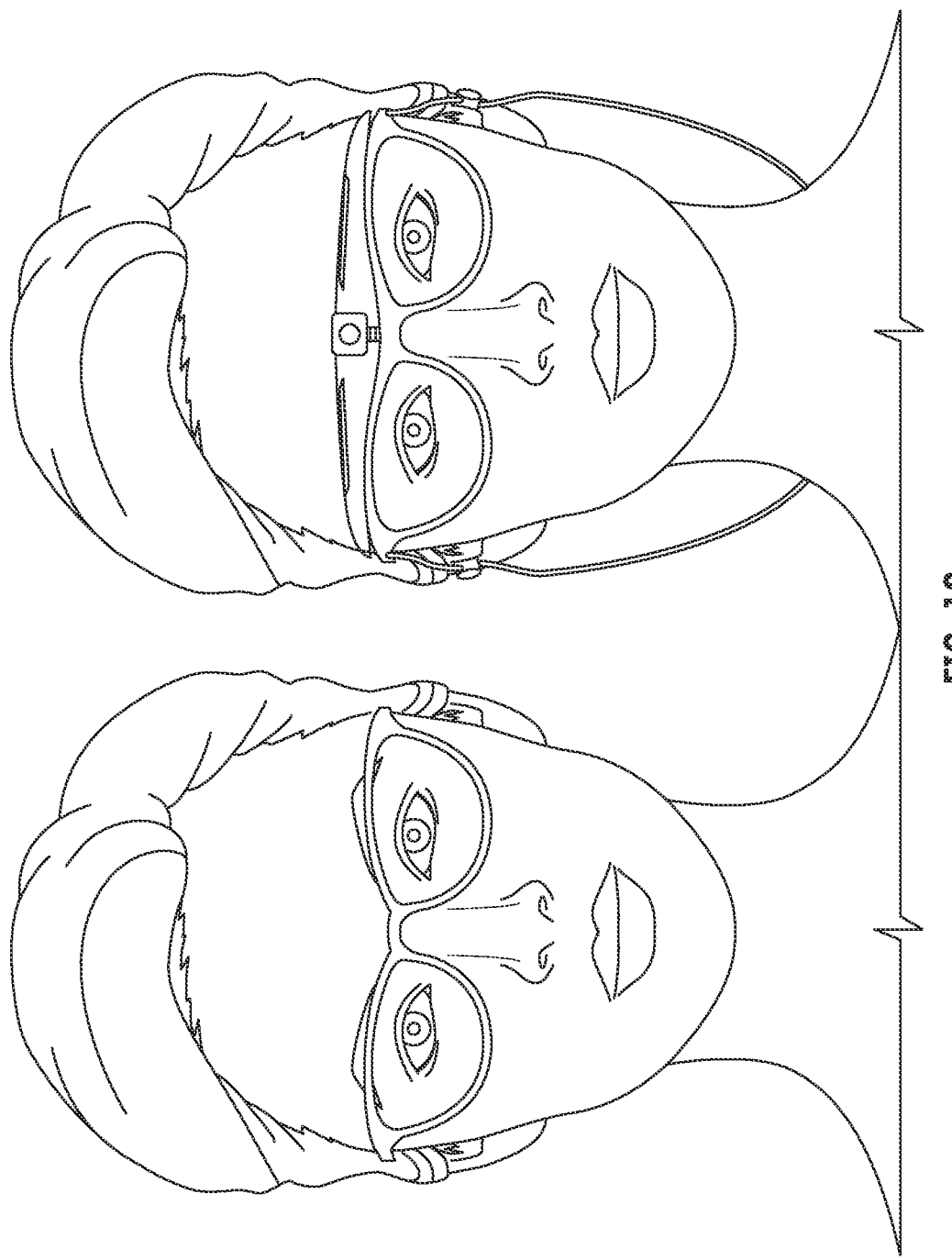
FIG. 12 is a schematic diagram of a depiction of one possible embodiment of the apparatus.
Figure 13:
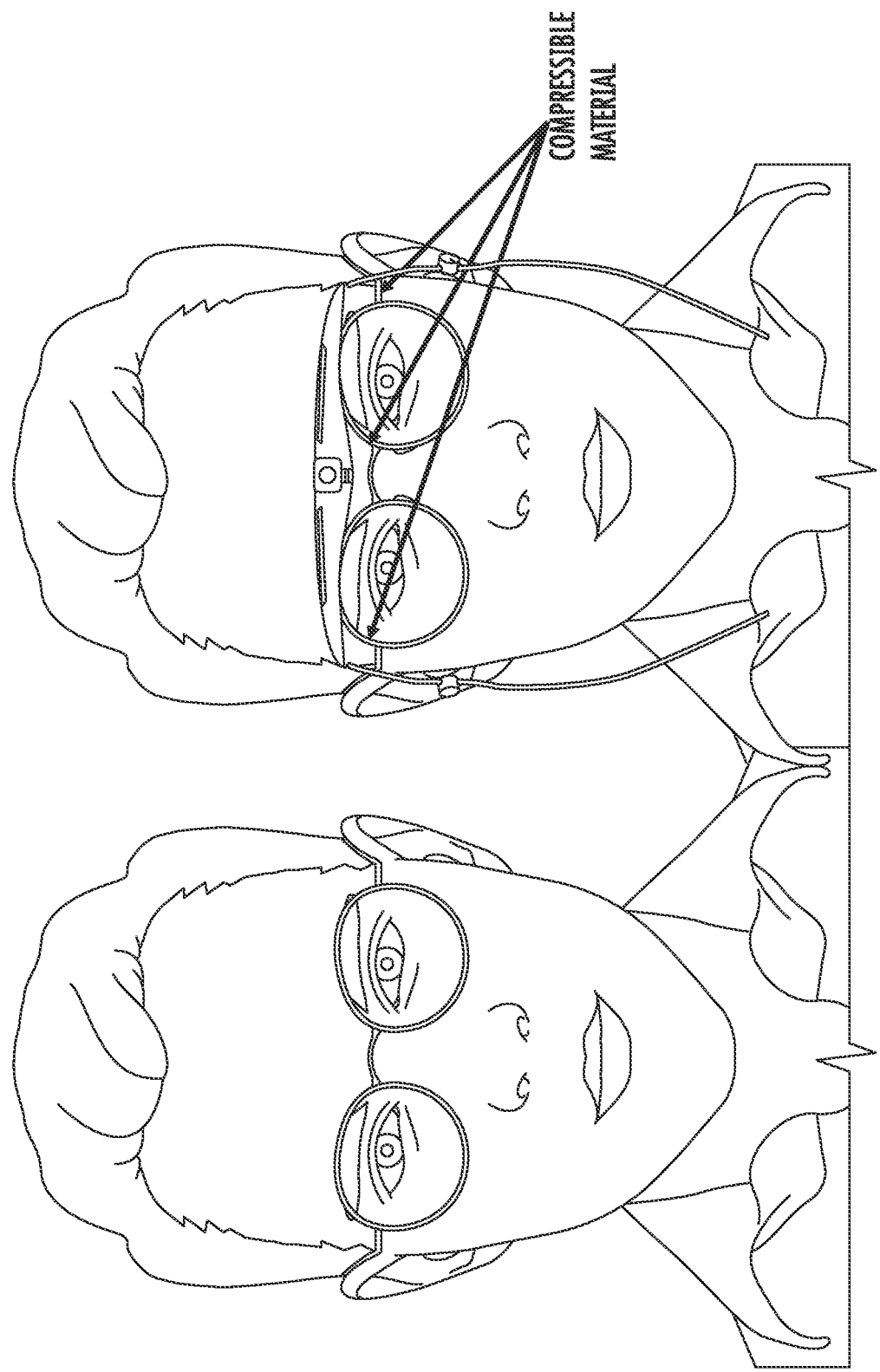
FIG. 13 is a schematic diagram of a depiction of one possible embodiment of the apparatus.
Figure 14:
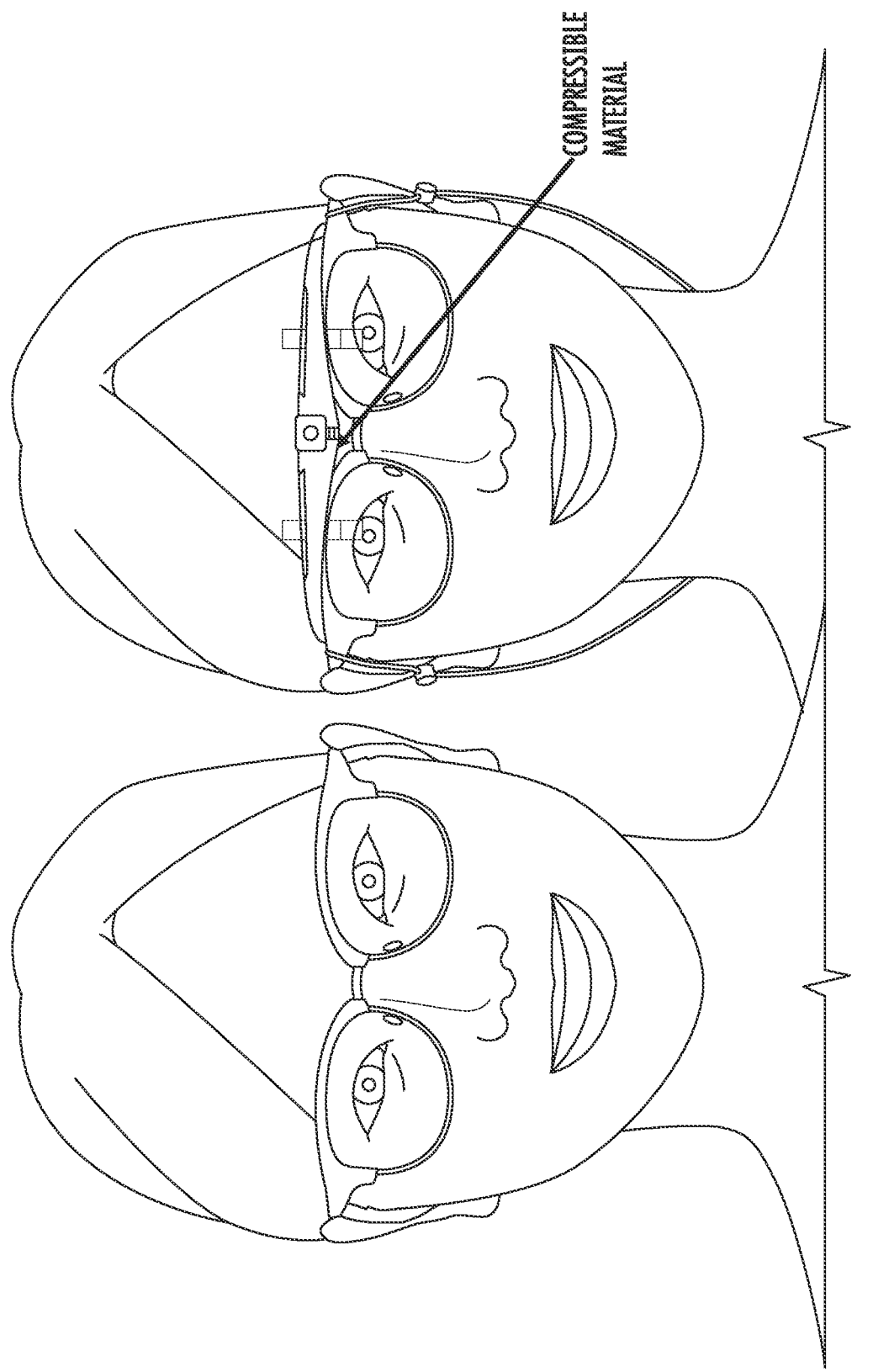
FIG. 14 is a schematic diagram of a depiction of one possible embodiment of the apparatus.

Eyewear comes in hundreds, if not thousands, of different styles, shapes, sizes and materials. (See, e.g., FIGS. 5-6.) For the purposes of minimizing the number or AR Unit main body SKUs (stock keeping units) and to allow the AR Unit's main body to look fashionable when applied to the eyewear frame, the AR Unit can comprise, by way of example only, one or more of a compressible and/or formable material. In certain embodiments, the AR Unit's main body will fit on the eyewear frame front. In other embodiments, the compressible material above the eyewear bridge and/or affixed to or embedded in the bottom area of the AR Unit's main body is preferred or necessary for proper fit. Because of the current invention's ability to fit many types of eyewear frames, one SKU (stock keeping unit) of a design of the AR Unit's main body can be optimized to fit a plurality of different eyewear shapes and sizes. (See, e.g., FIGS. 7, 45-48.) A separate part can be attached to the one SKU design to enhance the cosmetic appearance and/or fit of the AR Unit's main body attached to certain eyewear shapes, if necessary. The separate part can be a façade that is utilized to cover open space formed when the AR Unit's main body is fitted upon the top of the eyewear frame front. In most but not all cases, a façade is utilized between certain locations under the AR Unit's main body and above the top of the frame front. By way of example only, a façade can be used to fit beneath the bottom of the AR Unit main body and the top of the eyewear frame front superior to the bridge area. In still other cases, multiple facades can be used to cover up multiple openings formed under the AR Unit's main body and superior to the top of the eyewear frame front. The separate part can be offered as multiple separate parts (or facades) of different sizes or shapes to the consumer thus allowing for further improved fit and/or cosmetic enhancement of the AR Unit's main body for even a larger number of different eyewear shapes and sizes. In certain embodiments a kit of facades are included with the sale of the AR Unit. The separate part can be rigid, compressible, or conformable, depending on the spatial relationship of the bottom of the AR Unit's main body and the top of the eyewear frame located above the bridge of the eyewear front. The invention disclosed herein allows for one AR Unit's main body to fit a plurality of different eyewear styles and sizes, allowing a limited number of different AR Unit main body shapes to fit a majority of eyewear styles and sizes. The invention disclosed herein allows for a limited number of different AR Unit main bodies utilizing one or more of a compressible material, façade, flexible structure of the AR Unit's main body, and/or shapeable portions of the AR Unit's main body such as (by way of example only) the outer AR Unit's main body covering, to fit the majority of eyewear styles and sizes. For example, the invention disclosed herein allows for five or fewer different AR Units utilizing one or more of a compressible material, façade, flexible structure of the AR Unit's main body, and/or shapeable portions of the AR Unit's main body such as (by way of example only) the outer AR Unit's main body covering, to fit the majority of eyewear styles and sizes. In cases, no compressible material will be needed for adequate attachment to the eyewear frames. (See, e.g., FIG. 12.) In aspects, a portion of the augmented reality device is flexible, whereby a bendable member is housed within or attached to the flexible portion and whereby the flexible portion of the augmented reality device supporting a bendable member rests on top of an eyewear frame front. It should be pointed out, that certain embodiments of the AR Unit invention disclosed herein can be flexible and others are not flexible but can be rigid.

In certain embodiments, the AR Unit has all or part of its memory and/or computational requirements off loaded from the AR Unit to that of a remote and/or mobile device. By way of example only, a cell phone or smart phone case, a smart mobile unit, or a CPU, supports or includes remote memory and a CPU for the AR Unit, whereby the remote memory and/or CPU communicates with the AR Unit wirelessly or by wire. In embodiments, the cell phone case or smart mobile unit, or CPU, would comprise the necessary electrical components required to provide such wireless or wired communication, memory storage and/or retrieval, and remote computation.

Figure 40:
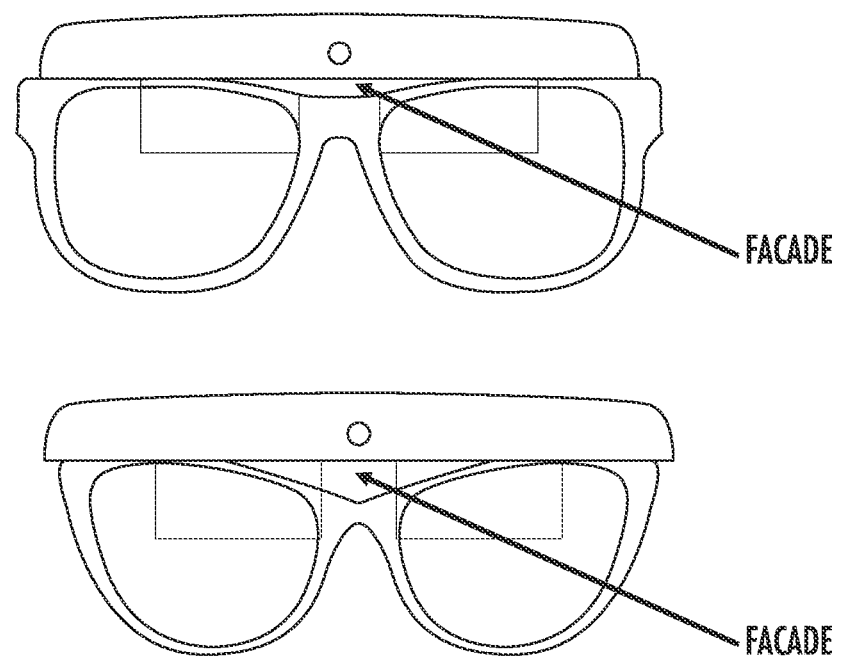
FIG. 40 is a schematic diagram of a depiction of one possible embodiment of the apparatus.

As shown in FIGS. 34-37, in certain embodiments, a separate part 3410, 3510, 3610 which acts as a facade can be attached to the AR Unit's main body as illustrated herein when needed (see also, e.g., FIGS. 10 and 45-48). The separate part acts as a façade covering the open space (hole) 3420, 3520, 3620 over the eyewear bridge 3430, 3530, 3630. In one embodiment of the invention, multiple separate parts would be included as a kit when the AR Unit is sold (see, e.g., FIG. 37). In certain other embodiments, one manually adjustable pull-down member found within the AR Unit's main body can be used to cover an open space above the bridge of the eyewear and beneath the middle of the AR device when the augmented reality device is positioned on the top of the eyewear front. (See, e.g., FIG. 40.) By incorporating one pull down member within the bottom of the AR Unit's main body, it acts as a façade covering an open space that will appear when an AR Unit's main body is attached to different sizes or different eyewear frame styles. The middle member can be pulled down further to cover a larger open space or less far to cover a smaller open space. When a pull-down member is utilized as a façade, it is integral with that of a portion of the AR Unit's main body. When a separate part is utilized, it can be part of a kit of separate façade parts. The separate facade parts can be attached to the AR Unit's main body to cover the open space above the bridge of the eyewear frame from which the AR Unit rests upon. The separate façade part can be attached to the AR Unit's main body by way of example only, a pressure connection, slide in connection, magnetic connection, mechanical joint, or male-female mechanical connection.

Figure 46:
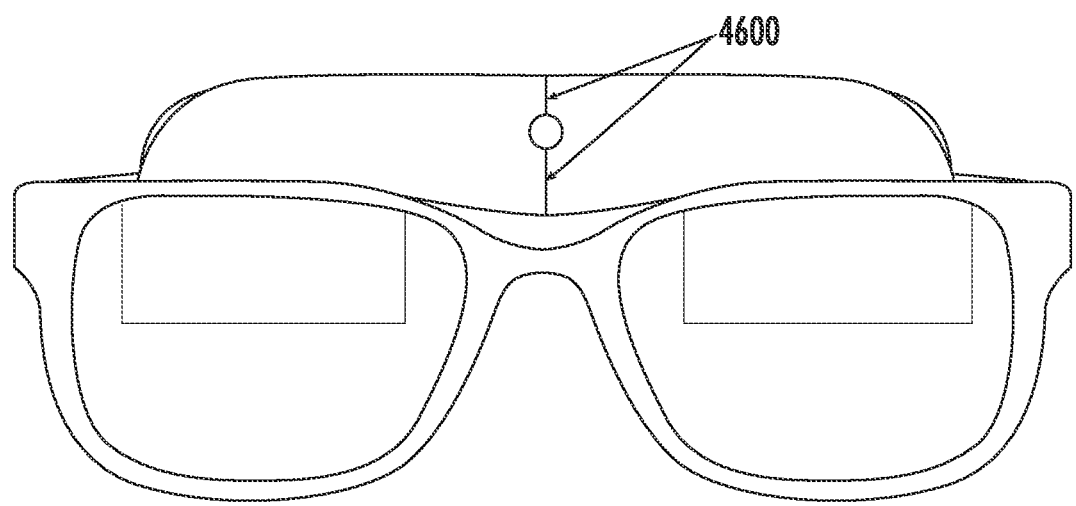
FIG. 46 is a schematic diagram of a depiction of one possible embodiment of the apparatus.
Figure 47:
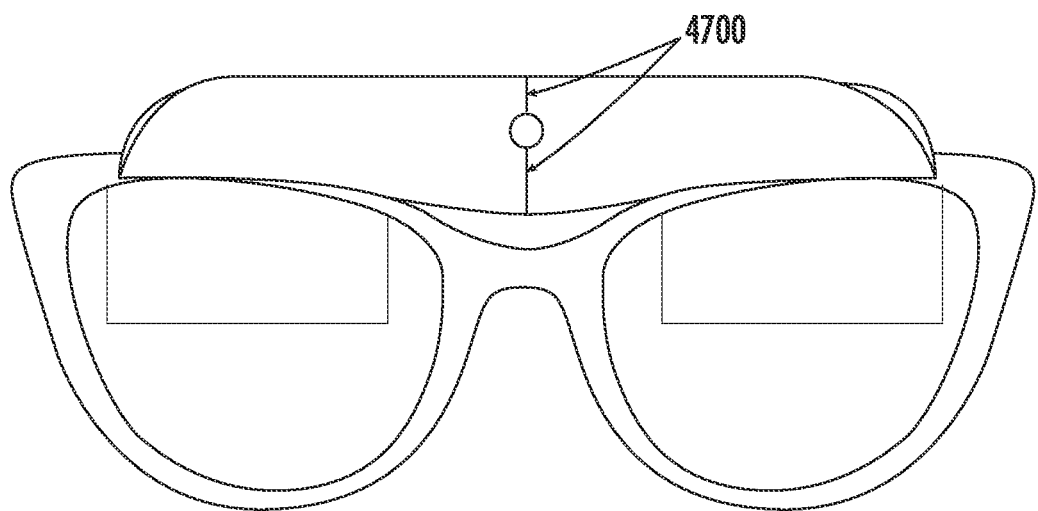
FIG. 47 is a schematic diagram of a depiction of one possible embodiment of the apparatus.
Figure 48:
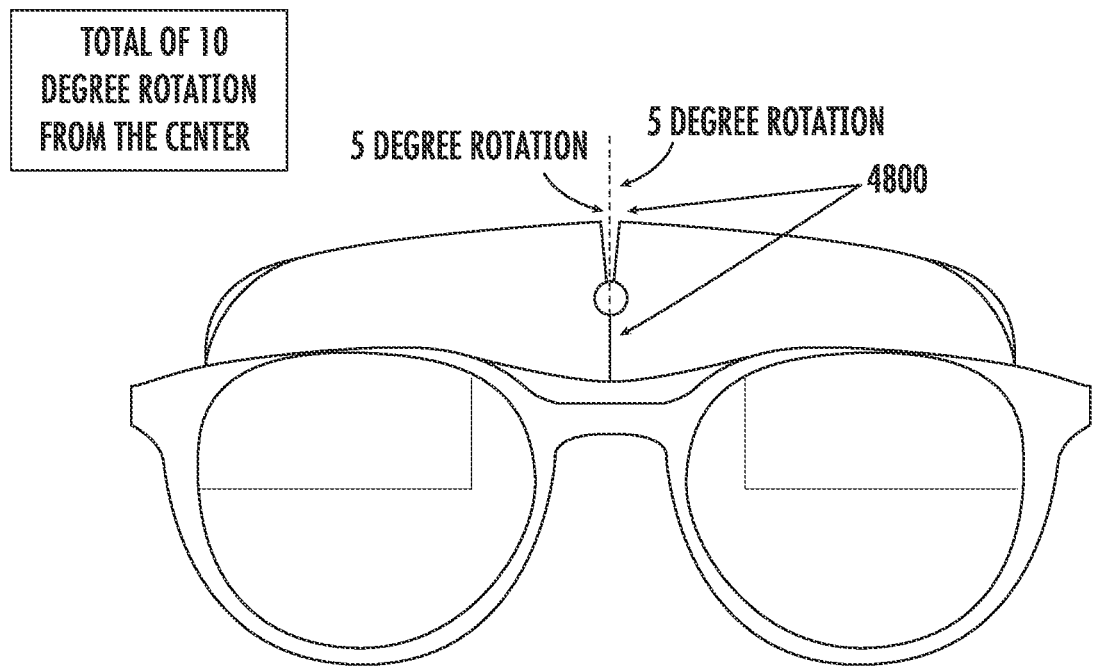
FIG. 48 is a schematic diagram of a depiction of one possible embodiment of the apparatus.

As shown in FIGS. 46-48, in one embodiment, the AR Unit's main body can have a dividing line 4600, 4700, 4800 that separates the right half from the left half. The dividing line allows for the right half to be flexed or rotated from the left half, or vice versa. (See, e.g., FIGS. 46-48; see also FIG. 51.) The degree of rotation or flex can be, in aspects, within the range of 0.5 degrees to 25 degrees. A preferred range is between 5 degrees and 15 degrees. In a preferred embodiment, the "total" degree of rotation or flex is 10 degrees relative to one another (either half). When the AR Unit is flexed in the middle, one or both optical windows can be rotated clockwise or counter clockwise, or otherwise adjusted, to remain properly aligned to receive and display an AR image to the wearer as described herein. In certain embodiments, the right half and the left half remain attached and rotate or flex by way of a mechanical member, hinge, formable member, and/or joint. In still other embodiments, the right half and the left half are totally separated and are two distinct parts.

Figure 49:
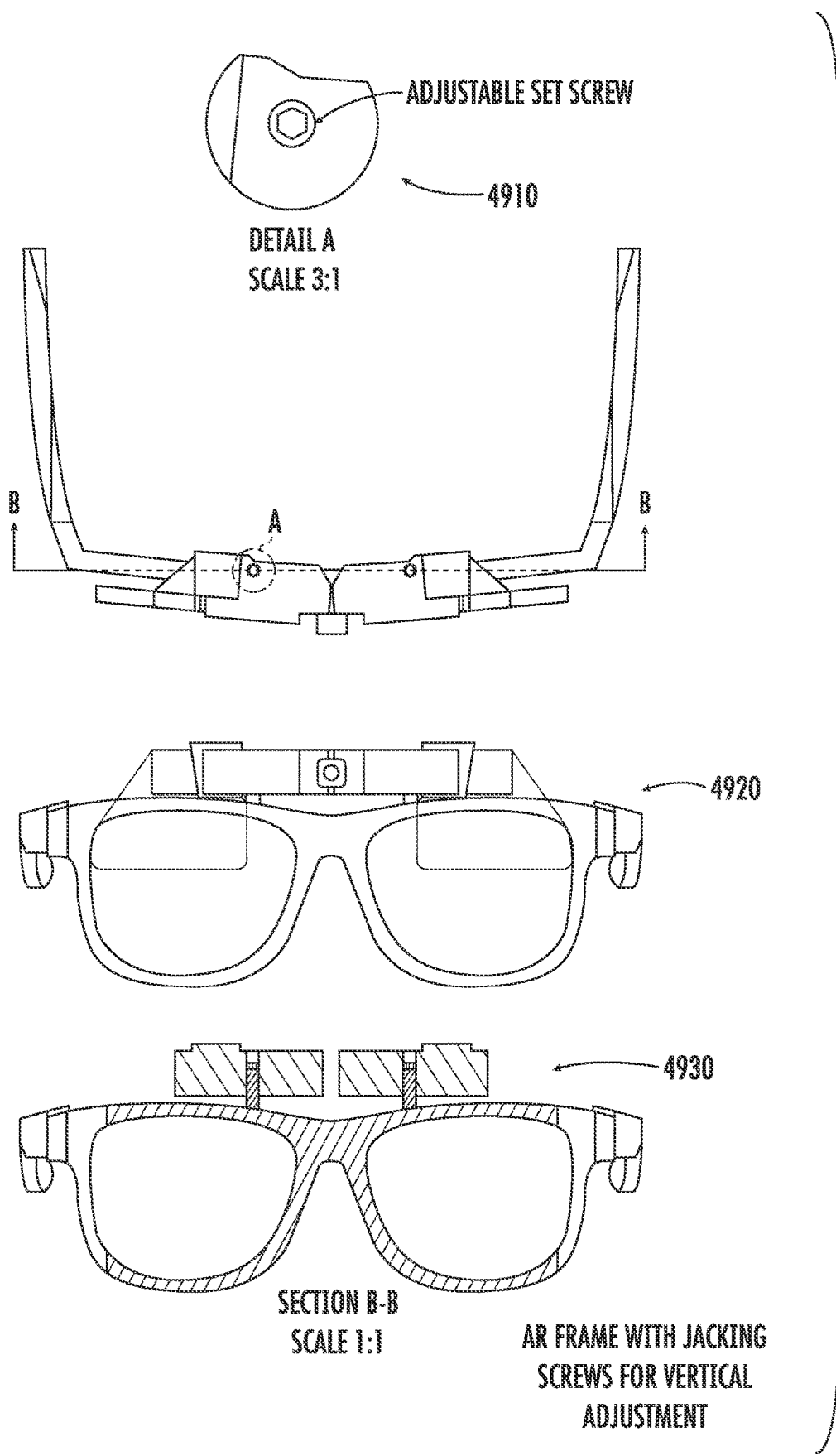
FIG. 49 is a schematic diagram of a depiction of one possible embodiment of the apparatus.

As shown in FIG. 49, the AR Unit's main body may be raised and lowered above the eyewear frame front to which it is resting upon. This can occur, for example, by way of any known mechanical means such as a set screw(s) 4910. This allows one or more of the wearer, technician, seller, or optician to adjust the AR Unit's main body up and down such to align the optical window and/or the optical combiner to be positioned as desired in relation to the line of sight of the wearer, or in relation to a pupil(s) of the wearer. An optical window and/or optical combiner can be moved independently of the AR Unit's main body and/or camera 4930. An optical window and/or optical combiner can be moved as the AR Unit's main body and/or camera is moved 4920. An optical window or optical combiner can be moved by way of example only, one or more of counterclockwise, clockwise, along the X axis, along the Z axis, and/or along the Y axis.

In certain embodiments, a tap (or series of taps) of the AR Unit's main body, eyeglass frame, or more specifically an eyeglass temple, can turn on and/or off the AR Unit. In certain embodiments, a tap (or series of taps) of the AR Unit, eyeglass frame, or more specifically an eyeglass temple, captures an image or video image with a camera or cameras, or image capture device that is associated with the AR Unit. (In certain embodiments, the camera may be spring-loaded (see, e.g., FIG. 11).) In other embodiments, the camera is located stationary with the AR Unit's main body. In aspects, a voice command turns on or off the AR Unit. In aspects, a voice command triggers a camera or cameras that is associated with the AR Unit to capture an image or video. In aspects, a blink of an eye(s) by the wearer turns on or off the AR Unit, or triggers a camera that is associated with the AR Unit to capture an image or video. In aspects, a jerk or movement of the head turns on or off the AR Unit. The electrical tether or AR Unit's main body may comprise a capacitive switch which allows for, by way of example only, a swipe to turn the AR Unit on and, for example, an opposite swipe to turn the AR Unit off. In certain embodiments, a tilt switch can turn the AR Unit on or off. When the head is looking straight ahead without the wearer's head tilted, the tilt switch can turn the unit off. However, when the wearer's chin is tilted down the AR unit can turn itself on. The AR Unit can use AI (artificial intelligence) to learn to differentiate between when the wearer desires to see AR and when the wearer is just looking down by tilting his or her head. Feedback for the wearer on the status of the AR Unit or camera may be provided by a vibrator, buzzer, bell, light, personal assistant, acoustic system, or other ways of communicating with the wearer.

Figure 58:
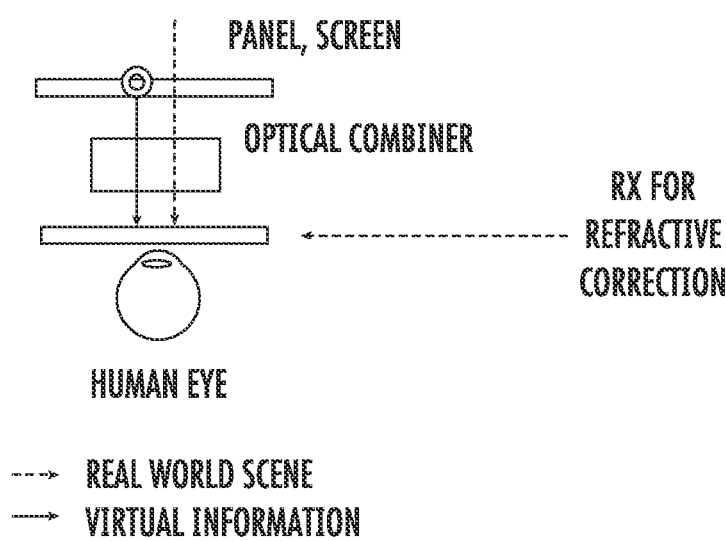
FIG. 58 shows a possible configuration for an OLED combiner embodiment.
Figure 59:
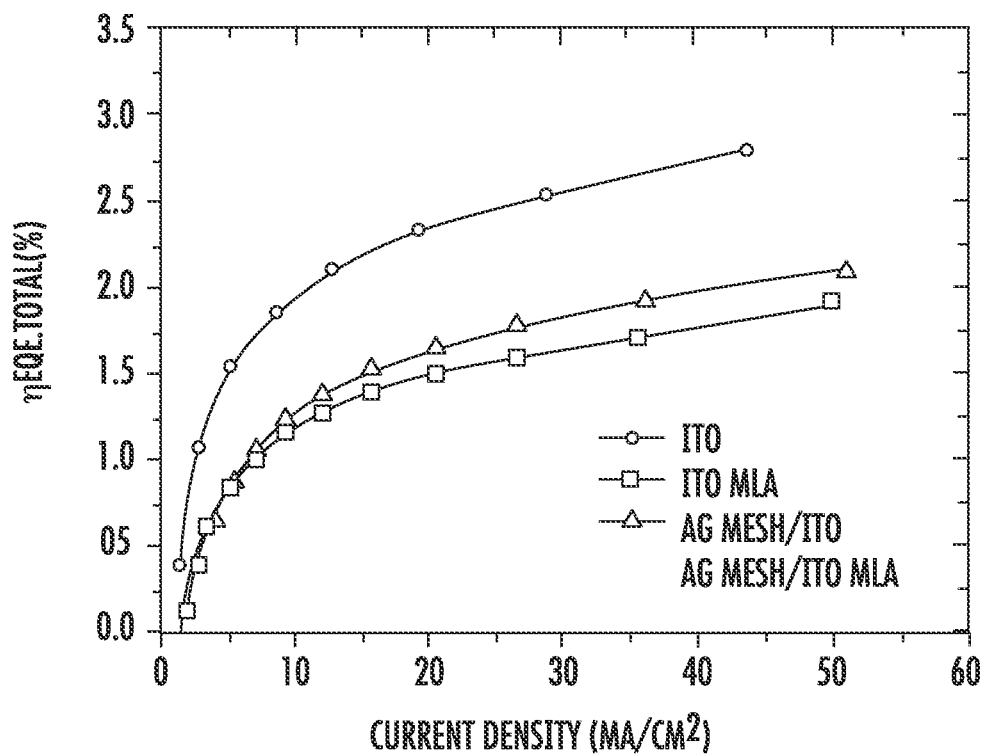
FIG. 59 shows a plot of external quantum efficiency vs. current density with different substrates.

In certain embodiments, a mostly transparent (or semi-transparent) see-through OLED stack comprises an emissive layer (with four types of colored pixels: red, green, blue, and clear), either placed in a single layer or three overlapping layers (see, e.g., FIGS. 58 and 59). The multi-stack emissive layer is capable of improved resolution but lower transparency. The cathode and the anode may be made of transparent metal oxides, while the hole transport and injection layers may be made of transparent plastic materials. In embodiments, the transparency of the OLED stack is about 35%, but it may be as high as 50%, or as low as 10%, when, for example, the last layer in the stack shown in FIG. 59 is made partially reflective.

For the purposes of an embodiment using a see-through OLED optical combiner that is useful for the AR Unit disclosed herein, the see-through OLED transparency should range between 60%-75+%. When the transparency of the see-through OLED is below 70% the use of the AR Unit is impaired indoors, however the AR Unit can still be used outdoors. When the transparency of the see-through OLED is 70% or above, the AR Unit can be used both indoors and outdoors. In a preferred embodiment, the AR Unit utilizes one or two see-through optical combiners having a transparency of 70% or greater. In another preferred embodiment, the AR Unit utilizes one or two see-through OLEDs having a transparency of 75% or greater. The light transmission of the OLED can be enhanced by the use of a microlens array.

In certain embodiments, a semi-transparent OLED display supported by an optical window may be mounted on the inside or the outside surface of the optical window (as disclosed herein) and may be used to project augmented reality content onto the pupil. In certain embodiments, the OLED display can be the optical window. Such a semi-transparent display may be a see-through OLED that comprises a RGB stack and that is driven by a graphic processing unit. The semi-transparent OLED display compares with other display technologies in terms of brightness, field of view, and energy consumption (see, e.g., FIG. 60).

The see-through display may be mounted permanently on the AR device, or it may be mounted on an optical window. (See, e.g., FIG. 2.) It may take the place of the optical window such that it is enabled to be moved upwards or downwards, or it may be attached to an optical window that enables it to be rotated away when the AR device is not in use. (See, e.g., FIG. 29, 2920.) Accordingly, in aspects, the optical window(s) may be moved up and out temporally when the AR Unit or system is not being used. Alternatively, the optical window(s) can be left in a working position when the AR Unit or system is not being used and the optical window(s) can be raised vertically when the AR Unit or system is not being used. Preferably, the display pivots on its distal end, near the eyeglass frame hinge, and the rotation can take place either in the x,z or x,y planes. (For example, see, e.g., FIG. 22.)

The pixel size of the see-through OLED display may be in the range of 1.5-10 microns, preferably 2-3 microns. This display can be 4000×3000 pixels. The minimum pixel count is preferred to be 1×106 pixels. The upper limit of the pixel count is determined by the amount of power required to operate the display. Since OLEDS are current driven (they operate mostly between 2-4 volts), the maximum power of the display unit (for each eye) is 750 milliwatts, or about 1.5 watt for both displays, in aspects.

Use of a see-through OLED in the display also may serve to increase the field of view of the AR image. For example, a field of view of up to 100 degrees (e.g., a range of 50-100 degrees) is possible. The binocular field of view of natural vision is about 110 degrees.

Figure 4:
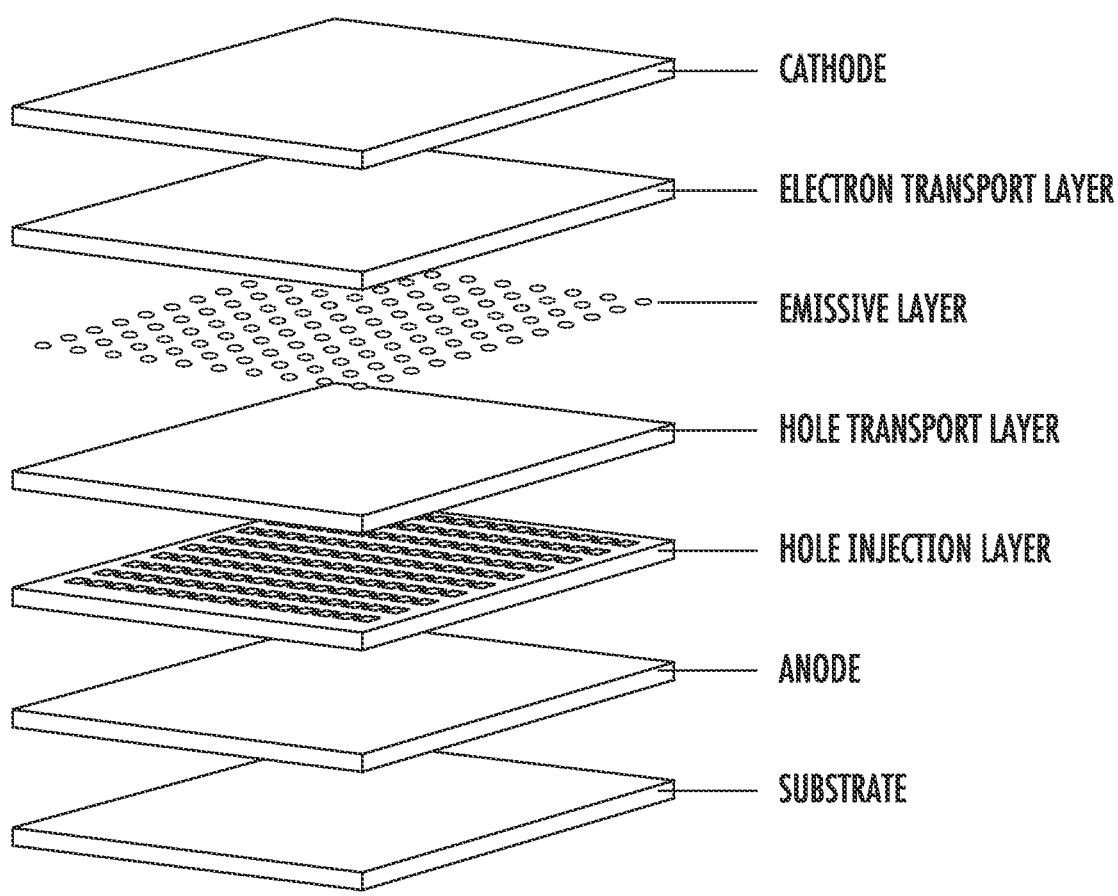
FIG. 4 is a schematic diagram of a depiction of one possible embodiment of the apparatus regarding a transparent OLED stack.

In a certain embodiment, a see-through OLED stack is used, as deposited on a transparent plastic film with barrier properties such as polyimide. The OLED stack is encapsulated in between two layers of flexible transparent plastic films for durability. The encapsulated stack may be further mounted on an optical window of the AR Unit's main body as taught herein. This plastic sheet may constitute an additional layer, or it may the same layer as the substrate. (See, e.g., FIG. 4 for a possible layered embodiment.) If one display is utilized, it may be monocular. If two displays are used, it may be binocular. The optical window(s) may be transparent or partially transparent. It may be coated with antireflective coatings. It may be photochromic, electrochromic, or thermochromic. In these embodiments, the optical window(s) can be darkened in environments with high ambient illumination in order to equalize the relative brightness of the real and the virtual images and lightened in other lighting environments where this is not needed.

Figure 3:
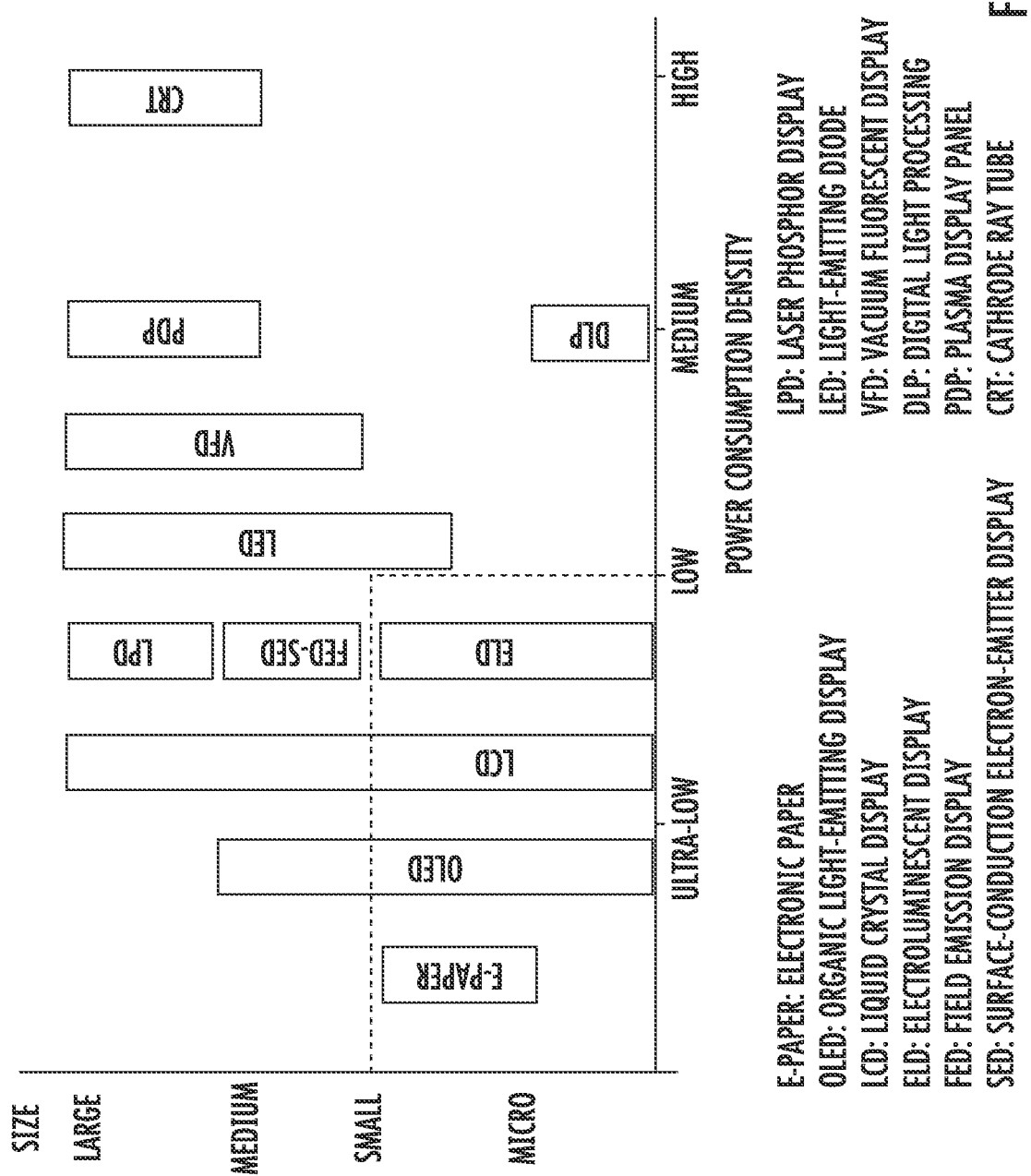
FIG. 3 is a graph showing possible embodiments of the optical window(s) according to the current invention.

When see-through OLED display(s) are utilized as the optical combiner(s), the AR Unit's main body can be reduced in size and weight. This is due to the fact that the number of components utilized in the light engine(s) and optical engine(s) can be reduced. In addition, in many cases the energy requirements of the AR Unit can also be reduced. (See, e.g., FIG. 3.)

When the optical combiner is a see-through OLED display(s) or the AR Unit utilizes a see-through OLED display (s), the see-through OLED display is capable of being used for, or as a component for, XR, AR, Virtual Reality, and/or Mixed Reality.

Turning to a few figures, regarding FIG. 58, in a preferred embodiment, the semi-transparent OLED stack is curved in a shape conformal to the eyeglass optics and is equal to or less than the area of the eyeglass optic and mounted on the eyeglass frame outside the eyeglass optic. In this position it forms the virtual image and projects it at infinity and thereby functions as a combiner. In a preferred embodiment, the semi-transparent OLED or see-through OLED may be shaped to conform with the outer curve of the lenses providing refractive correction. For this purpose, the substrate used for the semi-transparent OLED may be a thin, flexible transparent ceramic or glass, or a plastic film. Preferably the glass may be float glass. In one embodiment, the OLED stack may comprise an electrode layer that has been reinforced with a mesh made of a metal nanowire in order to improve transparency of the electrode layer and enhance its flexibility, enabling the semi-transparent OLED to be bent to a shape conformal to the eyeglass optic providing refractive correction.

Regarding FIG. 59, MLA is microlens array and Ag mesh is mesh made of silver nanowire. (See Shin, S-R, et al., "Improving light extraction of flexible OLEDs using a mechanically robust Ag mesh/ITO composite electrode and microlens array." in *J. Mater. Chem.*, 2018, 6, p. 5444). The enhancement factor caused by the addition of a layer of a microlens array was reported to be 1.55 in the aforementioned Shin article.

Figure 60:
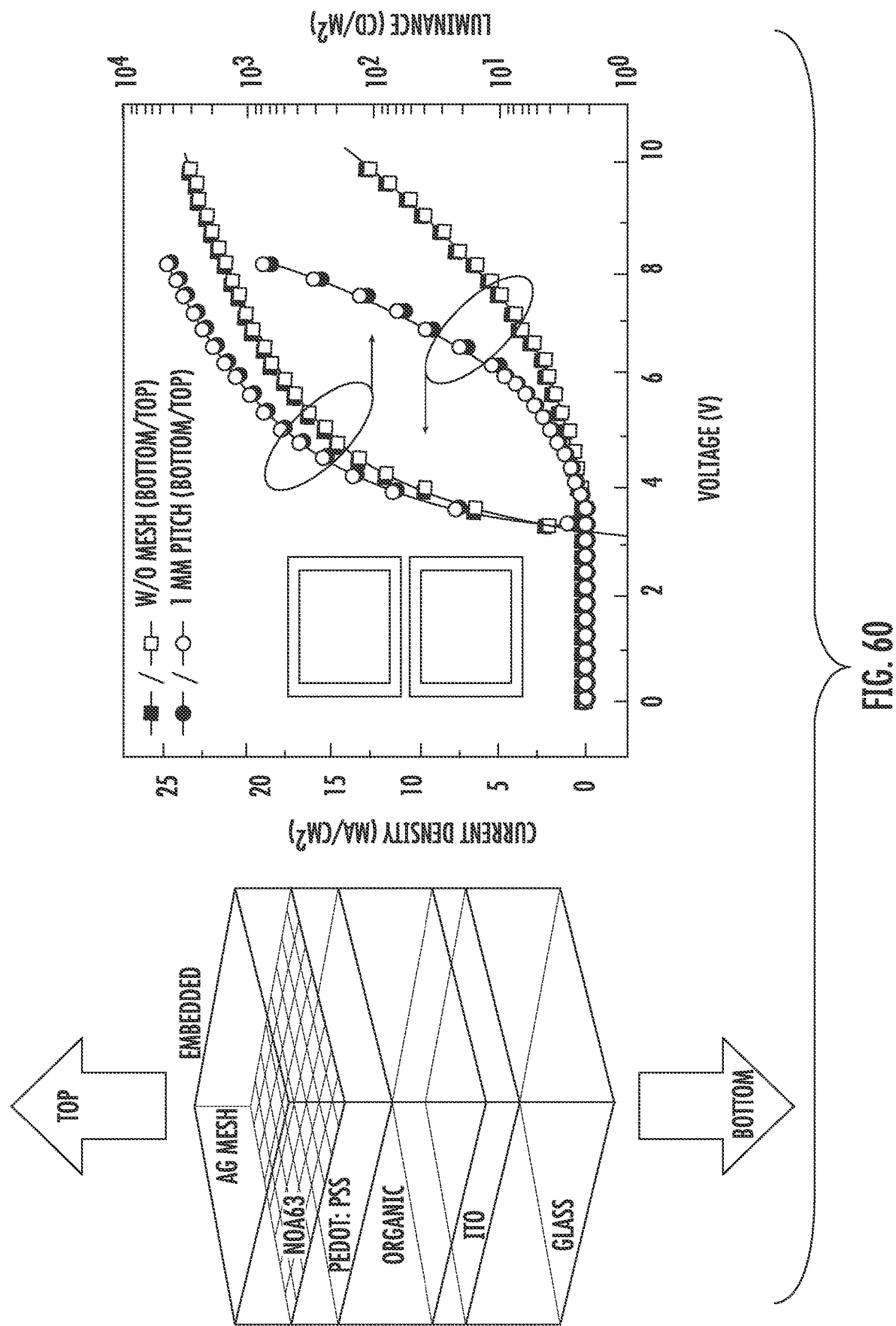
FIG. 60 shows possible layers of an OLED combiner embodiment.

Regarding FIG. 60, this is an example of an electrode layer powering a semi-transparent OLED reinforced with a mesh made of silver nanowires. Light emitted by the OLED stack is nearly Lambertian; in other words, it is emitted equally in all directions. In certain embodiments, the brightness of the virtual image created by the see-through display as perceived by the retina can be enhanced by providing a layer of transparent plastic with micro-lenses of the same size as the pixels in the OLED that collect and collimate the emitted beam. In certain embodiments, a microlens array may be incorporated as an additional layer in the OLED stack. The microlens array is readily formed by molding using a soft mold made of PDMS (polydimethyl siloxane), and combined with a transparent electrode such as an ITO electrode or an ITO electrode reinforced with a mesh made of silver nanowires. FIG. 60 also shows the improvement in mechanical flexibility of the OLED stack caused by introduction of metal nanowire reinforcement.

Figure 61A:
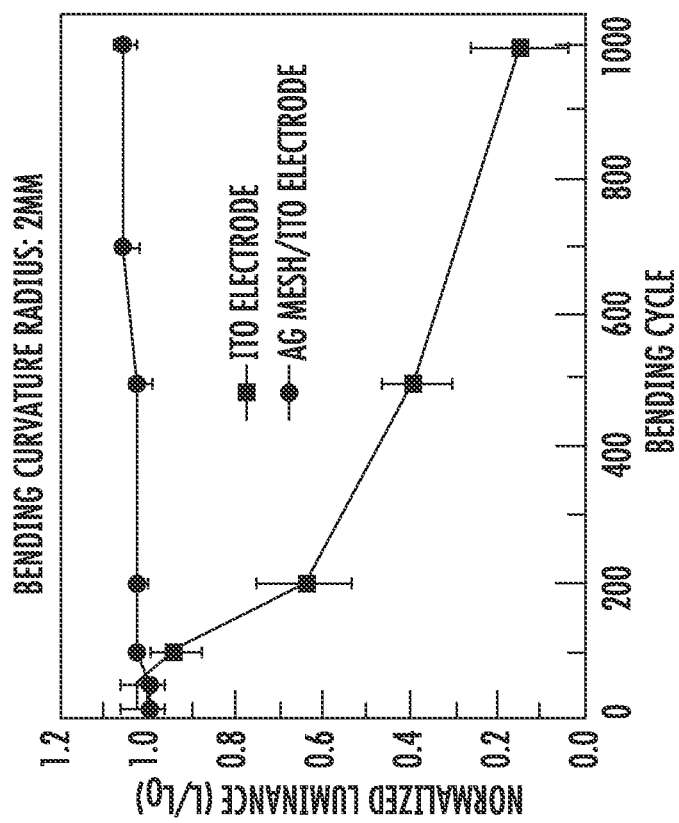
FIG. 61 shows graphs plotting normalized luminance vs. bending parameters.
Figure 61B:
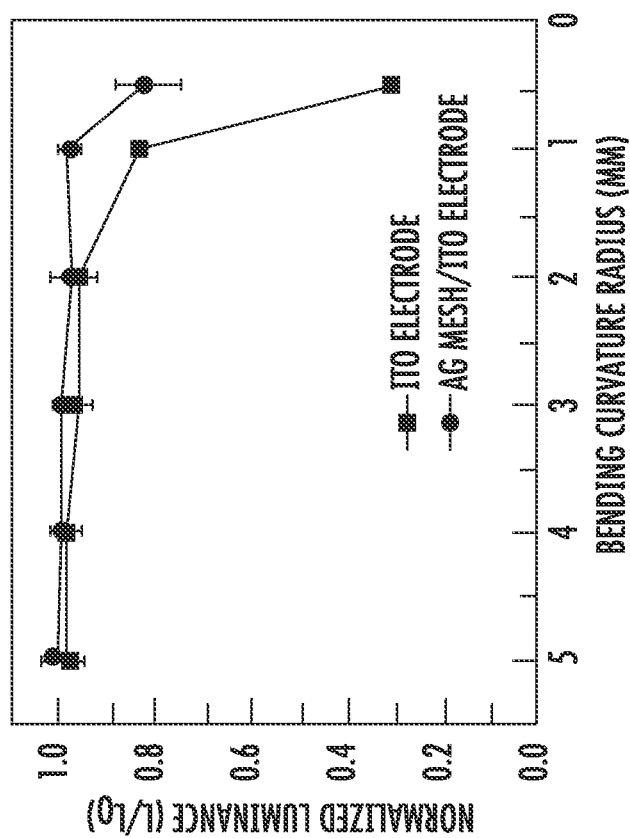

Regarding FIG. 61, it shows normalized luminance of ITO- and Ag mesh/ITO-based OLEDs versus (a) bending radius and (b) bending cycles.

Figure 62:
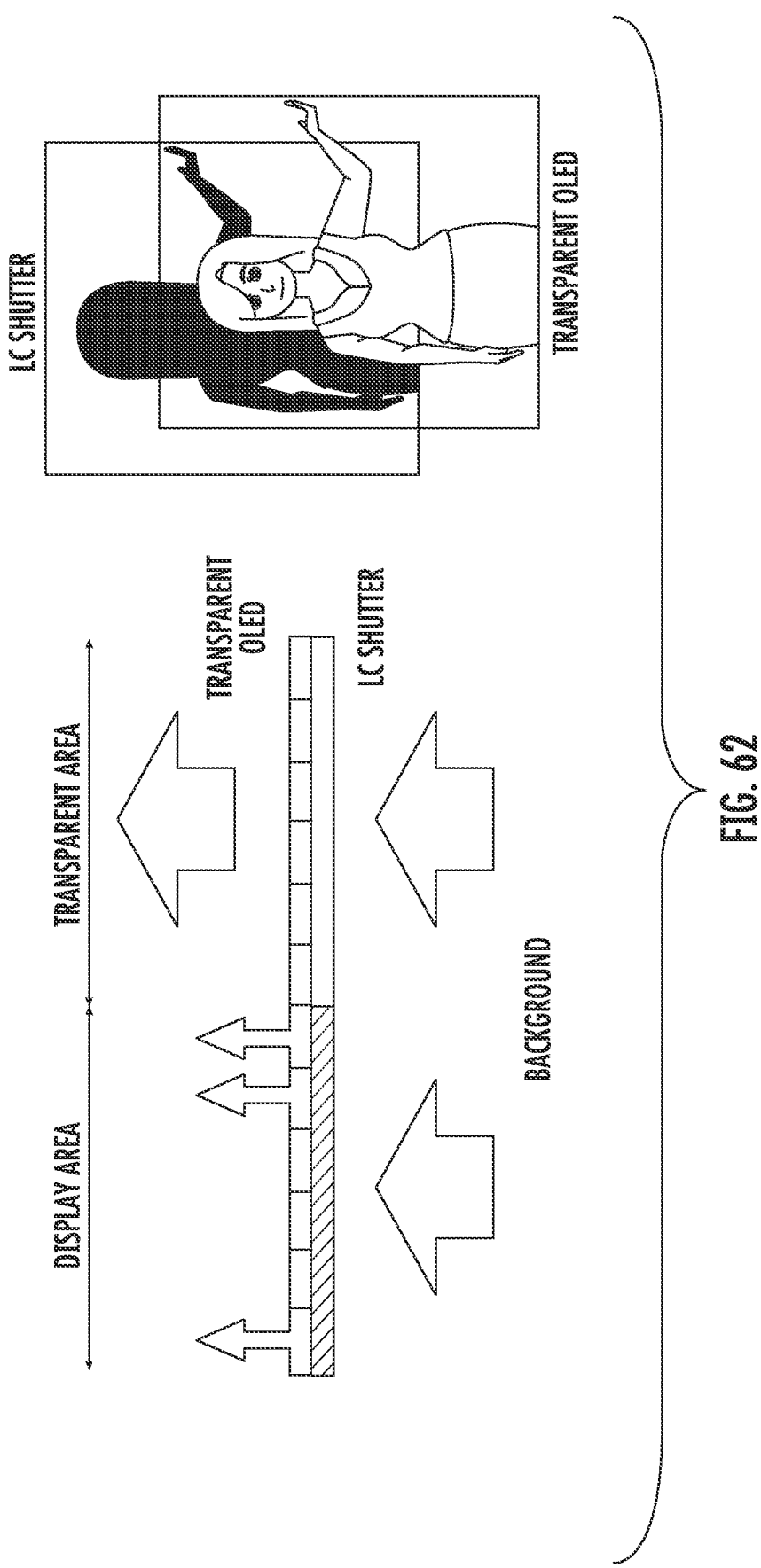
FIG. 62 is a schematic diagram of a depiction of one possible embodiment of the apparatus.

FIG. 62 shows that image intensity and image contrast of the virtual image may be further enhanced by adding a switchable optical shutter rendering the spaces in which the virtual image is black more perfectly black. In a preferred embodiment, a switchable dynamic optical shutter is added as an extra layer in the OLED stack, facing outwards. The shutter is pixilated and each pixel in the shutter can be addressed individually. The shutter is activated to cut off ambient illumination from being incident on the OLED only in the dark areas of the virtual image. A liquid crystal based dynamic switchable optical shutter, in embodiments, may improve image contrast of the virtual image.

Figure 11:
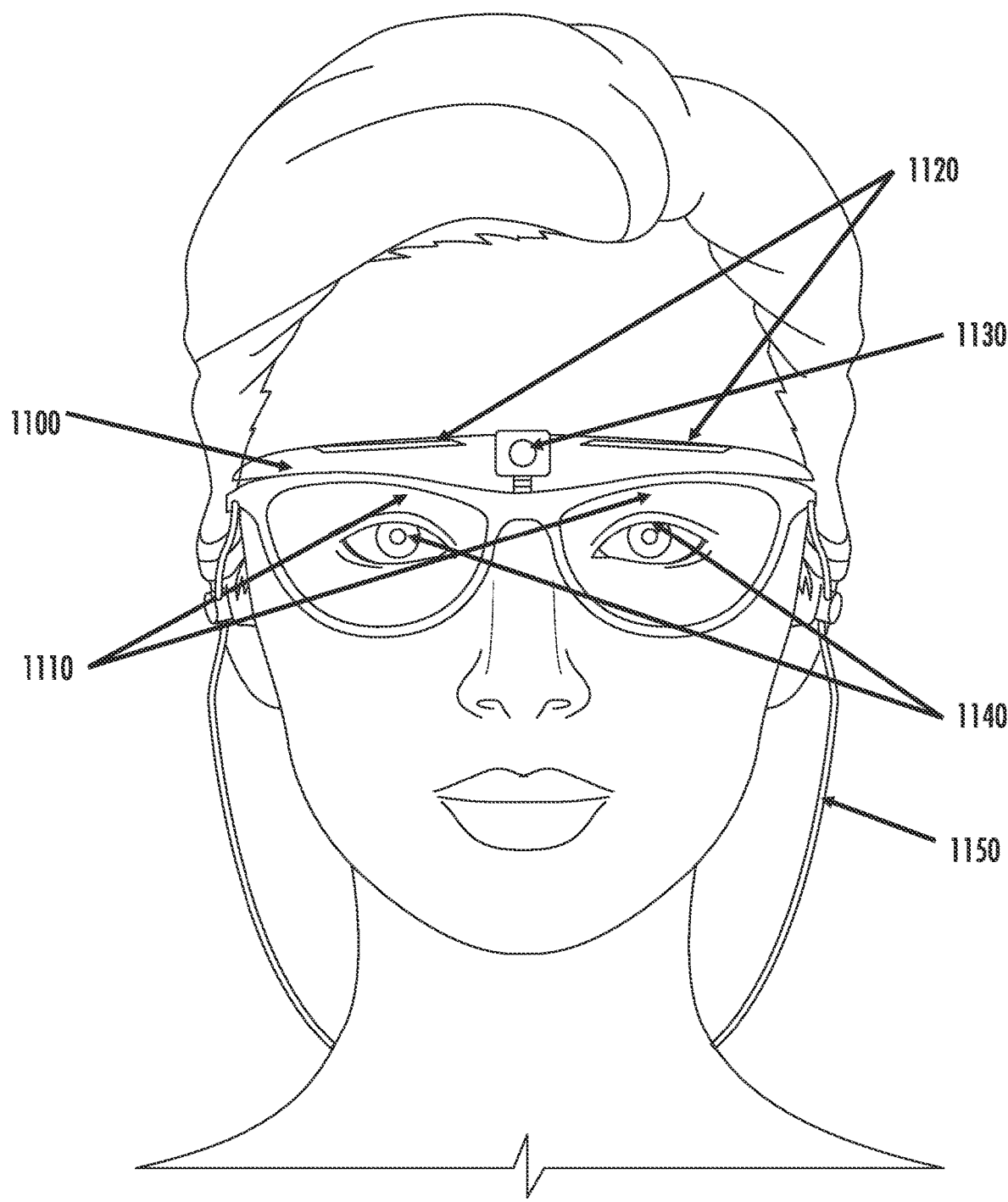
FIG. 11 is a schematic diagram of a depiction of one possible embodiment of the apparatus.

FIG. 11 shows the AR Unit supporting electronic and optical components 1100. Optical windows or substrates as taught herein are shown by 1110. The tops of the optical windows along with certain embodiments having possible slits for the optical windows to transcend are shown by 1120. A camera or image capture device (including a possible spring-loaded camera) and/or light source are shown by 1130. Optical combiners are shown by 1140. The electronic tether is shown by 1150. It should also be noticed the wearer has ear buds in this embodiment. The ear buds can be electrically wired/connected to the electrical tether of the AR Unit or wirelessly connected to the AR Unit.

The AR Unit can comprise one or more of the following or each of the following (this is by way of example only and not intended to be limiting):

a) Vision system; binocular or monocular b) SOC (system on a chip); Intel Atom QC835 quad core 10 nm c) Display; Lycos, LED Illuminated Display, OLED, OLED see-through display, micro display, reflective waveguide, diffractive waveguide, lightguide, projector d) OS (operating system); Glass OS 32 bit, android, iOS e) Memory RAM; within the range of 1 GB-10 GB f) Storage; within the range of 1 GB-200 GB g) Speaker/mic; right or left ear microarray, stereo speaker with multiple mic array h) Battery; within the range of 500 mAh-5,000 mAh, lithium polymer, solid state, wired charged, wirelessly charged i) Camera or image capture device; 5 MP-20 MP, 720 fps-1280 fps, HD video with still photo capability, timer, date, and/or a courtesy light for alerting an individual whose image is being captured that their image is being captured by the camera of the AR Unit (for a photograph or video) can be part of the AR Unit j) Communication system; dual band 2.5, 5 Ghz 802.11a/b/g/n/ac, 802.11ac, BT5.0, BT3.0 AVRCP (remote), GPS, GIONASS, Wifi, timer k) Sensors; ALS digital compass, eye tracking, wink, blink, head, barometer, accelerometer, motion, gyroscope, magnetometer, capacitance switch, humidity, pedometer, temperature, tilt, UV, blue light, light, and/or radioactivity l) Input; capacitive touch, touch, tap, tilt, touch screen, voice, sound, touch switch, hand gesture, blink, forced blink, wink, personal assistant m) Feedback; vibration, acoustic, sound, visual, personal assistant, light n) Energy Harvesting; solar, movement, thermal differential o) Weight; within the range of 30 grams-250 grams p) Outer covering; sealed, water proof, water resistant, sweat proof, sweat resistant q) Structure; portion or all of outer covering flexible, shapeable, bendable Certain aspects of the invention are as follows:

Aspect 1 is a wearable apparatus capable of providing a virtual image, wherein the apparatus comprises one or more light engines for producing a virtual image and one or more optical engines for combining the virtual image with a real image as perceived by the wearer of the apparatus, wherein the apparatus further comprises a housing, wherein the housing covers at least a portion of electronic and optical components, wherein a structure in a bottom surface of the housing attaches to a top surface of an eyewear frame, wherein the housing can be adjusted to fit a plurality of different eyewear frames and wherein the apparatus is attachable to and detachable from a plurality of different eyewear frames.

The wearable apparatus of Aspect 1, wherein the apparatus is adjustable so that the bottom of the virtual image is located at or above the top edge of the pupil of the wearer of the apparatus as the wearer is looking directly forward.

The wearable apparatus of Aspect 1, wherein the housing comprises one or more first portion attached to lens(es) or aspect(s) securing the lens(es) of the eyewear frame, including eyeglass rims, one or more second portion attached to temple(s) of the eyewear frame, and one or more moveable supporting arm adjustably connecting the one or more first portion to the one or more second portion.

The wearable apparatus of Aspect 1, wherein the optical engine comprises an LED, LCD, or OLED display.

The wearable apparatus of Aspect 1, wherein the apparatus is capable of providing binocular augmented reality.

The wearable apparatus of Aspect 1, wherein the apparatus is capable of providing binocular mixed reality.

The virtual image of Aspect 1, wherein the virtual image can be one of a hologram, image, text, number, and/or sentence.

The virtual image of Aspect 1, wherein the virtual image can scroll, move, rotate, and/or remain stationary.

The wearable apparatus of Aspect 1, further comprising one or more optical combiner, wherein a portion of the one or more optical combiner or a substrate attached to the one or more optical combiner is either electrochromic or photochromic.

The wearable apparatus of Aspect 1, wherein an adjustment of the housing is performed by reshaping the housing where it meets the eyewear frame.

The wearable apparatus of Aspect 1, wherein the apparatus comprises one or more cameras.

The wearable apparatus of Aspect 1, wherein the apparatus comprises one or more motion detectors.

The wearable apparatus of Aspect 1, wherein the apparatus comprises one or more vibration detectors.

The wearable apparatus of Aspect 1, wherein the apparatus comprises one or more geolocation components.

The wearable apparatus of Aspect 1, wherein the apparatus comprises one or more clocks and/or timers.

The wearable apparatus of claim 1, wherein the apparatus includes one or more eye tracking components.

The wearable apparatus of Aspect 1, wherein the apparatus includes an electrical tether that extends behind the neck or head of the wearer, wherein the electrical tether couples one or more battery, electrical components, and/or computer processing components, to the housing.

The wearable apparatus of Aspect 1, wherein the apparatus includes an electrical power source located within an electrical module located behind the neck or head of the wearer.

The wearable apparatus of Aspect 1, wherein the apparatus communicates wirelessly to the internet or other electronic device.

The wearable apparatus of Aspect 1, wherein the apparatus is releasably attachable to one or both eyewear temples.

The wearable apparatus of Aspect 1, wherein the apparatus utilizes energy harvesting.

The wearable apparatus of Aspect 1, further comprising a releasably coupled visor or other attachable and detachable structure for harvesting solar energy to in whole or in part provide power to the apparatus.

The apparatus of Aspect 1, wherein the housing comprises a flex joint capable of providing for rotation of two halves of the housing to separate from and rotate away from one another with a degree of rotation of up to 25 degrees.

The apparatus of Aspect 1, wherein the optical engine is capable of being raised or lowered relative to the eyewear frame independently or together with a camera.

The apparatus of Aspect 1, comprising one or more or all of the following:

one or more camera;

one or more battery;

electrical components;

computer processing components;

one or more electrical tether for coupling the one or more battery, the electrical components, and/or the computer processing components to the housing; and one or more arms and one or more temple connector.

The apparatus of Aspect 1, wherein one or more of the optical windows, optical combiners, and/or optical engine is square, rectangular, circular, trapezoidal, or triangular.

The apparatus of Aspect 1, wherein one or more of the optical combiners is longer than it is wide, or is wider than it is long.

The apparatus of Aspect 1, wherein one or more of the optical windows has optical power or no optical power.

The apparatus of Aspect 1, wherein one or more of the optical windows is at least the same width as a lens of the eyewear.

The apparatus of Aspect 1, wherein the apparatus provides for a field of view of 50-100 degrees.

The apparatus of Aspect 1, wherein the structure is one or more recess and/or one or more pin and/or one or more screw, and/or one or more ridge.

The apparatus of Aspect 1, wherein the housing is capable of being raised and lowered in various positions relative to the eyewear frame.

The apparatus of Aspect 1, wherein a fiber optic delivery system comprises a plurality of optical fibers ending in an optical coupling device comprising one or more lens and one or more prisms or one or more layers of partially transmissive films.

The apparatus of Aspect 1, wherein an optical window is provided that comprises an OLED stack deposited on a transparent or partially transparent film with barriers such as polyimide.

The apparatus of Aspect 1, further comprising a releasably coupled visor for harvesting solar energy to in whole or in part provide power to the apparatus.

The apparatus of Aspect 1, wherein the housing and/or the optical engine are adjustable so that the bottom of the one or more optical window and/or one or more optical combiner is located above the pupil of a user as the user is looking straight forward.

The apparatus of Aspect 1, wherein one or more of the optical combiners is disposed above a top edge of a user's pupil.

The apparatus of Aspect 1, wherein the housing comprises one or more first portion attached to the lens(es) or aspect(s) securing the lens(es) of the eyewear frame, including eyeglass rims, one or more second portion attached to the arm(s) of the eyewear frame, and one or more moveable supporting arm adjustably connecting the one or more first portion to the one or more second portion.

The apparatus of Aspect 1, wherein the light engine comprises a substrate comprising a plurality of waveguides, and wherein the light engine is optionally detachable from the housing, and wherein the substrate is independent of adjustments or bends to the housing.

The apparatus of Aspect 1, wherein the housing does not extend beyond an outside side and/or edge of arms of the eyewear frame to which it is removably attached.

The apparatus of Aspect 1, further comprising an attachable and detachable, adjustable, and/or slideable portion of the housing, or the structure in the bottom surface of the housing, to wholly or partially cover an opening existing between the housing and/or structure and a bridge and/or a top bar of eyewear frames to which the housing and/or structure is removably attached.

The apparatus of Aspect 1, wherein the one or more optical window and/or one or more combiner is adjustable in the x, y, and z axes and/or in the horizontal, vertical, diagonal, clockwise, and/or counterclockwise directions.

The apparatus of Aspect 1, wherein the housing is bendable and/or adjustable without changing the orientation of the optical engine and/or light engine.

The apparatus of Aspect 1, wherein the housing is bendable and/or adjustable and whereby the light engine is connected to the bendable and/or adjustable housing by a rigid structure, whereby two or more optical windows and/or two or more combiners of the light engine remain at a fixed distance from one another and in a fixed orientation regardless of how the housing is bent and/or adjusted.

The apparatus of Aspect 1, wherein a portion or all of the center portion of the housing is rigid, and a portion or all of the two ends of the housing are bendable and/or adjustable, whereby the one or more optical window and/or one or more optical combiner are not altered if a user bends or adjusts the housing.

The apparatus of Aspect 1, further comprising at least one camera.

The apparatus of Aspect 1, further comprising two or more cameras.

The apparatus of Aspect 1, further comprising two or more cameras wherein the cameras are spaced at a distance of between 1 mm and 50 mm from one another.

The apparatus of Aspect 1, wherein one or more of the optical windows is attachable to and/or detachable from the housing.

The apparatus of Aspect 1, wherein one or more of the optical windows is attachable to and/or attachable to the housing magnetically.

The apparatus of Aspect 1, further comprising a single optical window comprising an optical combiner for each of a user's eyes, wherein the optical combiner is only a portion of the area of the optical window or occupies the entire area of the optical window.

The apparatus of Aspect 1, wherein all or part of the forward facing portion of the housing protrudes away from the head of a user.

The apparatus of Aspect 1, further comprising a compressible material disposed between the bottom surface of the housing and the eyewear frame.

The apparatus of Aspect 1, wherein the one or more optical window comprising one or more display is transparent, semi-transparent or translucent.

The apparatus of Aspect 1, wherein one or more display is mounted on an inside surface or an outside surface of the one or more optical window or is incorporated into the one or more optical window.

The apparatus of Aspect 1, wherein the one or more optical window is one or more lens of the eyewear.

The apparatus of Aspect 1, wherein one or more of the optical windows is disposed outside a lens of the eyewear or between the lens and a user's eye.

The apparatus of Aspect 1, wherein one or more of the optical windows is disposed outside a lens of the eyewear and the image is matched to a reality image in terms of magnification, convergence and/or accommodation.

The apparatus of Aspect 1, comprising two optical engines, two optical windows and two displays.

The apparatus of Aspect 1, wherein one or more of the optical windows is capable of being raised vertically relative to the eyewear frame, and/or rotated clockwise or counterclockwise relative to the eyewear frame, and/or rotated away from the eyewear frame.

The apparatus of Aspect 1, wherein one or more of the optical windows is moveable in a manner such that one or more display is moveable in and out of a line of sight of a user of the eyewear.

Aspect 2 is a wearable apparatus capable of providing a virtual image, wherein the wearable apparatus is attachable to and detachable from a plurality of different eyewear frames, wherein the apparatus is capable of attaching to the top of a plurality of different eyewear frames, wherein the apparatus comprises one or more light engines for producing a virtual image and one or more optical engines for combining the virtual image with a real image as perceived by the wearer of the apparatus, wherein the optical engine includes one or more optical combiner and wherein the bottom edge the one or more optical combiner is positioned at or above the top edge of the pupil of the wearer when the wearer is looking straight ahead with normal gaze.

The wearable apparatus of Aspect 2, wherein the apparatus is capable of providing binocular augmented reality.

The wearable apparatus of Aspect 2, wherein the apparatus is capable of providing binocular mixed reality.

The virtual image of Aspect 2, wherein the virtual image can be one of a hologram, image, text, number, and/or sentence.

The virtual image of Aspect 2, wherein the virtual image can scroll, move, rotate, and/or remain stationary.

The one or more optical combiner of Aspect 2, wherein a portion of the one or more optical combiner or a substrate attached to the optical combiner is either electrochromic or photochromic.

The virtual image of Aspect 2, wherein the virtual image can be combined with a real image when the wearer tilts his or her head away from looking straight ahead.

The wearable apparatus of Aspect 2, wherein the apparatus comprises one or more camera.

The wearable apparatus of Aspect 2, wherein the apparatus comprises one or more motion detector.

The wearable apparatus of Aspect 2, wherein the apparatus comprises one or more vibration component.

The wearable apparatus of Aspect 2, wherein the apparatus comprises one or more geolocation component.

The wearable apparatus of Aspect 2, wherein the apparatus comprises one or more clock and/or timer.

The wearable apparatus of Aspect 2, wherein the apparatus comprises one or more eye tracking component.

The wearable apparatus of Aspect 2, wherein the apparatus comprises an electrical tether that extends behind the neck or head of the wearer.

The wearable apparatus of Aspect 2, wherein the apparatus comprises an electrical power source located within an electrical module located behind the neck or head of the wearer.

The wearable apparatus of Aspect 2, wherein the apparatus communicates wirelessly to the internet or an electronic device.

The wearable apparatus of Aspect 2, wherein the apparatus is releasably attachable to one or both eyewear temples.

The wearable apparatus of Aspect 2, wherein the apparatus utilizes energy harvesting.

The apparatus of Aspect 2, wherein one or more of the displays is an optoelectronic display.

The apparatus of Aspect 2, wherein one or more of the displays is an LED, LCD, or OLED display.

The apparatus of Aspect 2, wherein the one or more displays provide for monocular or binocular viewing of the image.

Aspect 3 is an apparatus comprising:

a housing comprising one or more optical engine for producing an image, the optical engine comprising one or more substrate and one or more optical combiner;

a structure in a bottom surface of the housing for accepting a top surface of an eyewear frame, which provides for attachment and detachment of the housing to various eyewear frames;

a light engine, the light engine comprising a projector and a plurality of waveguides and grating to transmit light to the optical engine;

wherein the light engine is in operable communication with the optical engine to provide for transmission of the image to a user.

The present invention has been described with reference to particular embodiments having various features. Considering the disclosure provided above, it will be apparent to those skilled in the art that various modifications and variations can be made in the practice of the present invention without departing from the scope or spirit of the invention. By way of example only, while the embodiment of the optical window is taught herein as being part of a "releasably attachable" AR Unit, it can be a "permanent part" of an eyewear frame when the eyewear frame incorporates an AR Unit as a permanent part thereof. By way of example only, the eyewear frame can include the AR Unit built into the eyewear frame, or the eyewear frame can have customary eye rims for housing the spectacle lenses and a housing which is an integral part of the eyewear frame, and which sits in front of the spectacle lenses for housing the optical windows or optical combiners. Additionally, the embodiment of the see-through OLED as disclosed herein being used as an optical combiner can be utilized for any and/or all XR systems that are applicable such as by way of example only, augmented reality (AR) units or mixed reality (MR) units, whether releasably attachable to, or incorporated as a permanent feature of, an augmented reality unit or mixed reality unit. By way of clarity, the see-through OLED optical combiner embodiments as taught herein can be used in any and/or all XR systems, such as by way of example only AR and MR headsets, Goggles, AR & MR eyewear over and beyond that of a releasably attachable AR Unit.

One skilled in the art will recognize that the disclosed features may be used singularly, in any combination, or omitted based on the requirements and specifications of a given application or design. When an embodiment refers to "comprising" certain features, it is to be understood that the embodiments can alternatively "consist of" or "consist essentially of" any one or more of the features. Other embodiments of the invention will be apparent to those skilled in the art from consideration of the specification and practice of the invention.

All dimensions, including degrees, used within this application, including the figures, should not be limiting but are by way of example only.

It is noted in particular that where a range of values is provided in this specification, each value between the upper and lower limits of that range is also specifically disclosed. The upper and lower limits of these smaller ranges may independently be included or excluded in the range as well. The singular forms "a," "an," and "the" include plural referents unless the context clearly dictates otherwise. It is intended that the specification and examples be considered as exemplary in nature and that variations that do not depart from the essence of the invention fall within the scope of the invention. Further, all of the references cited in this disclosure are each individually incorporated by reference herein in their entireties and as such are intended to provide an efficient way of supplementing the enabling disclosure of this invention as well as provide background detailing the level of ordinary skill in the art.

The invention claimed is:

1. A wearable apparatus capable of providing a virtual image comprising a main body, one or more light elements, and one or more optical windows or optical combiners extending down from the main body for producing the virtual image perceived by a wearer, wherein the main body comprises a center and two halves, wherein all or a portion of the main body is capable of being reshaped from a first shape to a second shape by bending one or both of the two halves relative to an outer end and/or the center, wherein the one or more optical windows or optical combiners are capable of being moved clockwise, counterclockwise, along an X, Y, or Z axis, or combinations thereof, wherein the second shape is complementary to a top contour of an eyewear frame on which the wearable apparatus rests and/or is attached, and wherein the wearable apparatus is capable of bending to conform to a plurality of differently shaped eyewear frames.

2. The wearable apparatus of claim 1, wherein the wearable apparatus provides binocular augmented reality, binocular mixed reality, or both.

3. The wearable apparatus of claim 1, wherein the virtual image is one or more of a hologram, image, text, number, and/or sentence.

4. The wearable apparatus of claim 1, wherein all or a portion of the one or more optical windows is electrochromic, photochromic, thermochromic, or any combination thereof.

5. The wearable apparatus of claim 1, wherein a position of the one or more optical combiners or optical windows is adjustable relative to a pupil of an eye of the wearer.

6. The wearable apparatus of claim 1, wherein a bottom of the one or more optical combiners or optical windows is located at or above a top edge of a pupil of the wearer.

7. The wearable apparatus of claim 1, wherein the one or more optical combiners or optical windows comprise a see-through display comprising micro light emitting diodes (µLEDs), organic light emitting diode (OLEDs), transparent light emitting diodes (TOLEDs), or combinations thereof.

8. The wearable apparatus of claim 1, further comprising one or more of a compressible material, a bendable material, a formable material, or a combination thereof.

9. The wearable apparatus of claim 1, further comprising three or more of the following: an image capture device, a motion detector, a vibration component, a geo-location component, a timer, a light, a power source, a transmitter, a transceiver, a receiver, a computer processing unit (CPU), and/or an eye tracking component.

10. The wearable apparatus of claim 1, further comprising an electrical tether that extends behind a neck and/or head of the wearer that includes a power source.

11. The wearable apparatus of claim 1, wherein the wearable apparatus communicates wirelessly to Internet or another electronic device.

12. The wearable apparatus of claim 1, wherein the main body is releasably attachable to one or both eyewear temples of the eyewear frame.

13. The wearable apparatus of claim 1, wherein the wearable apparatus utilizes energy harvesting as a power source.

14. The wearable apparatus of claim 1, wherein the main body has a vertical height that is less on each outer horizontal edge than it is at its center.

15. The wearable apparatus of claim 1, wherein the wearable apparatus is capable of providing an extended reality, mixed reality, augmented reality, or virtual reality image.

16. A wearable apparatus capable of providing a virtual image, comprising a main body and one or more see-through transparent or semi-transparent near eye displays and one or more micro-lens arrays, wherein the one or more see-through transparent or semi-transparent near eye displays and the one or more micro-lens arrays are distance separated and in optical communication with one another, wherein the one or more see-through transparent or semi-transparent near eye displays and the one or more micro-lens arrays are attached to the main body, wherein the main body is capable of resting on top of, attaching to a top of, and/or attaching to a front of a plurality of differently shaped eyewear frames, wherein all or a portion of the main body is capable of being reshaped from a first shape to a second shape by bending one or both halves relative to an outer end and/or a center, wherein upon the main body being reshaped to the second shape the one or more see-through transparent or semi-transparent near eye displays are capable of being moved upwards and/or downwards relative to an eye or eyes of a wearer, wherein the second shape is complementary to a top contour of an eyewear frame, and wherein the main body is capable of bending to conform to a plurality of the differently shaped eyewear frames.

17. The wearable apparatus of claim 16, wherein the wearable apparatus provides binocular augmented reality, binocular mixed reality, or both.

18. The wearable apparatus of claim 16, wherein the virtual image is one or more of a hologram, image, text, number, and/or sentence.

19. The wearable apparatus of claim 16, wherein all or a portion of the one or more see-through transparent or semi-transparent near eye displays is electrochromic, photochromic, thermochromic, or any combination thereof.

20. The wearable apparatus of claim 16, wherein a position of the one or more see-through transparent or semi-transparent near eye displays is adjustable relative to a pupil of an eye of the wearer.

21. The wearable apparatus of claim 16, wherein a bottom of the one or more see-through transparent or semi-transparent near eye is located at or above a top edge of a pupil of the wearer.

22. The wearable apparatus of claim 16, wherein the one or more see-through transparent or semi-transparent near eye displays comprise a see-through display comprising micro light emitting diodes (µLEDs), organic light emitting diode (OLEDs), transparent light emitting diodes (TOLEDs), or combinations thereof.

23. The wearable apparatus of claim 16, further comprising one or more of a compressible material, a bendable material, a formable material, or a combination thereof.

24. The wearable apparatus of claim 16, further comprising three or more of the following: an image capture device, a motion detector, a vibration component, a geo-location component, a timer, a light, a power source, a transmitter, a transceiver, a receiver, a computer processing unit (CPU), and/or an eye tracking component.

25. The wearable apparatus of claim 16, further comprising an electrical tether that extends behind a neck and/or head of the wearer that includes a power source.

26. The wearable apparatus of claim 16, wherein the wearable apparatus communicates wirelessly to Internet or another electronic device.

27. The wearable apparatus of claim 16, wherein the main body is releasably attachable to one or both eyewear temples of the eyewear frame.

28. The wearable apparatus of claim 16, wherein the wearable apparatus utilizes energy harvesting as a power source.

29. The wearable apparatus of claim 16, wherein the main body has a vertical height that is less on each outer horizontal edge than it is at its center.

30. The wearable apparatus of claim 16, wherein the wearable apparatus is capable of providing an extended reality, mixed reality, augmented reality, or virtual reality image.

* * * * *